United States Patent
Tsubuku et al.

(10) Patent No.: US 9,647,132 B2
(45) Date of Patent: May 9, 2017

(54) SEMICONDUCTOR DEVICE AND MEMORY DEVICE

(71) Applicant: SEMICONDUCTOR ENERGY LABORATORY CO., LTD., Atsugi-shi, Kanagawa-ken (JP)

(72) Inventors: Masashi Tsubuku, Kanagawa (JP); Kazuaki Ohshima, Kanagawa (JP); Masashi Fujita, Tokyo (JP); Daigo Shimada, Kanagawa (JP); Tsutomu Murakawa, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 15/007,259

(22) Filed: Jan. 27, 2016

(65) Prior Publication Data

US 2016/0225772 A1    Aug. 4, 2016

(30) Foreign Application Priority Data

Jan. 30, 2015  (JP) .................. 2015-017746
Mar. 6, 2015   (JP) .................. 2015-044801
Mar. 18, 2015  (JP) .................. 2015-054916

(51) Int. Cl.
*H01L 29/10*    (2006.01)
*H01L 29/786*   (2006.01)
(Continued)

(52) U.S. Cl.
CPC ........ *H01L 29/7869* (2013.01); *G11C 11/401* (2013.01); *H01L 27/1225* (2013.01); *H01L 27/1255* (2013.01); *H01L 27/1156* (2013.01)

(58) Field of Classification Search
CPC ............. H01L 27/1052; H01L 27/1225; H01L 27/1255; H01L 29/7869; G01R 31/275
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Kitahara.K et al., "Dynamical theory of migration of an absorbed atom on solid surfaces", J. Chem. Phys. (Journal of Chemical Physics), Oct. 1, 1976, vol. 65, No. 7, pp. 2871-2882.
(Continued)

*Primary Examiner* — Tu-Tu Ho
(74) *Attorney, Agent, or Firm* — Nixon Peabody LLP; Jeffrey L. Costellia

(57) ABSTRACT

A semiconductor device that can measure a minute current. The semiconductor device includes a first transistor, a second transistor, a node, and a capacitor. The first transistor includes an oxide semiconductor in a channel formation region. The node is electrically connected to a gate of the second transistor and a first terminal of the capacitor. The node is brought into an electrically floating state by turning off the first transistor after a potential $V_0$ is supplied. Change in a potential $V_{FN}$ of the node over time is expressed by Formula (1). In Formula (1), t is elapsed time after the node is brought into the electrically floating state, $\tau$ is a constant with a unit of time, and $\beta$ is a constant greater than or equal to 0.4 and less than or equal to 0.6.

$$V_{FN}(t) = V_0 \times e^{-\left(\frac{t}{\tau}\right)^\beta} \quad (1)$$

16 Claims, 53 Drawing Sheets

(51) Int. Cl.
*H01L 27/12* (2006.01)
*G11C 11/401* (2006.01)
*H01L 27/1156* (2017.01)

(58) Field of Classification Search
USPC .......................................................... 257/43
See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,910,490 | B2 | 3/2011 | Akimoto et al. |
| 7,932,521 | B2 | 4/2011 | Akimoto et al. |
| 8,274,077 | B2 | 9/2012 | Akimoto et al. |
| 8,466,463 | B2 | 6/2013 | Akimoto et al. |
| 8,552,712 | B2 | 10/2013 | Kato et al. |
| 8,629,069 | B2 | 1/2014 | Akimoto et al. |
| 8,669,550 | B2 | 3/2014 | Akimoto et al. |
| 8,790,959 | B2 | 7/2014 | Akimoto et al. |
| 8,796,069 | B2 | 8/2014 | Akimoto et al. |
| 9,099,562 | B2 | 8/2015 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308805 | A1 | 12/2008 | Akimoto et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0104851 | A1 | 5/2011 | Akimoto et al. |
| 2011/0121290 | A1 | 5/2011 | Akimoto et al. |
| 2011/0148455 | A1* | 6/2011 | Kato .................. G01R 31/275 324/762.01 |
| 2016/0054362 | A1* | 2/2016 | Tsubuku .............. G01R 19/25 702/64 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 8/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 A | 5/2007 |
| JP | 2011-237418 A | 11/2011 |
| JP | 2012-256400 A | 12/2012 |
| JP | 2015-008030 A | 1/2015 |
| WO | WO-2004/114391 | 12/2004 |

OTHER PUBLICATIONS

Bordewijk.P, "Defect-Diffusion Models of Dielectric Relazation", Chem. Phys. Lett. (Chemical Physics Letters), May 1, 1975, vol. 32, No. 3, pp. 592-596, Elsevier.

(56) References Cited

OTHER PUBLICATIONS

Milovanov.A et al., "Stretched exponential relaxation and ac universality in disordered dielectrics", Phys. Rev. B (Physical Review. B), Sep. 4, 2007, vol. 76, pp. 104201-1-104201-8.
Lutz.E, "Fractional Langevin equation", Phys. Rev. E (Physical Review. E), Oct. 18, 2001, vol. 64, pp. 051106-1-051106-4.
Williams.G et al., "Non-Symmetrical Dielectric Relaxation behaviour Arising from a Simple Empirical Decay Function", Transactions of the Faraday Society, 1970, vol. 66, pp. 80-85.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and its Blue Phase", Phys. Rev. A (Physical Review. A), May 1, 1984, vol. 29, No. 5, pp. 2957-2959.
Kimizuka.N et al., "Spinel, YbFe2O4, and Yb3Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.0
Nakamura.M et al. "The phase relations in the In2O3—Ga2ZnO4—ZnO system at 1350° C.", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 43, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LDCs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25,2 004, vol. 432, pp. 488-492.
Dembo.H et al., "RFCPUs on Glass and Plastic Substrates Fabricated by TFR Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Empolying MoO3 as a Charge-Generation Layer", Adv. Master. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUs on Flexible and Glass Substrates for Secure RFID Systems", Journal of Solid-State Circuits, 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World'a Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-IN. AMOLED Display with Driver Circuit Using Amorphous In—Ga—Zn—Oxide TFTS", IDW '09 : Proceedings of the 16th International Display Workshops, 2009, pp. 689-692.
Asaoka.Y et al., "29.1:Polarizer-Free Refelective LCD Combined with Ultra Low-Power Driving Technogy", SID Digest '09 : SID International Symposium Digest of Technical Papers, May 31, 2009, pp. 395-398.
Nowatari.H et al., "60.2: Intermedicate Connector with Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada, T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.6 IN. QVGA AMOLED Display using In—Ga—Zn—Oxide TFTS with a Novel Passivation Layer", SID Digest '09 : SID International Symposium Digest of Technical Papers, May 31, 2009, pp. 284-287.
Godo.H et al., "P-9:Numerical Analyis on Temperature Dependence of Characteristics of Amorphous In—Ga—Zn—Oxide TFT", SID Digest '09 : SID International Symposium Digest of Technical Papers, May 31, 2009, pp. 1110-1112.

(56) References Cited

OTHER PUBLICATIONS

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of characteristics and Electronic Structure for Amorphous In—Ga—Zn—Oxide TFF", AM-FPD '09 Digest of Technical Papers, Jul. 1, 2009, pp. 41-44.

Ohara.H et al., "Amorphouds In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Eletron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide bang gap electrically conducting amorphous oxides and examples", J. Non-Cryst. Solids (Journal of Non-Crystalline Solids), 1996, vol. 198-200, pp. 165-169.

Orita.M et al., "Mechanism of Electrical conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m <4):a Zn4S conductor", Philolsophical Magazine, 2001, vol. 81, No. 5, pp. 501-515.

Janotti.A et al., "Oxygen Vacancies In ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numberical Simulation of High Performance Amorphouse In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors with Alminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Phyiscs Letters), Sep. 13, 2004, vol. 85, No. 11, pp. 1993-1995.

Tsubuku.M et al., "Analysis and Experimental Proof of Deterioration-free Memory Device Using CAAC-IGZO FET", SSDM 2015 (Extended Abstracts of the 2015 International Conference on Solid State Devices and Materials), 2015, pp. 1148-1149.

\* cited by examiner

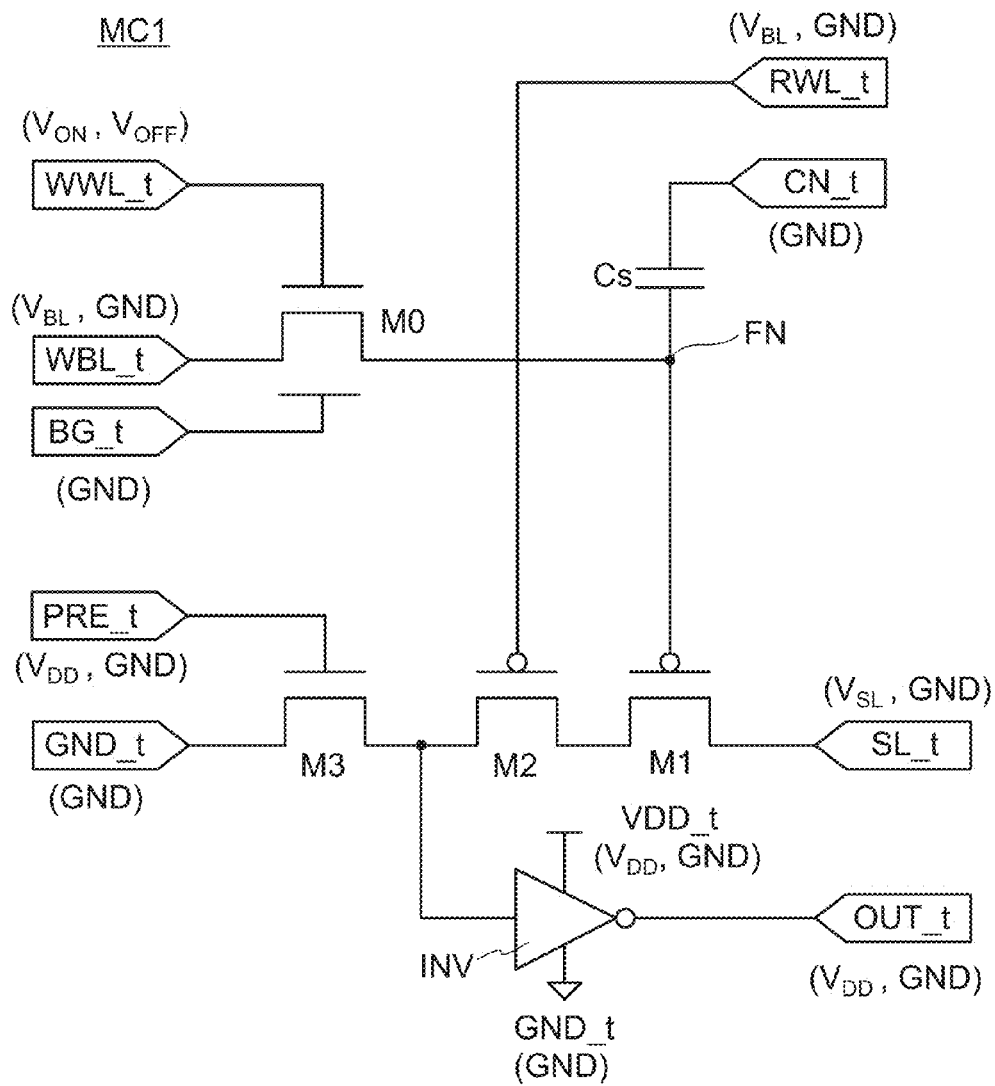

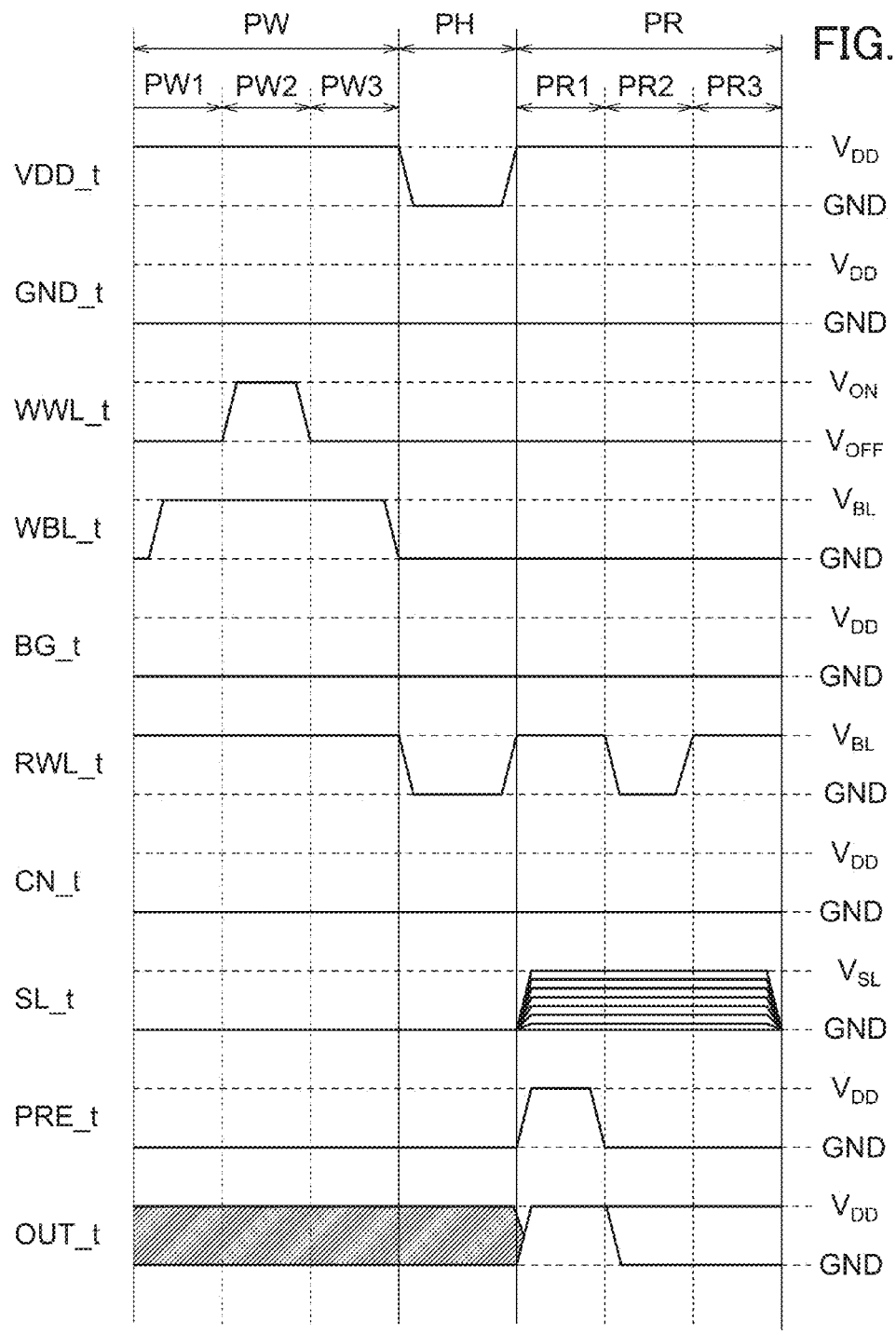

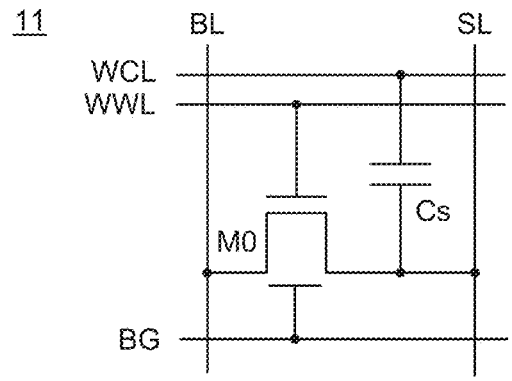
FIG. 41A
FIG. 41B
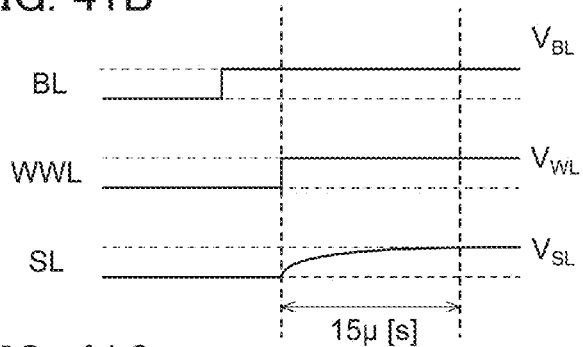
FIG. 41C
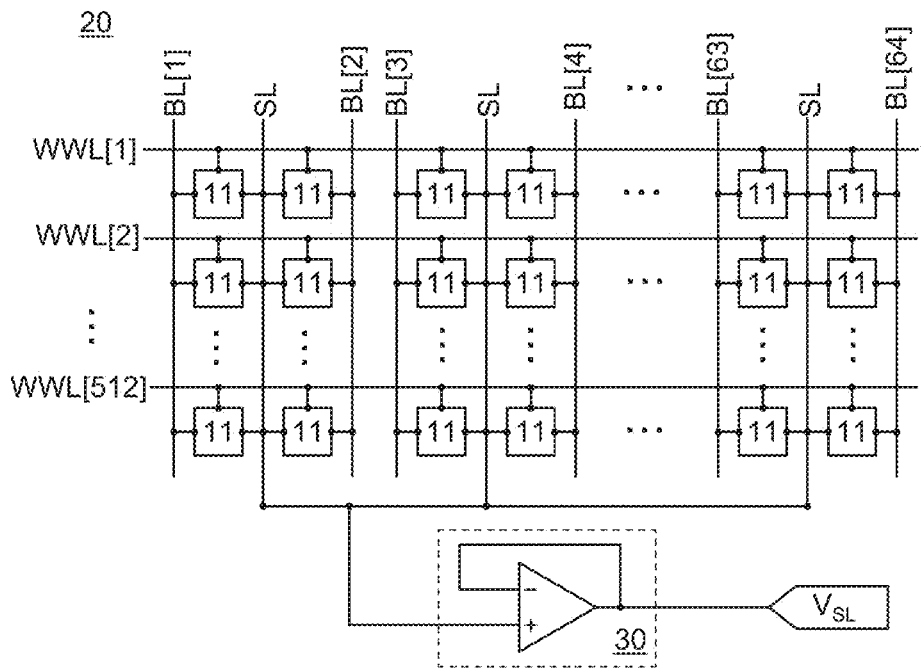

SEMICONDUCTOR DEVICE AND MEMORY DEVICE

BACKGROUND OF THE INVENTION

1. Field of the Invention

The present invention relates to a semiconductor device and a memory device.

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a memory device, an imaging device, a method for driving them, or a method for manufacturing them. In particular, one embodiment of the present invention relates to a semiconductor device, a display device, or a light-emitting device each including an oxide semiconductor.

In this specification and the like, a semiconductor device generally means a device that can function by utilizing semiconductor characteristics. In some cases, a display device, an electro-optical device, a semiconductor circuit, or an electronic device includes a semiconductor device.

2. Description of the Related Art

Attention has been focused on a technique for forming a transistor using a semiconductor thin film formed over a substrate having an insulating surface (also referred to as thin film transistor (TFT)). Such transistors are applied to a wide range of electronic devices such as an integrated circuit (IC) and an image display device (display device). A semiconductor material typified by silicon is widely known as a material for a semiconductor thin film that can be used for a transistor, and an oxide semiconductor has been attracting attention as well. For example, a technique for manufacturing a transistor using zinc oxide or an In—Ga—Zn oxide semiconductor is disclosed (see Patent Document 1).

The off-state current of a transistor using an oxide semiconductor is extremely low. Patent Documents 2 and 3 each disclose a nonvolatile memory device utilizing the above feature by including an oxide semiconductor transistor. Such a memory device does not have a limit on the number of times of data rewriting and consumes low power.

REFERENCE

Patent Document

[Patent Document 1] Japanese Published Patent Application No. 2007-123861
[Patent Document 2] Japanese Published Patent Application No. 2012-256400
[Patent Document 3] Japanese Published Patent Application No. 2015-008030

SUMMARY OF THE INVENTION

In the memory devices including oxide semiconductors disclosed in Patent Documents 2 and 3, to accurately estimate data retention time, it is necessary to accurately estimate an off-state current of the oxide semiconductor transistor; however, the off-state current of the oxide semiconductor transistor is lower than the detection limit of a measurement device in many cases and difficult to directly measure.

An object of one embodiment of the present invention is to provide a semiconductor device that can measure a minute current. Another object of one embodiment of the present invention is to provide a memory device that can retain data for a long time. Another object of one embodiment of the present invention is to provide a semiconductor device that can measure a minute current and retain data for a long time. Another object of one embodiment of the present invention is to provide a novel semiconductor device.

Note that the description of a plurality of objects does not mutually preclude the existence. One embodiment of the present invention does not necessarily achieve all the objects listed above. Objects other than those listed above are apparent from the description of the specification, drawings, and claims, and also such objects could be an object of one embodiment of the present invention.

One embodiment of the present invention is a semiconductor device that includes a first transistor, a second transistor, a node, and a capacitor. The first transistor includes an oxide semiconductor in a channel formation region. The node is electrically connected to a gate of the second transistor and a first terminal of the capacitor. The node is supplied with a potential $V_0$ through the first transistor. The node is brought into an electrically floating state by turning off the first transistor after the potential $V_0$ is supplied. Change in a potential V of the node over time is expressed by Formula (1). In Formula (1), t is elapsed time after the node is brought into the electrically floating state, $\tau$ is a constant with a unit of time, and $\beta$ is a constant greater than or equal to 0.4 and less than or equal to 0.6.

[Formula 1]

$$V_{FN}(t) = V_0 \times e^{-\left(\frac{t}{\tau}\right)^{\beta}} \qquad (1)$$

One embodiment of the present invention is a semiconductor device that includes a first transistor, a second transistor, a third transistor, a node, and a capacitor. The first transistor includes an oxide semiconductor in a channel formation region. The node is electrically connected to a gate of the second transistor and a first terminal of the capacitor. One of a source and a drain of the third transistor is electrically connected to one of a source and a drain of the second transistor. The node is supplied with a potential $V_0$ through the first transistor. The node is brought into an electrically floating state by turning off the first transistor after the potential $V_0$ is supplied. Change in a potential $V_{FN}$ of the node over time is expressed by Formula (1). In Formula (1), t is elapsed time after the node is brought into the electrically floating state, $\tau$ is a constant with a unit of time, and $\beta$ is a constant greater than or equal to 0.4 and less than or equal to 0.6.

In the above embodiments, $\tau$ preferably follows the Arrhenius equation.

In the above embodiments, an off-state current of the first transistor can be measured by measuring change in the potential $V_{FN}$ over time.

One embodiment of the present invention is a memory device that includes the semiconductor device in any of the above embodiments.

In the above memory device, data can be retained for 10 years or longer at 85° C.

In the above memory device, data can be retained for 100 years or longer at 85° C.

Another embodiment of the present invention is an electronic device that includes the above memory device and at least one of a microphone, a speaker, a display portion, and an operation key.

In this specification and the like, terms for describing arrangement, such as "over" and "under," are used for convenience to indicate a positional relation between components with reference to drawings. The positional relation between components is changed as appropriate in accordance with the direction in which each component is described. Therefore, terms for describing arrangement are not limited to the terms used in the description in the specification, and can be appropriately reworded depending on the situation.

In this specification and the like, components are classified on the basis of the functions, and shown as blocks independent of one another in block diagrams. However, in an actual circuit or the like, it may be difficult to separate components on the basis of the functions, so that one circuit may be associated with a plurality of functions and several circuits may be associated with one function. Therefore, the segmentation of a block in the block diagrams is not limited by any of the components described in the specification, and can be differently determined as appropriate depending on the situation.

In the drawings, the size, the layer thickness, or the region has arbitrary magnitude for convenience for the description. Therefore, the scale is not necessarily limited to that illustrated in the drawings. Note that the drawings are schematically illustrated for clarity, and shapes or values are not limited to those illustrated in the drawings. For example, the following can be included: variation in signal, voltage, or current due to noise or difference in timing.

In this specification and the like, in description of connections of a transistor, description of "one of a source and a drain" (or a first electrode or a first terminal), and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit the function of a component. For example, an "electrode" is used as part of a "wiring" in some cases, and vice versa. Further, the term "electrode" or "wiring" can also mean a combination of a plurality of "electrodes" or "wirings" formed in an integrated manner.

In this specification and the like, the terms "voltage" and "potential" are interchangeable in appropriate cases. The term "voltage" refers to a potential difference between a given potential and a reference potential. When the reference potential is a ground potential, the term "voltage" can be replaced with the term "potential." The ground potential does not necessarily mean 0 V. Note that a potential is relative, and a potential supplied to wirings or the like may be changed depending on a reference potential.

In this specification and the like, the terms "film," "layer," and the like can be interchanged with each other depending on the case or circumstances. For example, the term "conductive layer" can be changed into the term "conductive film" in some cases. The term "insulating film" can be changed into the term "insulating layer" in some cases.

In this specification and the like, a switch is an element that is brought into a conduction state or a non-conduction state (is turned on or off) to determine whether to have a current flow therethrough or not. Alternatively, the switch is an element having a function of selecting and changing a current path.

For example, an electrical switch, a mechanical switch, or the like can be used as a switch. That is, any element can be used as a switch as long as it can control a current, without limitation to a certain element.

A transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), or a logic circuit in which such elements are combined can be used as an electrical switch.

When a transistor is used as a switch, an "on state" of the transistor refers to a state in which a source and a drain of the transistor are electrically short-circuited. Furthermore, an "off state" of the transistor refers to a state in which the source and drain of the transistor are electrically disconnected. Note that if the transistor operates just as a switch, there is no particular limitation on the polarity (conductivity type) of the transistor.

An example of a mechanical switch is a switch formed using a MEMS (micro electro mechanical systems) technology, such as a digital micromirror device (DMD). Such a switch includes an electrode which can be moved mechanically, and operates by controlling conduction and non-conduction in accordance with movement of the electrode.

For example, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, that is, the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, and a load) can be connected between X and Y. A switch is controlled to be on or off. That is, a switch is conducting or not conducting (is turned on or off) to determine whether a current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit and a step-down circuit) or a level shifter circuit for changing the potential level of a signal; a voltage source; a current source; a switching circuit; an amplifier circuit such as a circuit that can increase signal amplitude, the amount of a current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

Note that for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to a part of Z1 and another part of Z1 is directly connected to X while a drain (or a second terminal or the like) of the transistor is directly connected to a part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." Other examples of the expressions also include "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path," and "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are only examples and one embodiment of the present invention is not limited to the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Unless otherwise specified, an off-state current in this specification refers to a drain current of a transistor in an off state. Unless otherwise specified, the off state of an n-channel transistor means that a difference between gate voltage and source voltage ($V_{gs}$) is lower than the threshold voltage ($V_{th}$), and the off state of a p-channel transistor means that $V_{gs}$ is higher than $V_{th}$. For example, the off-state current of an n-channel transistor sometimes refers to a drain current that flows when $V_{gs}$ is lower than $V_{th}$. The off-state current of a transistor depends on $V_{gs}$ in some cases. Thus, "the off-state current of a transistor is lower than or equal to $10^{-21}$ A" means "there is $V_{gs}$ with which the off-state current of a transistor becomes lower than or equal to $10^{-21}$ A" in some cases.

The off-state current of a transistor depends on voltage $V_{ds}$ between its drain and source in some cases. Unless otherwise specified, the off-state current in this specification might be an off-state current at $V_{ds}$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current might be $V_{ds}$ used in the semiconductor device or the like including the transistor.

Furthermore, in the present specification, any of the embodiments and the examples below can be combined as appropriate. In the case where some structural examples are given in one embodiment or example, any of the structure examples can be combined as appropriate.

One embodiment of the present invention can provide a semiconductor device that can measure a minute current. One embodiment of the present invention can provide a memory device that can retain data for a long time. One embodiment of the present invention can provide a semiconductor device that can measure a minute current and retain data for a long time. One embodiment of the present invention can provide a novel semiconductor device.

Note that the description of these effects does not disturb the existence of other effects. One embodiment of the present invention does not necessarily have all the effects listed above. Other effects will be apparent from and can be derived from the description of the specification, the drawings, the claims, and the like.

BRIEF DESCRIPTION OF THE DRAWINGS

FIG. 2 is a circuit diagram showing an example of a characteristics evaluation circuit.

FIG. 3 is a timing chart showing an operation example of a characteristics evaluation circuit.

FIG. 41A is a circuit diagram of a prototype TEG, FIG. 41B is a timing chart of operation of a prototype TEG, and FIG. 41C is a circuit diagram of a cell array including the TEGs.

DETAILED DESCRIPTION OF THE INVENTION

Figure 1A:
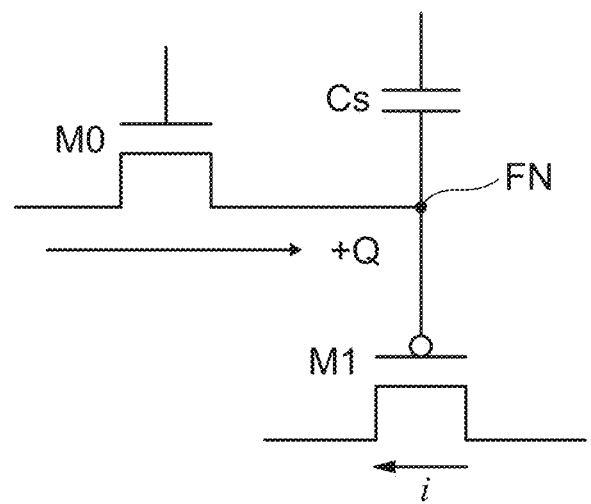
FIGS. 1A and 1B are circuit diagrams showing structure examples of memory devices.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that drawings are schematic views of ideal examples, and the embodiments of the present invention are not limited to the shape or the value illustrated in the drawings.

In this specification, a high power supply potential is referred to as an H level (or potential $V_{DD}$), and a low power supply potential is referred to as an L level (or potential GND), in some cases.

Embodiment 1

In this embodiment, examples of a semiconductor device of one embodiment of the present invention are described with reference to drawings. The configuration of a semiconductor device described below can be used as the configurations of a memory device and a characteristics evaluation circuit.

<<Circuit MC0>>

A circuit MC0 illustrated in FIG. 1A includes a transistor M0, a transistor M1, and a capacitor Cs.

A first terminal of the capacitor Cs, one of a source and a drain of the transistor M0, and a gate of the transistor M1 are electrically connected to one another. Note that a node of the first terminal of the capacitor Cs, one of the source and the drain of the transistor M0, and the gate of the transistor M1 is called a node FN.

It is preferable that the transistor M0 be a transistor with a low off-state current. As an example of a transistor with a low off-state current, a transistor including a wide band gap semiconductor, such as a transistor including an oxide semiconductor in a channel formation region (an oxide semiconductor transistor), can be given.

Electric charge Q (data) is written in the node FN through the transistor M0. By turning off the transistor M0 after writing of the electric charge Q in the node FN, the node FN is brought into an electrically floating state to retain the electric charge Q. When a potential difference is applied between a source and a drain of the transistor M1 in this state and a current flowing in the transistor M1 is measured, the electric charge Q written in the node FN can be read.

Because of having the above features, the circuit MC0 can be applied to a memory device.

The electric charge Q written in the node FN leaks out owing to a slight amount of an off-state current flowing in the transistor M0. As a result, the potential of the node FN gradually decreases.

To examine the characteristics of retaining the electric charge Q written in the node FN, it is necessary to measure an off-state current of the transistor M0; however, the off-state current of the transistor M0 is extremely low and difficult to directly measure. For example, when the transistor M0 is an oxide semiconductor transistor, an off-state current of the transistor M0 is lower than the detection limit of a measurement device in many cases.

Thus, a method as illustrated in FIG. 1A is effective, in which change in the potential of the node FN is measured using the value of a current flowing in the transistor M1 to estimate the off-state current of the transistor M0 from the change in the potential of the node FN. This method is described below.

First, the transistor M0 is turned on and the node FN is supplied with a potential $V_0$.

Then, the transistor M0 is turned off to make the node FN electrically floating, and a potential difference is applied between the source and the drain of the transistor M1. A current corresponding to the potential difference between the node FN and the source flows in the transistor M1. By reading the current, the potential of the node FN is measured. Hereinafter, the potential of the node FN is referred to as potential $V_{FN}$.

By regularly measuring the potential $V_{FN}$, time-series data of the potential $V_{FN}$ (a graph in which the vertical axis represents the potential $V_{FN}$ and the horizontal axis represents elapsed time after the node FN is brought into an electrically floating state) is made.

After the node FN is brought into an electrically floating state, owing to an off-state current flowing in the transistor M0, the potential $V_{FN}$ of the node FN decreases in accordance with a stretched exponential function represented by Formula (2).

[Formula 2]

$$V_{FN}(t) = V_0 \times e^{-\left(\frac{t}{\tau}\right)^\beta} \quad (2)$$

In Formula (2), t is elapsed time after the node FN is brought into an electrically floating state. $\tau$ is relaxation time and is a constant with a unit of time. $\beta$ is a constant greater than or equal to 0 and less than or equal to 1. In Formula (2), t is sometimes measurement time.

By fitting Formula (2) to the time-series data of the potential $V_{FN}$ obtained by measurement, $\tau$ and $\beta$ are determined.

The derivative of both sides of Formula (2) with respect to time gives Formula (3).

[Formula 3]

$$\frac{dV_{FN}}{dt} = -\frac{V_0 \times \beta}{\tau^\beta} \times t^{\beta-1} \times e^{-\left(\frac{t}{\tau}\right)^\beta} \quad (3)$$

An off-state current $I_{OFF}$ of the transistor M0, capacitance $C_S$ of the capacitor Cs, and the potential $V_{FN}$ of the node FN satisfy the following relational expression.

[Formula 4]

$$I_{OFF}(t) = C_S \times \frac{dV_{FN}}{dt} \quad (4)$$

Substitution of Formula (3) into Formula (4) gives the following formula.

[Formula 5]

$$I_{OFF}(t) = C_S \times \frac{V_0 \times \beta}{\tau^\beta} \times t^{\beta-1} \times e^{-\left(\frac{t}{\tau}\right)^\beta} \quad (5)$$

When τ and β determined by fitting Formula (2) are substituted into Formula (5), the off-state current of the transistor M0 can be estimated.

When the off-state current of the transistor M0 is low, β can be greater than or equal to 0.3 and less than or equal to 0.7, preferably greater than or equal to 0.4 and less than or equal to 0.6.

When the off-state current of the transistor M0 is low, τ is preferably greater than or equal to $1 \times 10^7$ seconds and less than or equal to $1 \times 10^{10}$ seconds, or greater than or equal to $1 \times 10^8$ seconds and less than or equal to $1 \times 10^9$ seconds at 85° C.

When the off-state current of the transistor M0 is low, τ follows the Arrhenius equation.

Note that details about the values of β and τ are described later in Example 1.

Figure 1B:
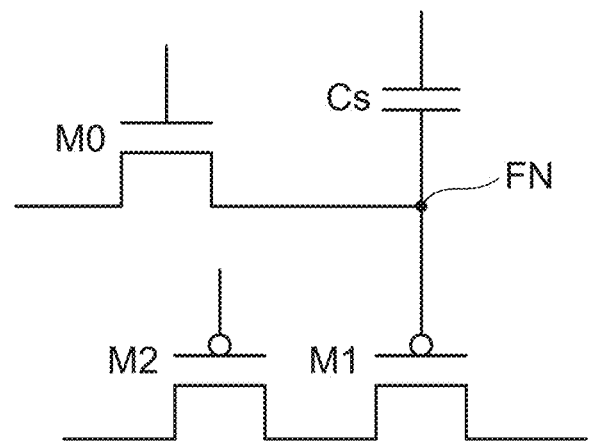

The circuit MC0 may include a transistor M2 as in a circuit MC0a illustrated in FIG. 1B. One of a source and a drain of the transistor M2 is electrically connected to one of the source and the drain of the transistor M1.

In the circuit MC0a, the transistor M2 makes it possible to control the timing of reading the electric charge in the node FN (the timing of supplying a current to the transistor M1).

By employing the above-described method, each of the circuit MC0 and the circuit MC0a can be used not only as a memory device but also as a characteristics evaluation circuit. In the case where the circuits are used as characteristics evaluation circuits, the transistor M0 is a transistor under test (a device under test, DUT).

Note that more specific structure examples in which the circuit MC0 and the circuit MC0a are used for characteristics evaluation circuits are described later in Embodiment 2.

More specific structure examples in which the circuit MC0 and the circuit MC0a are used for memory devices are described later in Embodiment 3.

Embodiment 2

In this embodiment, more specific structure examples in which the circuit MC0 and the circuit MC0a described in Embodiment 1 are used as characteristics evaluation circuits are described.

<<Structure Example of Circuit MC1>>

A circuit MC1 in FIG. 2 includes the transistor M0, the transistor M1, the transistor M2, a transistor M3, the capacitor Cs, and an inverter INV. Note that the node of the first terminal of the capacitor Cs, one of the source and the drain of the transistor M0, and the gate of the transistor M1 is called the node FN.

The circuit MC1 is a characteristics evaluation circuit for measuring the off-state current of the transistor M0, which is a transistor under test. The circuit MC1 is the circuit MC0a in FIG. 1B to which the transistor M3 and the inverter INV are added.

The transistor M0 may have first and second gates. The first gate of the transistor M0 is electrically connected to a terminal WWL_t, one of the source and the drain of the transistor M0 is electrically connected to the gate of the transistor M1 and the first terminal of the capacitor Cs, the other of the source and the drain of the transistor M0 is electrically connected to a terminal WBL_t, and the second gate of the transistor M0 is electrically connected to a terminal BG_t. Note that the second gate of the transistor M0 and the terminal BG_t are provided as needed and not always necessary.

One of the source and the drain of the transistor M1 is electrically connected to a terminal SL_t, and the other of the source and the drain of the transistor M1 is electrically connected to one of the source and the drain of the transistor M2.

A gate of the transistor M2 is electrically connected to the terminal RWL_t, and the other of the source and the drain of the transistor M2 is electrically connected to one of a source and a drain of the transistor M3.

A gate of the transistor M3 is electrically connected to a terminal PRE_t, and the other of the source and the drain of the transistor M3 is electrically connected to a terminal GND_t.

A second terminal of the capacitor Cs is electrically connected to the terminal CN_t.

An input terminal of the inverter INV is electrically connected to the other of the source and the drain of the transistor M2, and an output terminal of the inverter INV is electrically connected to a terminal OUT_t.

Note that in FIG. 2, potentials supplied to the terminals are indicated near the corresponding terminals.

In the circuit MC1, data can be written in the node FN through the transistor M0, and the written data can be retained by turning off the transistor M0.

The transistors M1 and M2 have a function of controlling conduction between the terminal SL_t and the input terminal of the inverter INV. Specifically, the transistor M1 has a function of controlling the conduction between the terminal SL_t and the input terminal of the inverter INV in accordance with the potential supplied to the node FN.

The transistor M3 has a function of supplying an L level potential to the input terminal of the inverter INV (supplying an H level potential to the terminal OUT_t).

The inverter INV has a function of an output buffer.

Hereinafter, a method for measuring the off-state current of the transistor M0 in the circuit MC1 will be described. Although the transistors M0 and M3 are n-channel transistors and the transistors M1 and M2 are p-channel transistors in the following description, the description is also applicable to the case where the transistors M1 and M2 are n-channel transistors.

To measure the off-state current of the transistor M0 of the circuit MC1 illustrated in FIG. 2, a current that flows in the terminal WBL_t is measured; however, it is difficult to directly measure a minute current that flows in the terminal WBL_t when the off-state current of the transistor M0 is extremely low.

In the case where a wide band gap semiconductor such as an oxide semiconductor is used for the transistor M0, for example, the off-state current of the transistor M0 is extremely low.

Thus, in the case where the off-state current of the transistor M0 is extremely low, it is preferable to estimate the off-state current of the transistor M0 from change in the potential of the node FN as described in Embodiment 1.

<<Operation Example of Circuit MC1>>

FIG. 3 is a timing chart of operation of the circuit MC1. The timing chart in FIG. 3 shows the potentials of, from the top, a terminal VDD_t, the terminal GND_t, the terminal WWL_t, the terminal WBL_t, the terminal BG_t, the terminal RWL_t, the terminal CN_t, the terminal SL_t, the terminal PRE_t, and the terminal OUT_t.

The timing chart in FIG. 3 is divided into a period PW, a period PH, and a period PR. The period PW is a period in which electric charge is supplied to the node FN, the period PH is a period in which the electric charge supplied to the node FN is retained, and the period PR is a period in which the electric charge supplied to the node FN is read.

The period PW is divided into a period PW1, a period PW2, and a period PW3, and the period PR is divided into a period PR1, a period PR2, and a period PR3.

Note that in all the periods, the terminal GND_t, the terminal BG_t, and the terminal CN_t are supplied with a potential GND. Note that the terminal BG_t may be supplied with a negative potential instead of the potential GND.

In the initial state, the terminal VDD_t is supplied with the potential $V_{DD}$, the terminal RWL_t is supplied with a potential $V_{BL}$, and the terminal WWL_t, the terminal WBL_t, the terminal SL_t, and the terminal PRE_t are supplied with the potential GND.

Description will be made from the period PW1 in order.

First, the terminal WBL_t is supplied with the potential $V_{BL}$ in the period PW1.

Then, the terminal WWL_t is supplied with a potential $V_{ON}$ in the period PW2. The potential $V_{ON}$ is preferably higher than the sum of the potential $V_{BL}$ and the threshold voltage of the transistor M0. At this time, the transistor M0 is turned on and the potential $V_{BL}$ is written in the node FN.

Next, in the period PW3, the terminal WWL_t is supplied with a potential $V_{OFF}$, whereby the transistor M0 is turned off.

After that, in the period PH, the terminal VDD_t, the terminal WBL_t, and the terminal RWL_t are supplied with the potential GND. At this time, the circuit MC1 is substantially shut off from the power source.

Then, in the period PR1, the terminal VDD_t is supplied with the potential $V_{DD}$, the terminal RWL_t is supplied with the potential $V_{BL}$, the terminal SL_t is supplied with a potential $V_{SL}$, and the terminal PRE_t is supplied with the potential $V_{DD}$. The potential $V_{DD}$ is preferably higher than the threshold voltage of the transistor M3. At this time, the transistor M3 is turned on, the input terminal of the inverter INV is supplied with the L level (potential GND), and the terminal OUT outputs the H level (potential $V_{DD}$).

After that, in the period PR2, the terminal PRE_t is supplied with the potential GND and the terminal RWL_t is supplied with the potential GND. At this time, the transistor M3 is turned off and the transistor M2 is turned on. Furthermore, a gate—source potential difference ($V_{GS}$) of the transistor M1 is a potential difference between the node FN and the terminal SL_t, that is, a potential difference between the potential $V_{BL}$ and the potential $V_{SL}$ ($V_{GS}=V_{BL}-V_{SL}$).

When the potential $V_{SL}$ is sufficiently higher than the potential $V_{BL}$, $V_{GS}$ of the transistor M1 is lower than the threshold voltage of the transistor M1, so that the transistor M1 is turned on and the terminal OUT_t outputs the L level.

In contrast, when the potential $V_{SL}$ is sufficiently lower than the potential $V_{BL}$, $V_{GS}$ of the transistor M1 is higher than the threshold voltage of the transistor M1, so that the transistor M1 is turned off and the terminal OUT_t outputs the H level. In other words, the level of the potential of the terminal OUT_t depends on the potential $V_{SL}$.

Next, in the period PR3, the terminal RWL_t is supplied with the potential $V_{BL}$, whereby the transistor M2 is turned off. In addition, the terminal SL_t is supplied with the potential GND.

For example, when the threshold voltage of the transistor M1 and the potential $V_{BL}$ are −0.5 V and 1.8 V, respectively, and the value of the potential $V_{SL}$ is reduced from 2.6 V to 0 V in a step-by-step manner, the output of the terminal OUT_t is switched from the L level to the H level when $V_{SL}$=2.3 V. By measurement of the point at which the output of the terminal OUT_t is switched, the potential of the node FN can be calculated.

That is, by repeating the cycle from the period PR1 to the period PR3 for various values of the potential $V_{SL}$, the potential of the node FN can be measured.

By repeating the cycle of the period PH and the period PR subsequently, change in the potential of the node FN over time can be measured.

The time-series data of the potential of the node FN obtained by the above method is fitted to Formula (2) in Embodiment 1, and β and τ that are thereby obtained are substituted into Formula (5), whereby the off-state current of the transistor M0 can be estimated.

The off-state current of the transistor M0 several months to several years ahead can be estimated using the above-described measurement method. Thus, long-term charge retention characteristics can be estimated.

Figure 4:
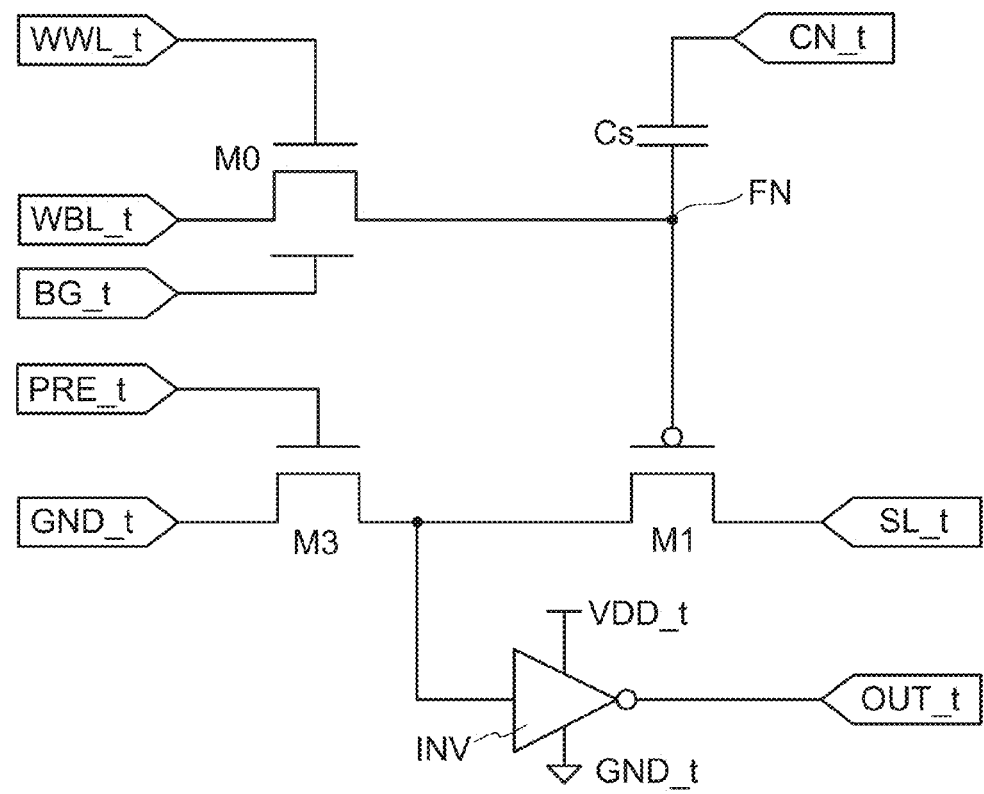
FIG. 4 is a circuit diagram showing an example of a characteristics evaluation circuit.

The circuit MC1 illustrated in FIG. 2 may have a structure in which the transistor M2 and the terminal RWL_t are not provided as in a circuit MC2 illustrated in FIG. 4.

<<Measurement Environment>>

Figure 5:
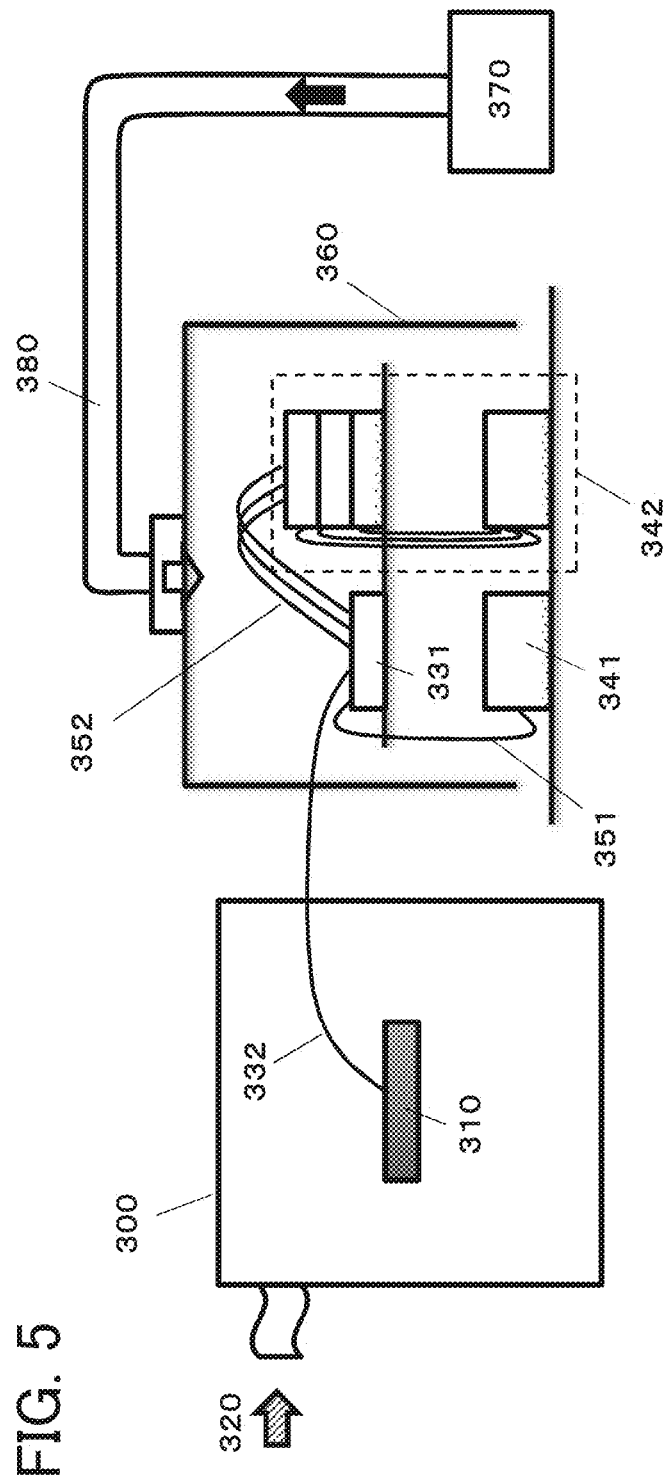
FIG. 5 illustrates an example of a measurement environment.

A measurement sample including a characteristics evaluation circuit may be put in an inert oven in which temperature is kept constant, as illustrated in FIG. 5. In addition, a constant-temperature air generator may be used to make the temperature of an atmosphere around measurement equipment constant. The measurement environment is controlled as described above, whereby an adverse effect of noise caused by a temperature change can be reduced.

Specifically, a sample 310 is put in an inert oven 300 and the temperature of the sample 310 is kept constant. The humidity in the inert oven 300 can be reduced by supplying dry air 320 to the inert oven 300 at that time, which provides a low-humidity measurement environment. The sample 310 is connected to a transit portion 331 with a flat cable 332. The transit portion is connected to measurement equipment 341 and measurement equipment 342 with a coaxial cable 351 and a coaxial cable 352, respectively. The measurement equipment 342 sends a signal for transmitting data of the sample 310 to the transit portion 331. The data of the sample 310 is supplied from the transit portion 331 to the measurement equipment 341. Note that a measurement system (including the sample and the measurement equipment) is preferably kept at a constant temperature. In order to keep the measurement system at a constant temperature, for example, the measurement system is covered by a heat insulator 360, a plastic corrugated cardboard, or the like, and constant-temperature air is supplied using a constant-temperature air generator 370 and a duct cable 380. It is preferable that the measurement system not be entirely covered by the heat insulator 360, the plastic corrugated cardboard, or the like so that a small amount of constant-temperature air can flow off to the outside.

Embodiment 3

In this embodiment, more specific structure examples of using the circuit MC0 and the circuit MC0a in Embodiment 1 as memory devices are described.

<<Structure Example of Memory Cell>>

Figure 6:
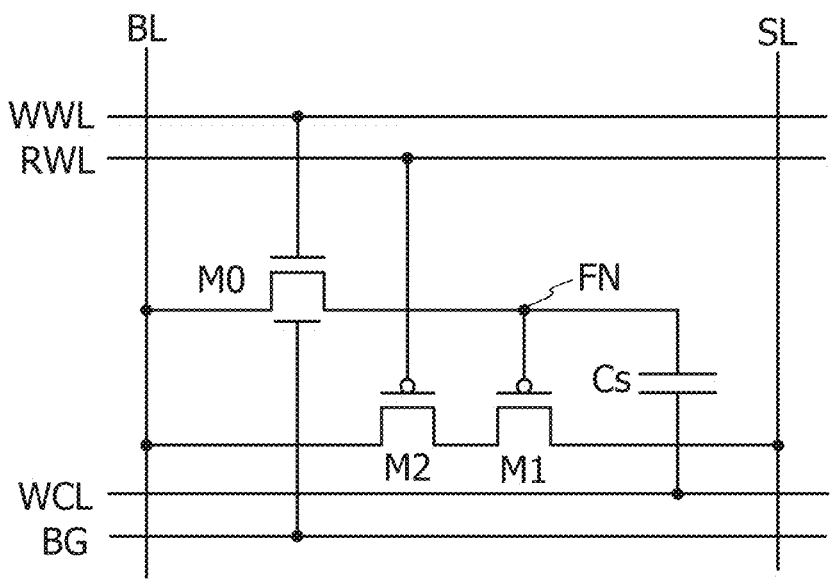
FIG. 6 is a circuit diagram showing an example of a memory cell.

FIG. 6 is a circuit diagram of a memory cell that includes the semiconductor device of one embodiment of the present invention. A memory cell 10a in FIG. 6 includes the transistor M0, the transistor M1, the transistor M2, and the capacitor Cs.

The memory cell 10a is electrically connected to a wiring BL, a wiring SL, a wiring WWL, a wiring RWL, a wiring WCL, and a wiring BG.

The memory cell 10a includes the circuit MC0 or the circuit MC0a described in Embodiment 1.

A node where one of the source and the drain of the transistor M0, the gate of the transistor M1, and the first terminal of the capacitor Cs are electrically connected to one another is referred to as the node FN. One of the source and the drain of the transistor M1 is electrically connected to the wiring SL, and the other of the source and the drain of the transistor M1 is electrically connected to the wiring BL through the transistor M2. The gate of the transistor M2 is electrically connected to the wiring RWL.

The other of the source and the drain of the transistor M0 is electrically connected to the wiring BL. The first gate of the transistor M0 is electrically connected to the wiring WWL, and the second gate of the transistor M0 is electrically connected to the wiring BG.

The second terminal of the capacitor Cs is electrically connected to the wiring WCL.

The transistor M0 has a function of a switch for controlling writing of data in the node FN by being switched between a conducting state and a non-conducting state.

As the transistor M0, it is preferable to use a transistor having a low current (low off-state current) that flows between a source and a drain in a non-conducting state. Here, the term "low off-state current" means that a normalized off-state current per micrometer of channel width with a voltage between a source and a drain set at 1.8 V is $1 \times 10^{-20}$ A or lower at room temperature, $1 \times 10^{-18}$ A or lower at 85° C., or $1 \times 10^{-16}$ A or lower at 125° C. An example of a transistor with such a low off-state current is a transistor using a wide band gap semiconductor like an oxide semiconductor transistor.

The node FN can retain 1-bit (binary) data when the transistor M0 is turned off. The node FN can retain not only 1-bit data but also K-bit ($2^K$-valued, K is a natural number of two or more) data.

The case where 1-bit data is retained in the node FN is described below.

Writing and reading by the memory cell 10a are described below with reference to FIG. 7. Note that the transistor M0 is an n-channel transistor and the transistors M1 and M2 are p-channel transistors in the following description.

<<Operation Example of Memory Cell>>

Figure 7:
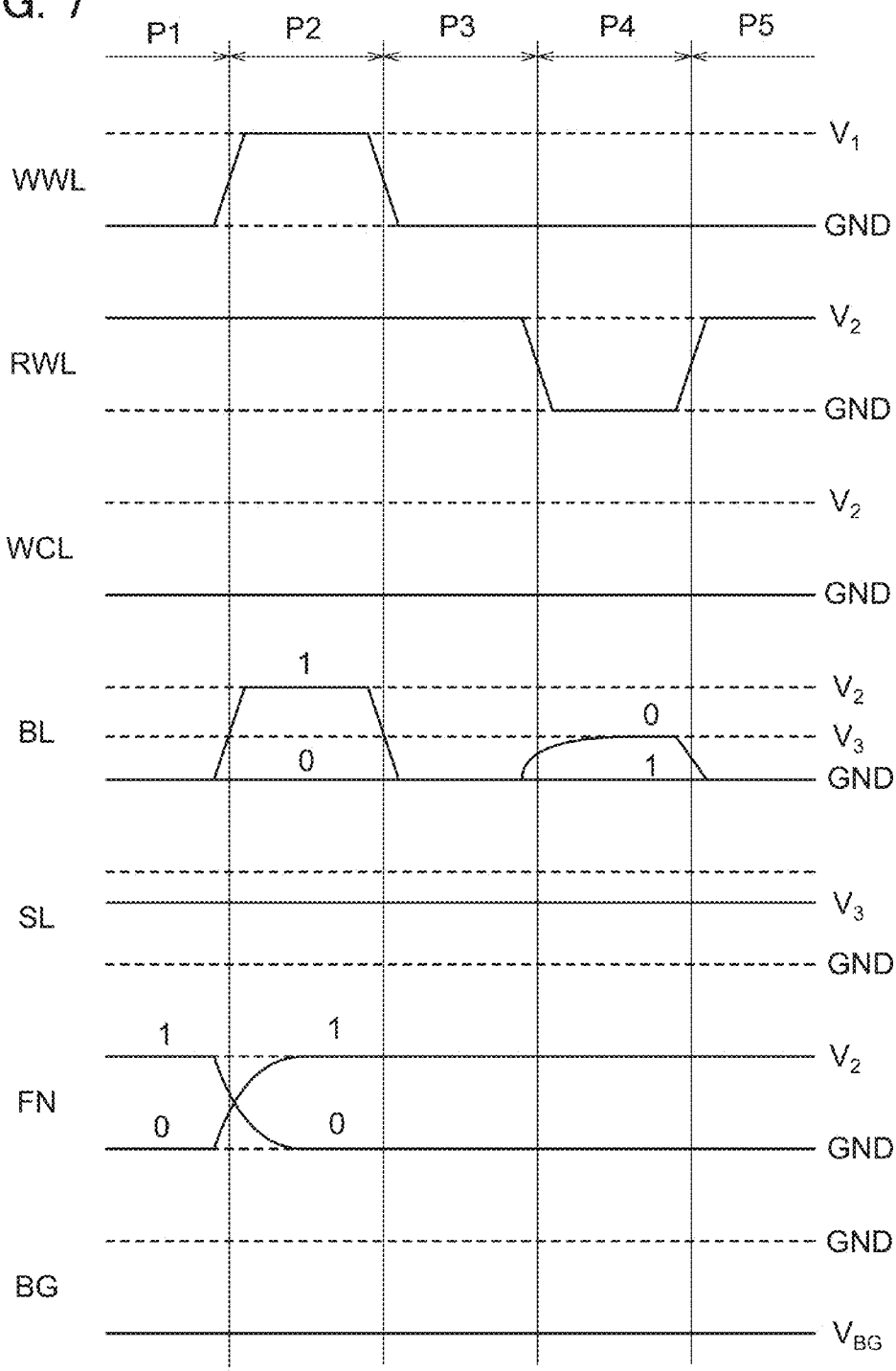
FIG. 7 is a timing chart illustrating an operation example of a memory cell.

FIG. 7 is a timing chart illustrating an operation example of the memory cell 10a. The timing chart shows the potentials applied to, from the top, the wiring WWL, the wiring RWL, the wiring WCL, the wiring BL, the wiring SL, the node FN, and the wiring BG. The timing chart in FIG. 7 can be divided into the periods P1 to P5.

The periods P1, P3, and P5 are standby periods of the memory cell 10a. The period P2 is a write period of the memory cell 10a. The period P4 is a read period of the memory cell 10a.

Note that in the periods P1 to P5, the wiring WCL is constantly supplied with the potential GND. The potential GND is preferably a low power supply potential or a ground potential.

Furthermore, in the periods P1 to P5, the wiring SL is constantly supplied with a potential $V_3$ and the wiring BG is constantly supplied with a potential $V_{BG}$. The potential $V_{BG}$ is preferably a negative potential. When the potential $V_{BG}$ that is a negative potential is supplied, the transistor M0 can be normally off. Here, the term "normally off" means that a current per micrometer of channel width flowing in the transistor M0 when the wiring WWL is supplied with the potential GND is $1 \times 10^{-20}$ A or lower at room temperature, $1 \times 10^{-18}$ A or lower at 85° C., or $1 \times 10^{-16}$ A or lower at 125° C.

Operations in the respective periods are described in order below.

<Period P1>

First, in the period P1, the wirings WWL BL are supplied with the potential GND and the wiring RWL is supplied with a potential $V_2$. At this time, the transistor M2 is off and no current flows between the wiring BL and the wiring SL. In order that the transistor M2 can be off, a difference between the potential $V_2$ and the potential $V_3$ ($V_2-V_3$) is preferably larger than the threshold voltage of the transistor M2.

<Period P2>

Then, in the period P2, the wiring WWL is supplied with a potential $V_1$ and the wiring BL is supplied with the potential $V_2$ (data "1") or the potential GND (data "0"). The potential $V_1$ is preferably higher than the sum of the potential $V_2$ and the threshold voltage of the transistor M0. At this time, the transistor M0 is turned on and the data supplied to the wiring BL is written in the node FN.

<Period P3>

Next, in the period P3, the wiring WWL and the wiring BL are supplied with the potential GND. At this time, the transistor M0 is turned off and the data written in the node FN is retained.

<Period P4>

Next, in the period P4, the wiring BL is brought into an electrically floating state and the wiring RWL is supplied with the potential GND. At this time, the transistor M2 is turned on.

If the data "1" is written in the node FN, the transistor M1 is off, so that no current flows between the wiring SL and the wiring BL and the wiring BL remains at the potential GND. In order that the transistor M1 can be off, a difference between the potential $V_2$ and the potential $V_3$ ($V_2-V_3$) is preferably larger than the threshold voltage of the transistor M1.

If the data "0" is written in the node FN, the transistor M1 is on, so that the wiring SL and the wiring BL are electrically connected and the wiring BL is charged until it has the potential $V_3$ (until the potential of the wiring BL becomes equal to that of the wiring SL). In order that the transistor M1 can be on, a difference between the potential GND and the potential $V_3$ ($-V_3$) is preferably smaller than the threshold voltage of the transistor M1. In order that the transistor M2 can be on, a difference between the potential GND and the potential $V_3$ ($-V_3$) is preferably smaller than the threshold voltage of the transistor M2.

In the period P4, the potential of the wiring BL is read to determine the data written in the node FN.

<Period P5>

Then, in the period P5, the wiring RWL is supplied with the potential $V_2$ and the wiring BL is supplied with the potential GND, so that the data in the node FN is retained.

As described above, through the operations in the periods P1 to P5, data reading from and data writing to the memory cell 10a can be performed.

<<Structure Example of Memory Device>>

Figure 8:
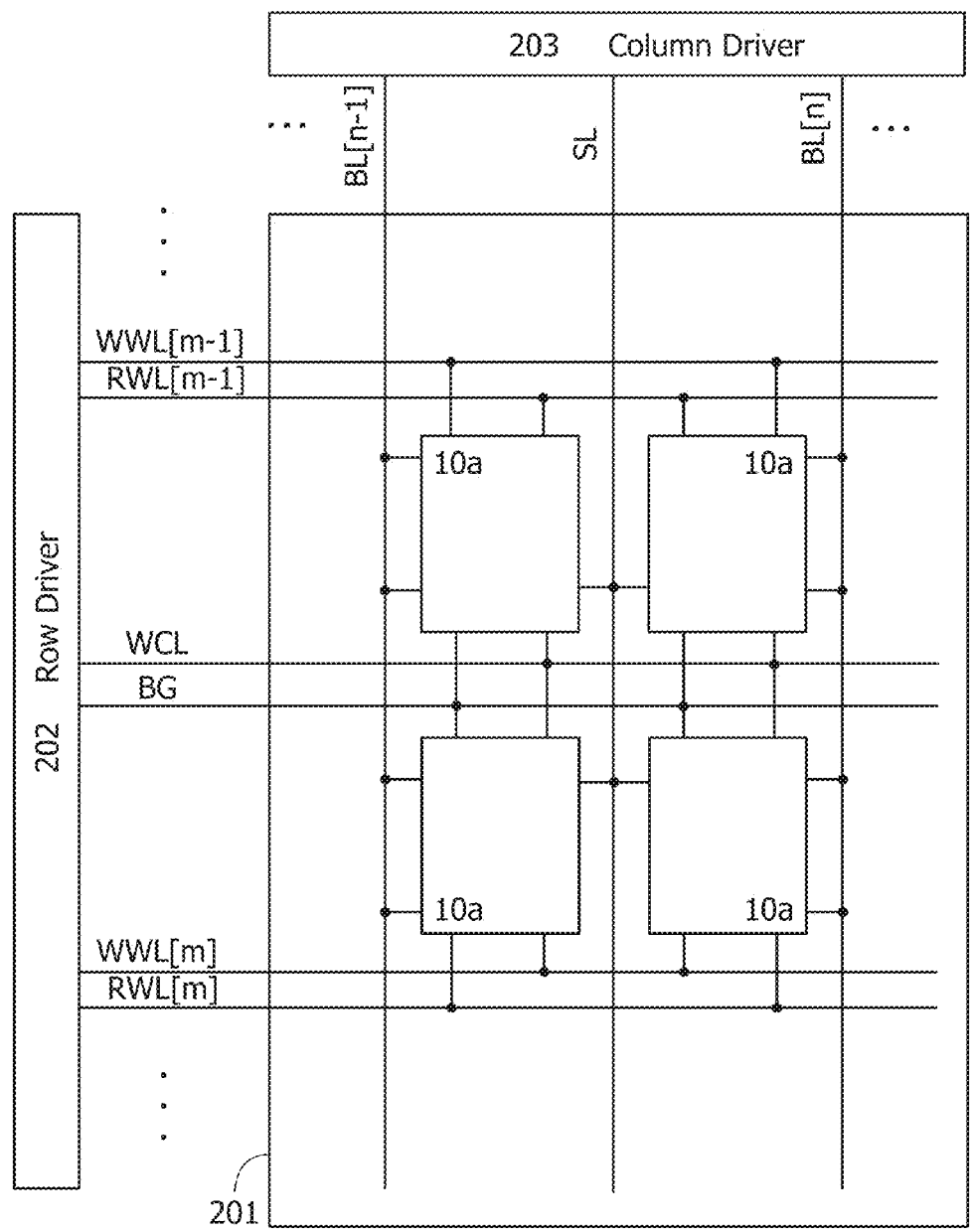
FIG. 8 is a block diagram showing an example of a memory device.

FIG. 8 is a block diagram illustrating a structure example of a memory device including the memory cell 10a.

A memory device 200 in FIG. 8 includes a memory cell array 201 that is provided with the memory cells 10a, a row driver 202, and a column driver 203. The memory cells 10a in the memory device 200 are arranged in a matrix of m rows (m is a natural number of two or more) and n columns (n is a natural number of two or more).

FIG. 8 shows a wiring WWL[m−1] and a wiring RWL [m−1] that are connected to the memory cells 10a in the (m−1)-th row, a wiring WWL[m] and a wiring RWL[m] that are connected to the memory cells 10a in the m-th row, the wiring WCL that is connected to the memory cells 10a in the (m−1)-th and m-th rows, and the wiring BG that is connected to the memory cells 10a in the (m−1)-th and m-th rows.

In addition, FIG. 8 shows a wiring BL[n−1] that is connected to the memory cells 10a in the (n−1)-th column, a wiring BL[n] that is connected to the memory cells 10a in the n-th column, and the wiring SL that is connected to the memory cells 10a in the (n−1)-th and n-th columns.

In the memory cell array 201 shown in FIG. 8, the wirings SL, WCL, and BG are shared by adjacent memory cells. This structure reduces the area occupied by the wirings. Thus, a memory device with this structure can have high memory capacity per unit area.

The row driver 202 is a circuit having a function of selectively turning on the transistors M0 and M2 in the memory cells 10a of each row. With the row driver 202, the memory cells 10a can be selected row by row, and data can be written and read to/from the selected memory cells 10a in the memory device 200.

The column driver 203 is a circuit having a function of selectively writing data in the node FN in the memory cells 10a of each column, a function of initializing the potential of the wiring BL, and a function of making the wiring BL electrically floating. Specifically, the column driver 203 is a circuit that supplies a potential corresponding to data to the wiring BL. With the column driver 203, the memory cells 10a can be selected column by column, and data can be written and read to/from the selected memory cells 10a in the memory device 200.

<<Different Structure Example of Memory Cell>>

Figure 9A:
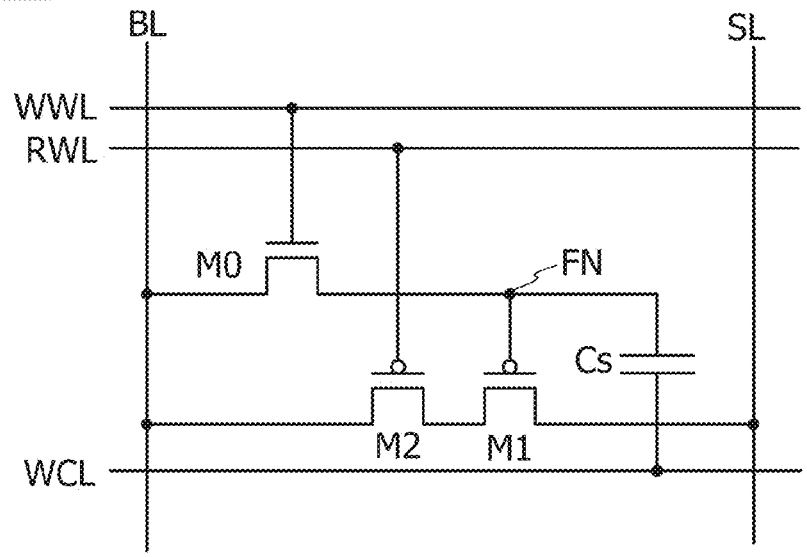
FIGS. 9A and 9B are circuit diagrams each showing an example of a memory cell.

Note that in the memory cell 10a in FIG. 6, the second gate of the transistor M0 and the wiring BG are not necessarily provided (see a memory cell 10b in FIG. 9A).

Figure 9B:
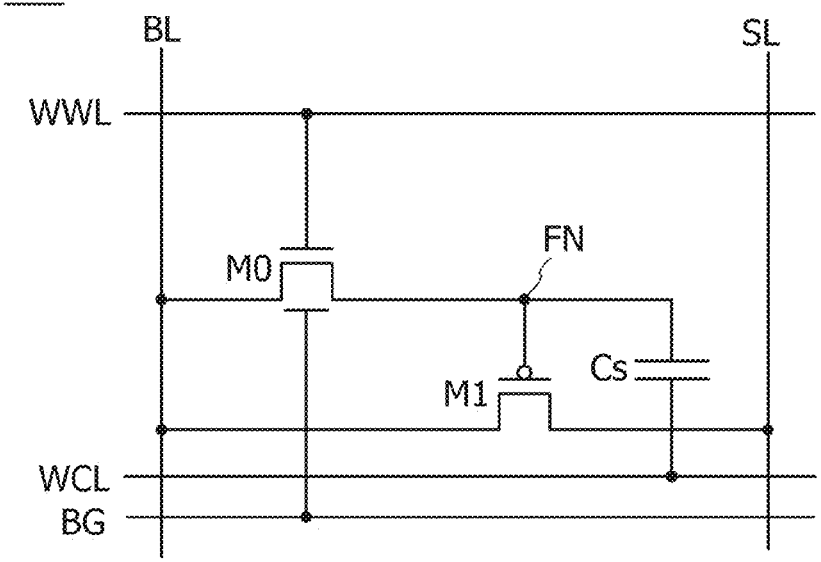

In the memory cell 10a in FIG. 6, the transistor M2 and the wiring RWL are not necessarily provided (see a memory cell 10c in FIG. 9B).

Figure 10A:
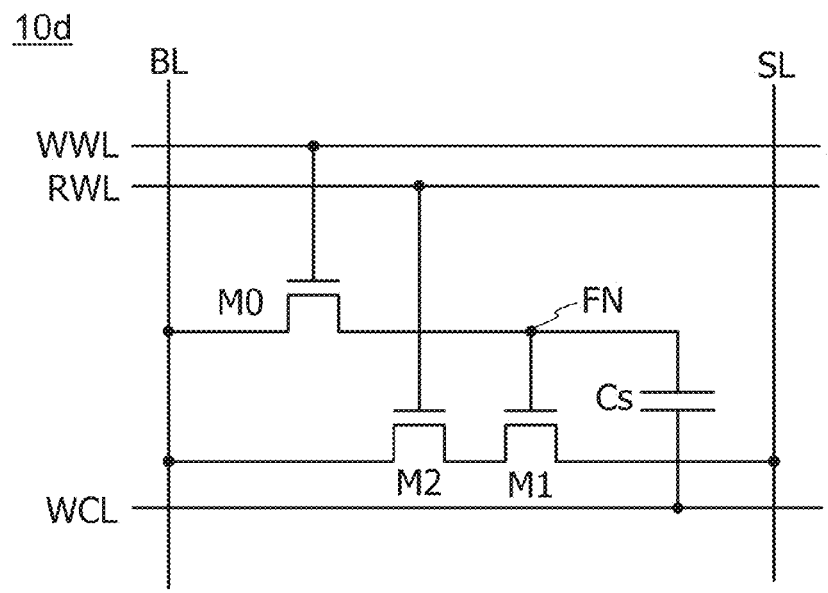
FIGS. 10A and 10B are circuit diagrams each showing an example of a memory cell.

In the memory cell 10a in FIG. 6, the transistors M1 and M2 may be n-channel transistors (see a memory cell 10d in FIG. 10A).

Figure 10B:
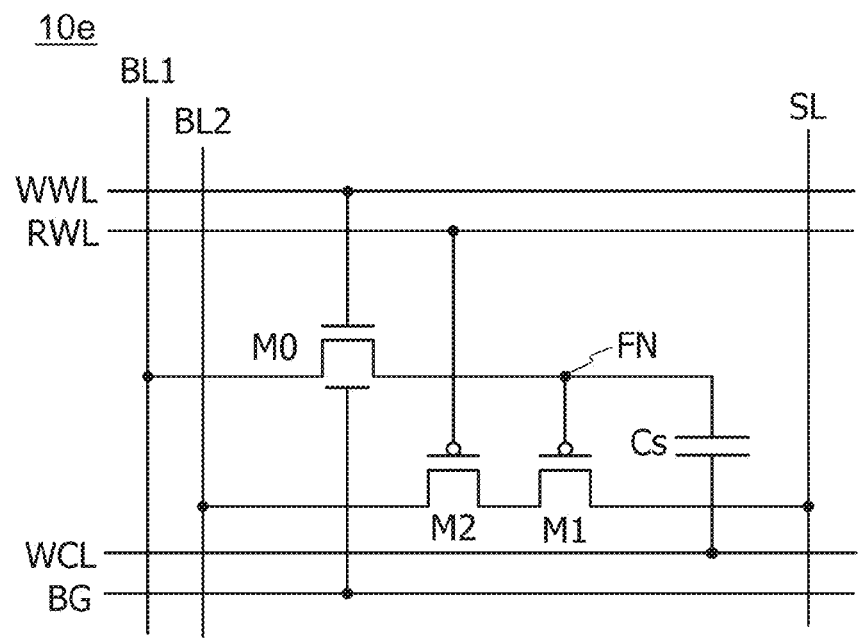

In the memory cell 10a in FIG. 6, the wiring BL may be divided into a wiring BL1 and a wiring BL2 (see a memory cell 10e in FIG. 10B).

As described above, the memory device in this embodiment writes and reads data by turning on and off transistors; thus, the number of times of writing is not limited and high reliability is achieved. In addition, data writing and data reading need only low voltage, leading to low power consumption.

Embodiment 4

In this embodiment, structure examples of an oxide semiconductor transistor that can be used for the transistor M0 described in Embodiments 1 to 3 are shown.

<<Structure Example 1 of Transistor>>

Figure 11A:
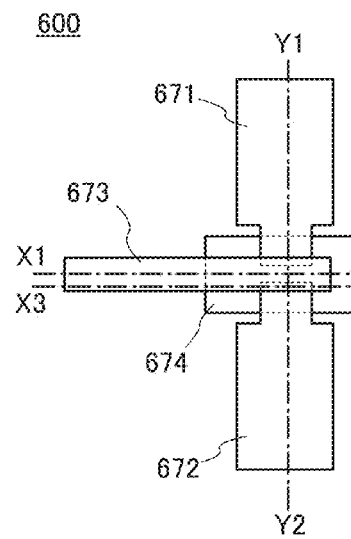
FIG. 11A is a top view and FIGS. 11B to 11D are cross-sectional views illustrating a structure example of a transistor.
Figure 11B:
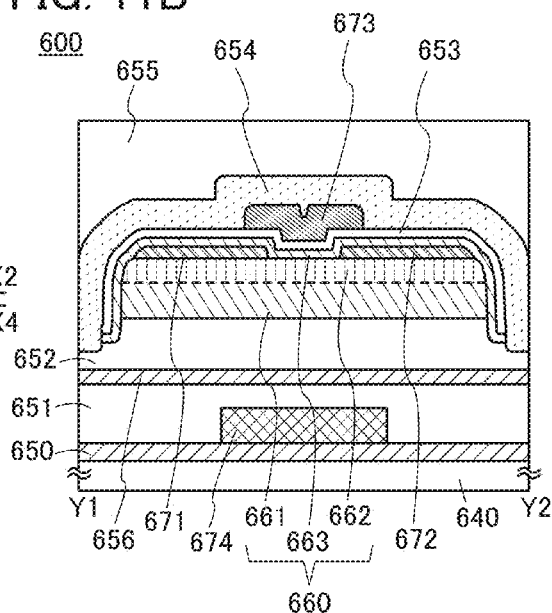
Figure 11C:
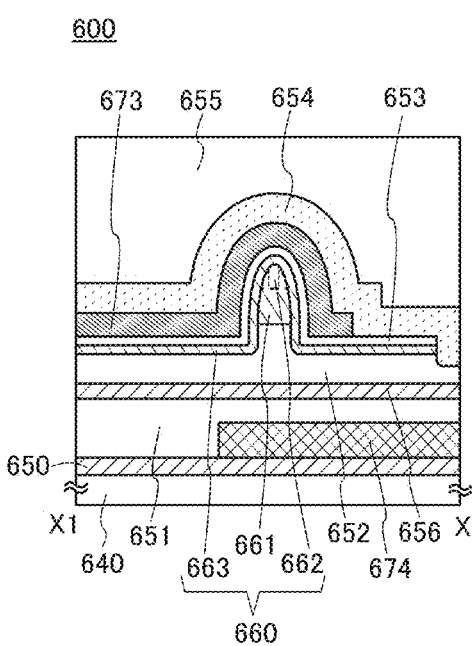
Figure 11D:
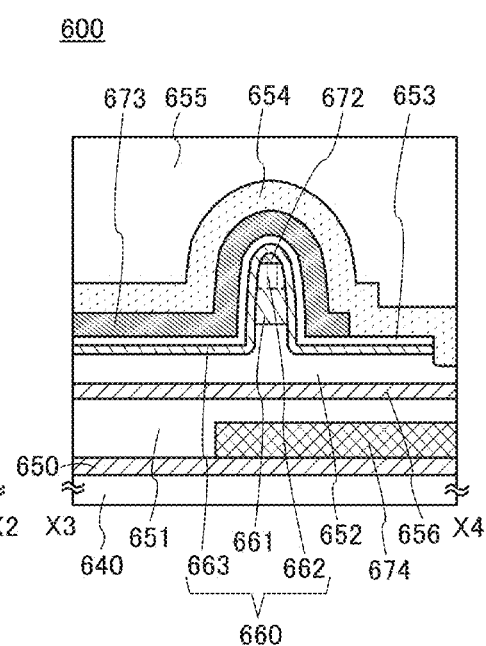

FIGS. 11A to 11D are a top view and cross-sectional views of a transistor 600. FIG. 11A is the top view. FIG. 11B illustrates a cross section along dashed-dotted line Y1-Y2 in FIG. 11A. FIG. 11C illustrates a cross section along dashed-dotted line X1-X2 in FIG. 11A. FIG. 11D illustrates a cross section along dashed-dotted line X3-X4 in FIG. 11A. In FIGS. 11A to 11D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on the transistor structure, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

The transistor 600 includes a substrate 640; an insulating film 650 over the substrate 640; a conductive film 674 over the insulating film 650; an insulating film 651 covering the conductive film 674; an insulating film 656 over the insulating film 651; an insulating film 652 over the insulating film 656; a semiconductor 661 and a semiconductor 662 stacked over the insulating film 652 in this order; a conductive film 671 and a conductive film 672 in contact with the top surface of the semiconductor 662; a semiconductor 663 in contact with the semiconductor 661, the semiconductor 662, the conductive film 671, and the conductive film 672; an insulating film 653 and a conductive film 673 over the semiconductor 663; an insulating film 654 over the conductive film 673 and the insulating film 653; and an insulating film 655 over the insulating film 654. Note that the semiconductor 661, the semiconductor 662, and the semiconductor 663 are collectively referred to as a semiconductor 660.

The conductive film 671 functions as one of a source electrode and a drain electrode of the transistor 600. The conductive film 672 functions as the other of the source electrode and the drain electrode of the transistor 600.

The conductive film 673 functions as a first gate electrode of the transistor 600.

The insulating film 653 functions as a first gate insulating film of the transistor 600.

The conductive film 674 has a function as a second gate electrode of the transistor 600.

Potentials applied to the conductive films 673 and 674 may be the same or different from each other. Note that the conductive film 674 is unnecessary in some cases.

The insulating films 650, 651, 652, and 656 function as base insulating films. The insulating films 651, 652 and 656 also function as a second gate insulating film of the transistor 600.

The insulating films 654 and 655 each function as a protective insulating film or an interlayer insulating film.

As illustrated in FIG. 11C, a side surface of the semiconductor 662 is surrounded by the conductive film 673. With such a structure, the semiconductor 662 can be electrically surrounded by an electric field of the conductive film 673 (a transistor structure in which a semiconductor is electrically surrounded by an electric field of a conductive film (gate electrode) is referred to as a surrounded channel (s-channel) structure). Therefore, a channel is formed in the entire semiconductor 662 (bulk) in some cases. In the s-channel structure, a large amount of current can flow between a source and a drain of a transistor, so that a high current in an on state (on-state current) can be achieved. The s-channel structure enables a transistor to operate at high frequency.

The s-channel structure, because of its high on-state current, is suitable for a semiconductor device such as large-scale integration (LSI) which requires a miniaturized transistor. A semiconductor device including the miniaturized transistor can have a high integration degree and high density. The transistor preferably has, for example, a region where a channel length is greater than or equal to 10 nm and less than more preferably greater than or equal to 10 nm and less than 100 nm, still more preferably greater than or equal to 10 nm and less than 70 nm, yet still more preferably greater than or equal to 10 nm and less than 60 nm, and yet still more preferably greater than or equal to 10 nm and less than 30 nm. In addition, the transistor preferably has, for example, a region where a channel width is greater than or equal to 10 nm and less than 1 more preferably greater than or equal to 10 nm and less than 100 nm, still more preferably greater than or equal to 10 nm and less than 70 nm, yet still more preferably greater than or equal to 10 nm and less than 60 nm, and yet still more preferably greater than or equal to 10 nm and less than 30 nm.

Since a high on-state current can be obtained, the s-channel structure is suitable for a transistor that needs to operate at high frequency. A semiconductor device including the transistor can operate at high frequency.

Components of the transistor 600 are described below.

<Semiconductor>

First, semiconductors which can be used as the semiconductors 661 to 663 will be described.

In the transistor 600, it is preferable that the current flowing between a source and drain in an off state (off-state current) be low. An example of a transistor with a low off-state current is a transistor including an oxide semiconductor as a semiconductor.

The semiconductor 662 is, for example, an oxide semiconductor containing indium (In). The semiconductor 662 has a high carrier mobility (electron mobility) when containing, for example, indium. The semiconductor 662 preferably contains an element M. The element M is preferably aluminum (Al), gallium (Ga), yttrium (Y), tin (Sn), or the like. Other elements which can be used as the element M include boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), and tungsten (W). Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 662 preferably contains zinc (Zn). When the oxide semiconductor contains zinc, the oxide semiconductor is easily crystallized in some cases.

Note that the semiconductor 662 is not limited to the oxide semiconductor containing indium. The semiconductor 662 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 662, an oxide with a wide energy gap may be used. For example, the energy gap of the semiconductor 662 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The semiconductor 662 is preferably a CAAC-OS film which will be described later.

For example, the semiconductor 661 and the semiconductor 663 include one or more, or two or more elements other than oxygen included in the semiconductor 662. Since the semiconductor 661 and the semiconductor 663 each include one or more, or two or more elements other than oxygen included in the semiconductor 662, an interface state is less likely to be formed at the interface between the semiconductor 661 and the semiconductor 662 and the interface between the semiconductor 662 and the semiconductor 663.

In the case of using an In-M-Zn oxide as the semiconductor 661 and the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case where the semiconductor 661 is formed by a sputtering method, a sputtering target with the above composition, for example, a sputtering target containing In, M, and Zn at an atomic ratio of 1:3:2, is preferably used.

In the case where an In-M-Zn oxide is used for the semiconductor 662 and the summation of In and M is assumed to be 100 atomic %, the proportions of In and M are preferably set to be greater than 25 atomic % and less than 75 atomic %, respectively, and more preferably greater than 34 atomic % and less than 66 atomic %, respectively. In the case where the semiconductor 662 is formed by a sputtering method, a sputtering target with the above composition, for example, a sputtering target containing In, M, and Zn at an atomic ratio of 1:1:1, 1:1:1.2, 2:1:3, 3:1:2, or 4:2:4.1, is preferably used. In particular, when a sputtering target containing In, Ga, and Zn at an atomic ratio of 4:2:4.1 is used, the semiconductor 662 may contain In, Ga, and Zn at an atomic ratio of around 4:2:3.

In the case of using an In-M-Zn oxide as the semiconductor 663, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the semiconductor 663 and the semiconductor 661 may be formed using the same type of oxide. Note that the semiconductor 661 and/or the semiconductor 663 do/does not necessarily contain indium in some cases. For example, the semiconductor 661 and/or the semiconductor 663 may be gallium oxide.

Figure 12A:
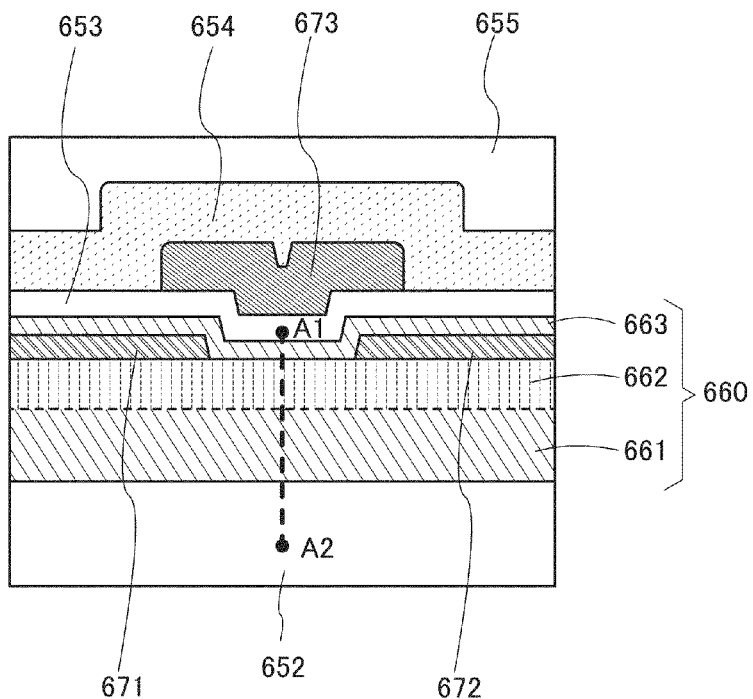
FIG. 12A is a cross-sectional view and FIG. 12B is an energy band diagram illustrating a structure example of a transistor.
Figure 12B:
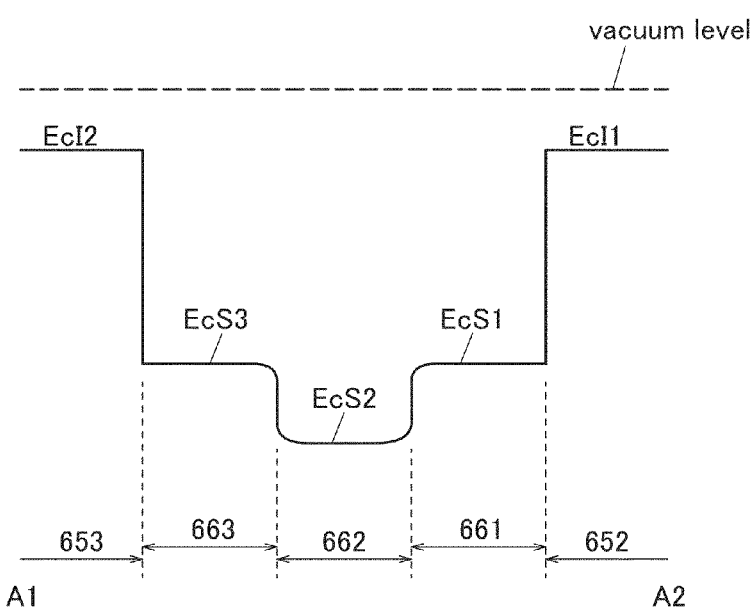

Next, a function and an effect of the semiconductor 660 in which the semiconductors 661 to 663 are stacked will be described using an energy band diagram in FIG. 12B. FIG. 12A is an enlarged view of the channel portion of the transistor 600 illustrated in FIG. 11B. FIG. 12B shows an energy band structure of a portion along the chain line A1-A2 in FIG. 12A. FIG. 12B illustrates the energy band structure of a channel formation region of the transistor 600.

In FIG. 12B, EcI1, EcS1, EcS2, EcS3, and EcI2 indicate the energy of the conduction band minimum of the insulating film 652, the semiconductor 661, the semiconductor 662, the semiconductor 663, and the insulating film 653, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer. The energy difference between the vacuum level and the valence band maximum can be measured using an ultraviolet photoelectron spectroscopy (UPS) device.

Since the insulating film 652 and the insulating film 653 are insulators, EcI2 and EcI1 are closer to the vacuum level than EcS1, EcS2, and EcS3 are (i.e., the insulating film 652 and the insulating film 653 have a smaller electron affinity than the semiconductor 661, the semiconductor 662, and the semiconductor 663).

As the semiconductor 662, an oxide having an electron affinity higher than those of the semiconductors 661 and 663 is used. For example, as the semiconductor 662, an oxide having an electron affinity higher than those of the semiconductors 661 and 663 by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

An indium gallium oxide has a small electron affinity and a high oxygen-blocking property. Therefore, the semiconductor 663 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when a gate voltage is applied, a channel is formed in the semiconductor 662 having the highest electron affinity among the semiconductors 661 to 663.

Here, in some cases, there is a mixed region of the semiconductor 661 and the semiconductor 662 between the semiconductor 661 and the semiconductor 662. Furthermore, in some cases, there is a mixed region of the semiconductor 662 and the semiconductor 663 between the semiconductor 662 and the semiconductor 663. The mixed region has a low interface state density. For that reason, the stack of the semiconductor 661, the semiconductor 662, and the semiconductor 663 has a band structure where energy at each interface and in the vicinity of the interface is changed continuously (continuous junction).

At this time, electrons move mainly in the semiconductor 662, not in the semiconductor 661 and the semiconductor 663. As described above, when the interface state density at the interface between the semiconductor 661 and the semiconductor 662 and the interface state density at the interface between the semiconductor 662 and the semiconductor 663 are decreased, electron movement in the semiconductor 662 is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness in a channel formation region is large.

To increase the on-state current of the transistor, for example, root mean square (RMS) roughness with a measurement area of 1 µm×1 µm of the top surface or the bottom surface of the semiconductor 662 (a formation surface; here, the top surface of the semiconductor 661) is less than 1 nm, preferably less than 0.6 nm, more preferably less than 0.5 nm, still more preferably less than 0.4 nm. The average surface roughness (also referred to as Ra) with the measurement area of 1 µm×1 µm is less than 1 nm, preferably less than 0.6 nm, more preferably less than 0.5 nm, still more preferably less than 0.4 nm. The maximum difference (P–V) with the measurement area of 1 µm×1 µm is less than 10 nm, preferably less than 9 nm, more preferably less than 8 nm, still more preferably less than 7 nm. RMS roughness, Ra, and P–V can be measured using, for example, a scanning probe microscope SPA-500 manufactured by SII Nano Technology Inc.

The electron movement is also inhibited, for example, in the case where the density of defect states is high in a region where a channel is formed.

For example, in the case where the semiconductor 662 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor 662, the on-state current of the transistor can be increased in some cases.

For example, the hydrogen concentration at a certain depth in the semiconductor 662 or in a certain region of the semiconductor 662, which is measured by secondary ion mass spectrometry (SIMS), is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the semiconductor 662, for example, there is a method in which excess oxygen in the insulating film 652 is moved to the semiconductor 662 through the semiconductor 661. In this case, the semiconductor 661 is preferably a layer having an oxygen-transmitting property (a layer through which oxygen passes or is transmitted).

In the case where the transistor has an s-channel structure, a channel is formed in the whole of the semiconductor 662. Therefore, as the semiconductor 662 has a larger thickness, a channel region becomes larger. In other words, the thicker the semiconductor 662 is, the larger the on-state current of the transistor is.

Moreover, the thickness of the semiconductor 663 is preferably as small as possible to increase the on-state current of the transistor. For example, the semiconductor 663 has a region with a thickness of less than 10 nm, preferably less than or equal to 5 nm, more preferably less than or equal to 3 nm. Meanwhile, the semiconductor 663 has a function of blocking entry of elements other than oxygen (such as hydrogen and silicon) included in the adjacent insulator into the semiconductor 662 where a channel is formed. For this reason, it is preferable that the semiconductor 663 have a certain thickness. For example, the semiconductor 663 may have a region with a thickness of greater than or equal to 0.3 nm, preferably greater than or equal to 1 nm, more preferably greater than or equal to 2 nm. The semiconductor 663 preferably has an oxygen blocking property to suppress outward diffusion of oxygen released from the insulating film 652 and the like.

To improve reliability, preferably, the thickness of the semiconductor 661 is large and the thickness of the semiconductor 663 is small. For example, the semiconductor 661 has a region with a thickness of greater than or equal to 10 nm, preferably greater than or equal to 20 nm, more preferably greater than or equal to 40 nm, still more preferably greater than or equal to 60 nm. When the thickness of the semiconductor 661 is made large, the distance from an interface between the adjacent insulator and the semiconductor 661 to the semiconductor 662 in which a channel is formed can be large. However, to prevent the productivity of the semiconductor device from being decreased, the semiconductor 661 has a region with a thickness of, for example, less than or equal to 200 nm, preferably less than or equal to 120 nm, more preferably less than or equal to 80 nm.

For example, a region with a silicon concentration measured by SIMS analysis of higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$ is provided between the semiconductor 662 and the semiconductor 661. A region with a silicon concentration measured by SIMS of higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$ is provided between the semiconductor 662 and the semiconductor 663.

It is preferable to reduce the concentration of hydrogen in the semiconductor 661 and the semiconductor 663 in order to reduce the concentration of hydrogen in the semiconductor 662. The semiconductor 661 and the semiconductor 663 each have a region in which the concentration of hydrogen measured by SIMS is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. It is preferable to reduce the concentration of nitrogen in the semiconductor 661 and the semiconductor 663 in order to reduce the concentration of nitrogen in the semiconductor 662. The semiconductor 661 and the semiconductor 663 each have a region in which the concentration of nitrogen measured by SIMS is higher than or equal to $1\times10^{16}$ atoms/cm$^3$ and lower than $5\times10^{19}$ atoms/cm$^3$, preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$.

The above three-layer structure is an example. For example, a two-layer structure without the semiconductor 661 or the semiconductor 663 may be employed. A four-layer structure in which any one of the semiconductors shown as examples of the semiconductor 661, the semiconductor 662, and the semiconductor 663 is provided under or over the semiconductor 661 or under or over the semiconductor 663 may be employed. An n-layer structure (n is an integer of 5 or more) may be employed in which any one of the semiconductors shown as examples of the semiconductor 661, the semiconductor 662, and the semiconductor 663 is provided at two or more of the following positions: over the semiconductor 661, under the semiconductor 661, over the semiconductor 663, and under the semiconductor 663.

<Substrate>

As the substrate 640, for example, an insulator substrate, a semiconductor substrate, or a conductor substrate may be used. As the insulator substrate, for example, a glass substrate, a quartz substrate, a sapphire substrate, a stabilized zirconia substrate (e.g., an yttria-stabilized zirconia substrate), or a resin substrate is used. As the semiconductor substrate, for example, a single material semiconductor substrate made of silicon, germanium, or the like, a compound semiconductor substrate made of silicon carbide, silicon germanium, gallium arsenide, indium phosphide, zinc oxide, or gallium oxide, or the like is used. The above semiconductor substrate in which an insulator region is provided, e.g., a silicon on insulator (SOI) substrate may also be used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like may also be used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 640. As a method for providing a transistor over a flexible substrate, there is a method in which the transistor is formed over a non-flexible substrate and then the transistor is separated and transferred to the substrate 640 which is a flexible substrate. In that case, a separation layer is preferably provided between the non-flexible substrate and the transistor. As the substrate 640, a sheet, a film, or a foil containing a fiber may be used. The substrate 640 may have elasticity. The substrate 640 may have a property of returning to its original shape when bending or pulling is stopped. Alternatively, the substrate 640 may have a property of not returning to its original shape. The thickness of the substrate 640 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 640 has a small thickness, the weight of the semiconductor device can be reduced. When the substrate 640 has a small thickness, even in the case of using glass or the like, the substrate 640 may have elasticity or a property of returning to its original shape when bending or pulling is stopped. Therefore, an impact applied to the semiconductor device over the substrate 640, which is caused by dropping or the like, can be reduced. That is, a durable semiconductor device can be provided.

For the substrate 640 which is a flexible substrate, for example, metal, an alloy, resin, glass, or fiber thereof can be used. The flexible substrate 640 preferably has a lower coefficient of linear expansion because deformation due to an environment is suppressed. The flexible substrate 640 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 640 because of its low coefficient of linear expansion.

<Base Insulating Film>

The insulating film 650 has a function of electrically isolating the substrate 640 and the conductive film 674 from each other.

The insulating film 650 or 651 is formed using an insulating film having a single-layer structure or a stacked-layer structure. Examples of the material of the insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 651 may be formed using silicon oxide with high step coverage which is formed by reacting tetraethyl orthosilicate (TEOS), silane, or the like with oxygen, nitrous oxide, or the like.

After the insulating film 651 is formed, the insulating film 651 may be subjected to planarization treatment using a CMP method or the like to improve the planarity of the top surface thereof.

The insulating film 652 preferably includes an oxide. In particular, the insulating film 652 preferably includes an oxide material from which part of oxygen is released by heating. The insulating film 652 preferably includes an oxide containing oxygen in excess of that in the stoichiometric composition. Part of oxygen is released by heating from the oxide film containing oxygen in excess of that in the stoichiometric composition. Oxygen released from the insulating film 651 or 652 is supplied to the semiconductor 660 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen in excess of that in the stoichiometric composition is an oxide film in which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

The insulating film 652 preferably contains an oxide that can supply oxygen to the semiconductor 660. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 652.

To make the insulating film 652 contain excess oxygen, the insulating film 652 is formed in an oxygen atmosphere, for example. Alternatively, a region containing excess oxygen may be formed by introducing oxygen into the insulating film 652 that has been formed. Both the methods may be combined.

For example, oxygen (at least including any of oxygen radicals, oxygen atoms, and oxygen ions) may be introduced into the insulating film 652 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, or the like can be used. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 652 is formed, the insulating film 652 may be subjected to planarization treatment using a CMP method or the like to improve the planarity of the top surface thereof.

The insulating film 656 has a passivation function of preventing oxygen contained in the insulating film 652 from decreasing by bonding to metal contained in the conductive film 674.

The insulating film 656 has a function of blocking oxygen, hydrogen, water, alkali metal, alkaline earth metal, and the like. Providing the insulating film 656 can prevent outward diffusion of oxygen from the semiconductor 660 and entry of hydrogen, water, or the like into the semiconductor 660 from the outside.

The insulating film 656 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. As examples of the oxide insulating film, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

In the transistor 600, the threshold voltage can be controlled by injecting electrons into a charge trap layer. The charge trap layer is preferably provided in the insulating film 651 or the insulating film 656. For example, when the insulating film 656 is formed using hafnium oxide, aluminum oxide, tantalum oxide, aluminum silicate, or the like, the insulating film 656 can function as a charge trap layer.

<Gate Electrode, Source Electrode, and Drain Electrode>

The conductive films 671 to 673 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

The conductive films 671 to 673 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<Gate Insulating Film>

The insulating film 653 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 653 may be a stack including any of the above materials. The insulating film 653 may contain lanthanum (La), nitrogen, or zirconium (Zr) as an impurity.

An example of a layered structure of the insulating film 653 is described. The insulating film 653 contains oxygen, nitrogen, silicon, or hafnium, for example. Specifically, the insulating film 653 preferably includes hafnium oxide and silicon oxide or silicon oxynitride.

Hafnium oxide has a higher dielectric constant than silicon oxide and silicon oxynitride. Therefore, the thickness of the insulating film 653 can be larger when hafnium oxide is used than when silicon oxide is used; as a result, a leakage current due to a tunnel current can be low. That is, it is possible to provide a transistor with a low off-state current.

<Protective Insulating Film>

The insulating film 654 has a blocking effect against oxygen, hydrogen, water, alkali metal, alkaline earth metal, and the like. Providing the insulating film 654 can prevent outward diffusion of oxygen from the semiconductor 660 and entry of hydrogen, water, or the like into the semiconductor 660 from the outside.

The insulating film 654 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating film 654 because it is highly effective in preventing transmission of both oxygen and impurities such as hydrogen and moisture.

After the insulating film 654 is formed, heat treatment is preferably performed. Through this heat treatment, oxygen can be supplied to the semiconductor 660 from the insulating film 652 or the like; thus, oxygen vacancies in the semiconductor 660 can be reduced.

The insulating film 655 can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the insulating film 655, an organic resin such as a polyimide resin, a polyamide resin, an acrylic resin, a siloxane resin, an epoxy resin, or a phenol resin can be used. The insulating film 655 may be a stack including any of the above materials.

<Structure Example 2 of Transistor>

Figure 13A:
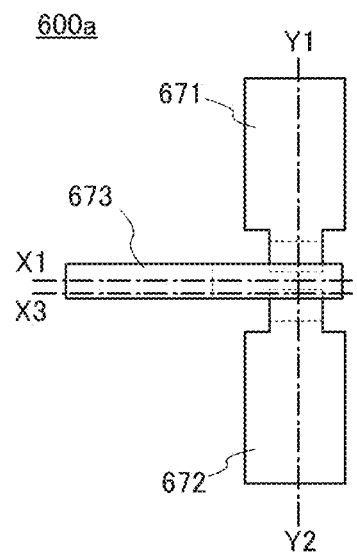
FIG. 13A is a top view and FIGS. 13B to 13D are cross-sectional views illustrating a structure example of a transistor.
Figure 13B:
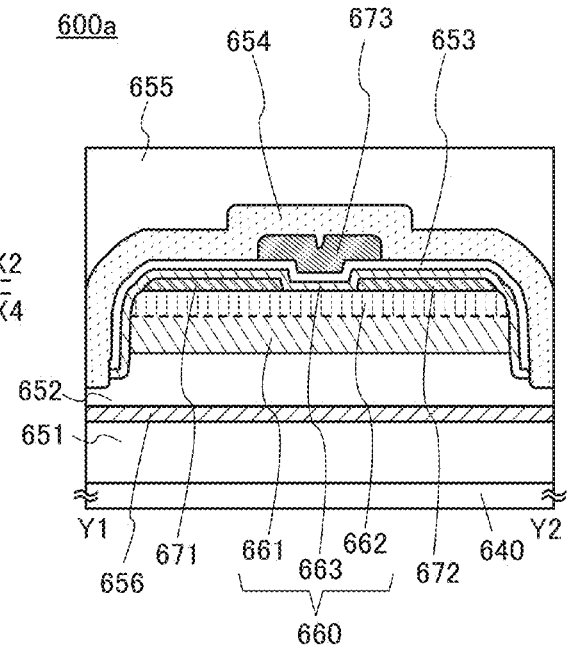
Figure 13C:
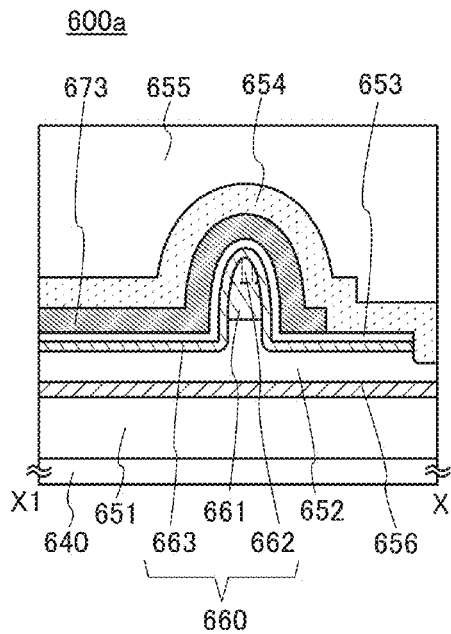
Figure 13D:
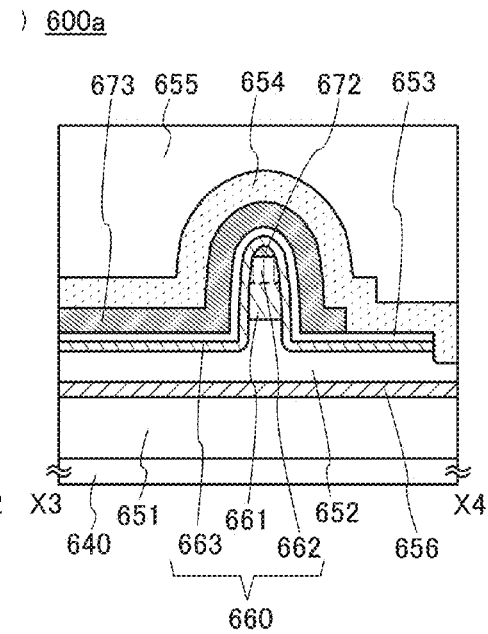

In the transistor 600 in FIGS. 11A to 11D, the conductive film 674 is not necessarily provided. FIGS. 13A to 13D show an example of such a case. FIGS. 13A to 13D are a top view and cross-sectional views of a transistor 600a. FIG. 13A is the top view. FIG. 13B illustrates a cross section along dashed-dotted line Y1-Y2 in FIG. 13A. FIG. 13C illustrates a cross section along dashed-dotted line X1-X2 in FIG. 13A. FIG. 13D illustrates a cross section along dashed-dotted line X3-X4 in FIG. 13A.

In FIGS. 13A to 13D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

The transistor 600*a* shown in FIGS. 13A to 13D is the transistor 600 shown in FIGS. 11A to 11D that is not provided with the conductive film 674 and the insulating film 650.

<Structure Example 3 of Transistor>

In the transistor 600 in FIGS. 11A to 11D, the conductive film 673 and the conductive film 674 may be connected to each other. FIGS. 14A to 14D show an example of such a case.

Figure 14A:
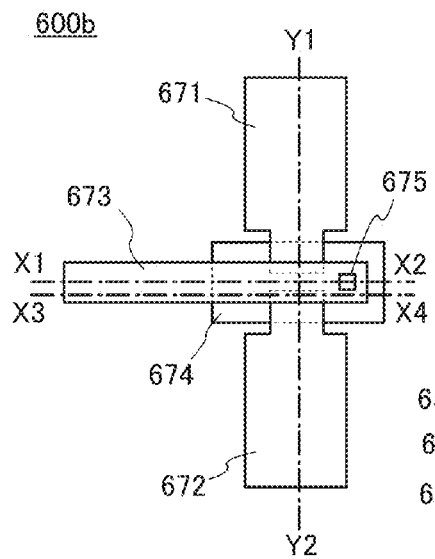
FIG. 14A is a top view and FIGS. 14B to 14D are cross-sectional views illustrating a structure example of a transistor.
Figure 14B:
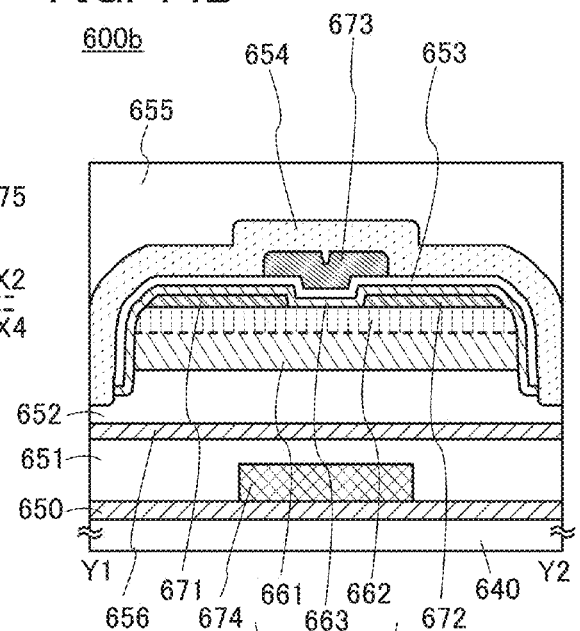
Figure 14C:
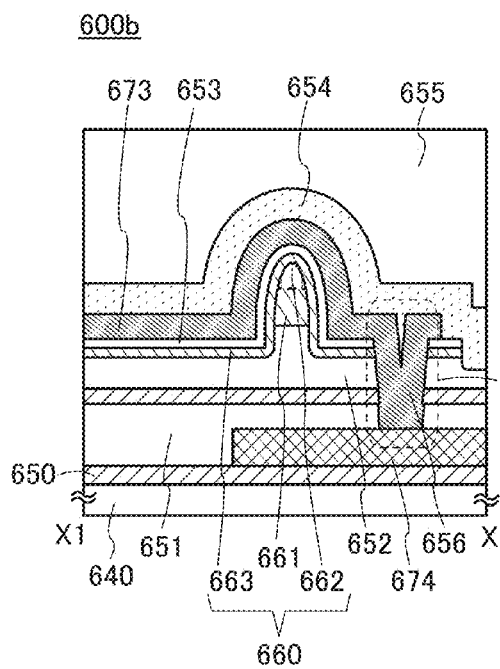
Figure 14D:
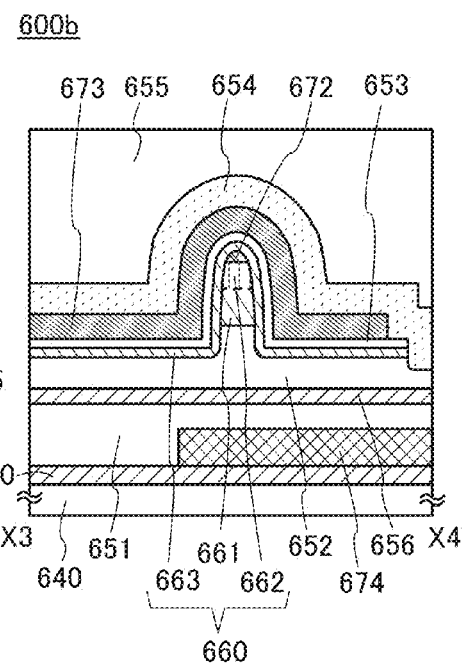

FIGS. 14A to 14D are a top view and cross-sectional views of a transistor 600*b*. FIG. 14A is the top view. FIG. 14B illustrates a cross section along dashed-dotted line Y1-Y2 in FIG. 14A. FIG. 14C illustrates a cross section along dashed-dotted line X1-X2 in FIG. 14A. FIG. 14D illustrates a cross section along dashed-dotted line X3-X4 in FIG. 14A. In FIGS. 14A to 14D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

In the transistor 600*b*, an opening portion 675 is provided in the insulating film 653, the semiconductor 663, the insulating film 652, and the insulating film 656, and the conductive film 673 and the conductive film 674 are connected to each other through the opening portion 675.

<Structure Example 4 of Transistor>

Figure 15:
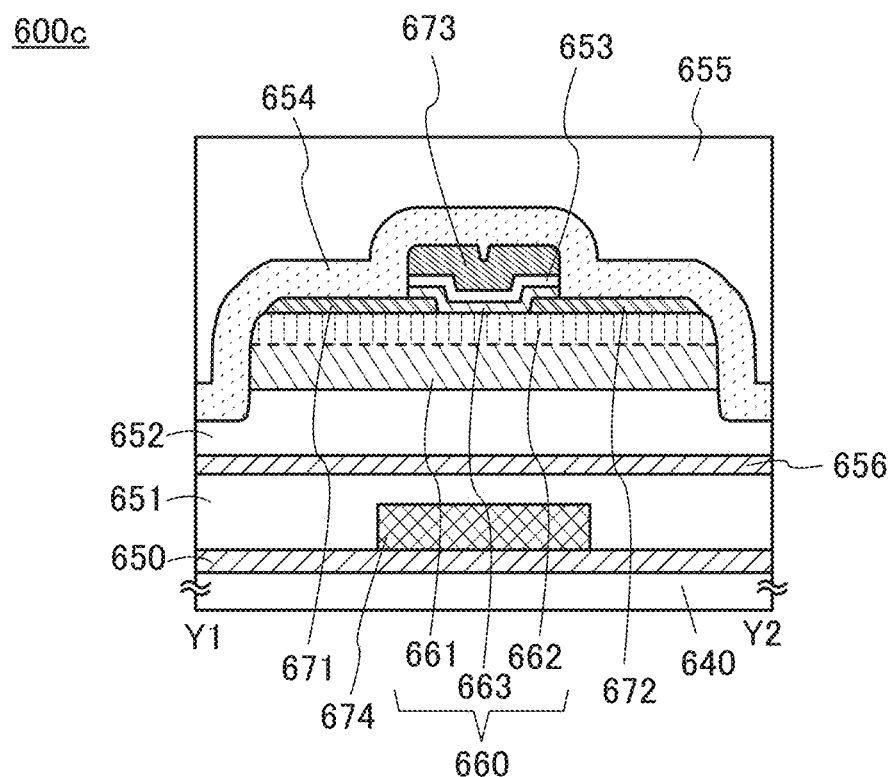
FIG. 15 is a cross-sectional view illustrating a structure example of a transistor.

In the transistor 600 illustrated in FIGS. 11A to 11D, the semiconductor 663 and the insulating film 653 may be etched at the same time when the conductive film 673 is formed by etching. FIG. 15 shows an example of such a case.

FIG. 15 illustrates a transistor 600*c* in which the semiconductor 663 and the insulating film 653 in FIG. 11B are provided only under the conductive film 673.

<Structure Example 5 of Transistor>

Figure 16:
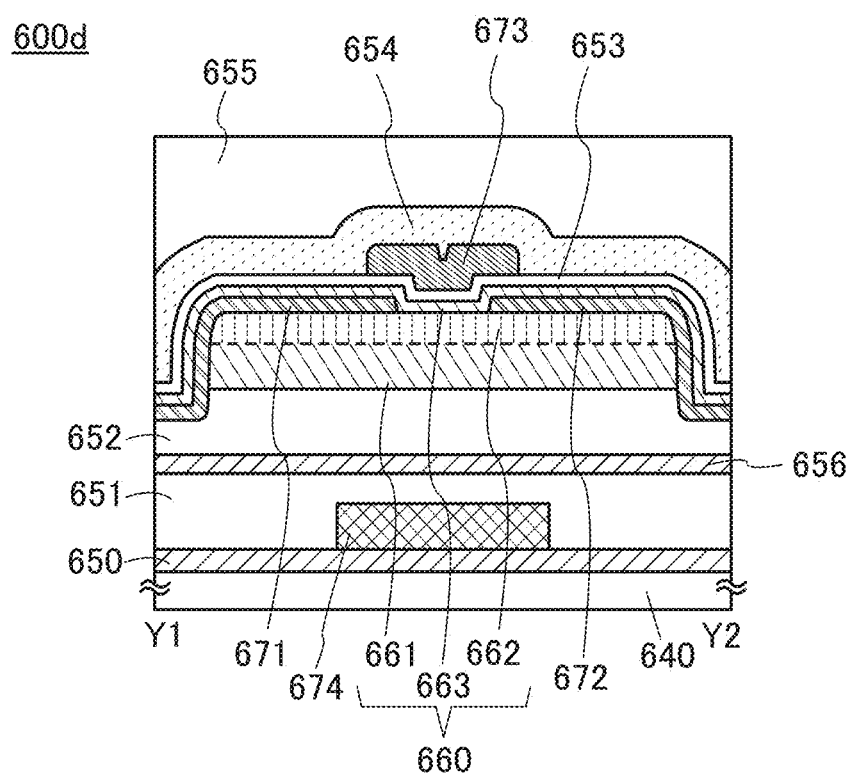
FIG. 16 is a cross-sectional view illustrating a structure example of a transistor.

In the transistor 600 illustrated in FIGS. 11A to 11D, the conductive films 671 and 672 may be in contact with side surfaces of the semiconductors 661 and 662. FIG. 16 shows an example of such a case.

FIG. 16 illustrates a transistor 600*d* in which the conductive films 671 and 672 in FIG. 11B are in contact with the side surfaces of the semiconductors 661 and 662.

<Structure Example 6 of Transistor>

Figure 17:
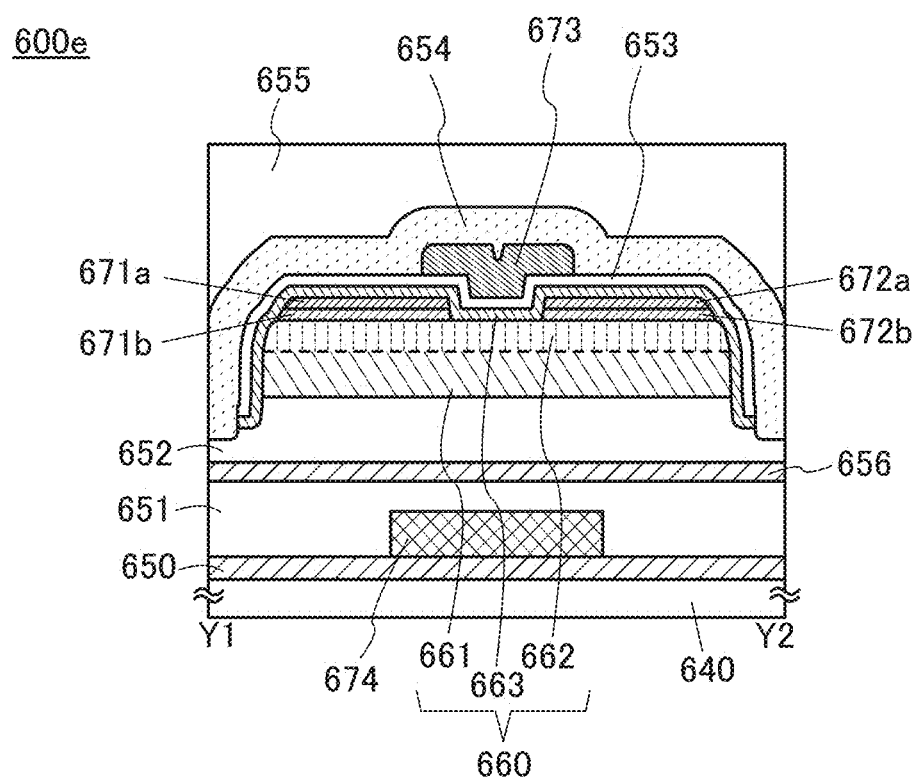
FIG. 17 is a cross-sectional view illustrating a structure example of a transistor.

In the transistor 600 illustrated in FIGS. 11A to 11D, the conductive film 671 may be a stack including a conductive film 671*a* and a conductive film 671*b*. Furthermore, the conductive film 672 may be a stack including a conductive film 672*a* and a conductive film 672*b*. FIG. 17 illustrates an example of such a case.

FIG. 17 illustrates a transistor 600*e* in which the conductive film 671 and the conductive film 672 in FIG. 11B are a stack including the conductive films 671*a* and 671*b* and a stack including the conductive films 672*a* and 672*b*, respectively.

The conductive films 671*b* and 672*b* may be formed using a transparent conductor, an oxide semiconductor, a nitride semiconductor, or an oxynitride semiconductor, for example. The conductive films 671*b* and 672*b* may be formed using, for example, a film containing indium, tin, and oxygen, a film containing indium and zinc, a film containing indium, tungsten, and zinc, a film containing tin and zinc, a film containing zinc and gallium, a film containing zinc and aluminum, a film containing zinc and fluorine, a film containing zinc and boron, a film containing tin and antimony, a film containing tin and fluorine, a film containing titanium and niobium, or the like. Alternatively, any of these films may contain hydrogen, carbon, nitrogen, silicon, germanium, or argon.

The conductive films 671*b* and 672*b* may have a property of transmitting visible light. Alternatively, the conductive films 671*b* and 672*b* may have a property of not transmitting visible light, ultraviolet light, infrared light, or X-rays by reflecting or absorbing it. In some cases, such a property can suppress change in electrical characteristics of the transistor due to stray light.

The conductive films 671*b* and 672*b* may preferably be formed using a layer which does not form a Schottky barrier with the semiconductor 662 or the like. Accordingly, on-state characteristics of the transistor can be improved.

Each of the conductive films 671*a* and 672*a* may be formed to have, for example, a single-layer structure or a layered structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

Note that the conductive films 671*b* and 672*b* may preferably be formed using a film having a resistance higher than that of the conductive films 671*a* and 672*a*. The conductive films 671*b* and 672*b* may preferably be formed using a film having a resistance lower than that of the channel of the transistor. For example, the conductive films 671*b* and 672*b* may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductive films 671*b* and 672*b* having a resistivity within the above range can reduce electric field concentration in a boundary portion between the channel and the drain. Therefore, change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the conductive films 671*b* and 672*b* (e.g., the film on the drain side) may preferably be provided.

<Structure Example 7 of Transistor>

Figure 18A:
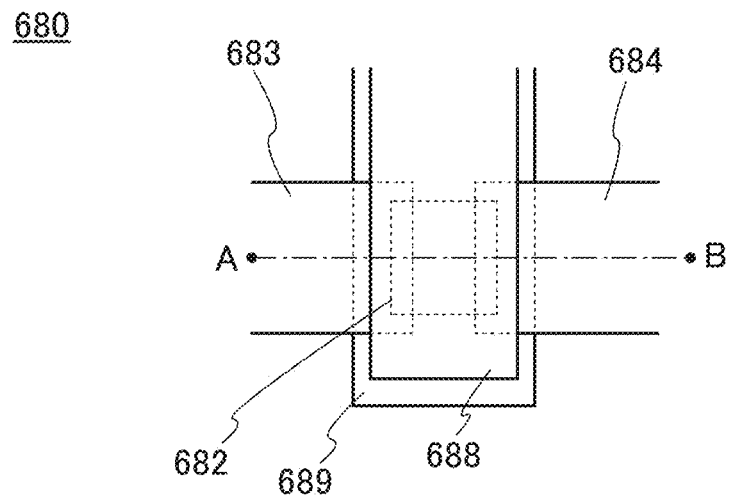
FIG. 18A is a top view and FIG. 18B is a cross-sectional view illustrating a structure example of a transistor.
Figure 18B:
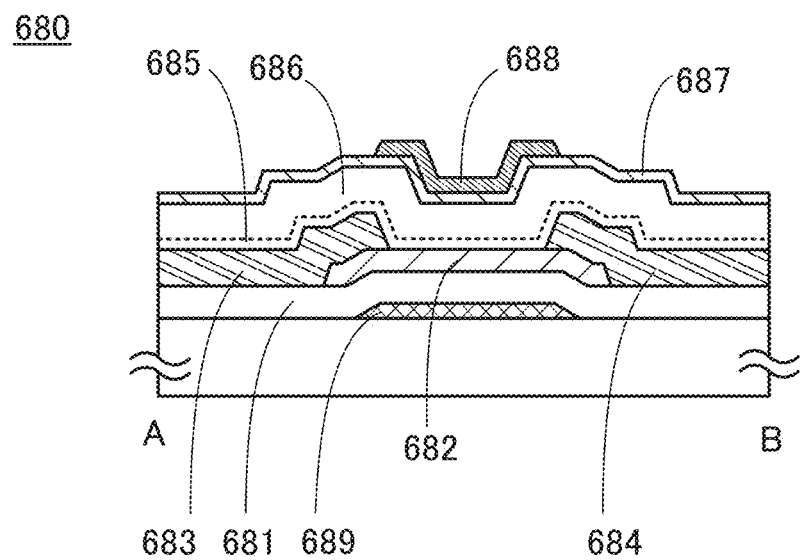

FIGS. 18A and 18B are a top view and a cross-sectional view of a transistor 680. FIG. 18A is the top view. FIG. 18B illustrates a cross section along dashed-dotted line A-B in FIG. 18A. In FIGS. 18A and 18B, some components are scaled up or down or omitted for easy understanding. The direction of the dashed-dotted line A-B may be referred to as a channel length direction.

The transistor 680 illustrated in FIG. 18B includes a conductive film 689 serving as a first gate, a conductive film 688 serving as a second gate, a semiconductor 682, a conductive film 683 and a conductive film 684 serving as a source and a drain, an insulating film 681, an insulating film 685, an insulating film 686, and an insulating film 687.

The conductive film 689 is on an insulating surface. The conductive film 689 overlaps with the semiconductor 682 with the insulating film 681 provided therebetween. The conductive film 688 overlaps with the semiconductor 682 with the insulating films 685, 686, and 687 provided therebetween. The conductive films 683 and 684 are connected to the semiconductor 682.

The description of the conductive films 673 and 674 in FIGS. 11A to 11D can be referred to for the details of the conductive films 689 and 688.

The conductive films 689 and 688 may be supplied with different potentials, or may be supplied with the same potential at the same time. The conductive film 688 serving as a second gate electrode in the transistor 680 leads to stabilization of threshold voltage. Note that the conductive film 688 is unnecessary in some cases.

The description of the semiconductor 662 in FIGS. 11A to 11D can be referred to for the details of the semiconductor 682. The semiconductor 682 may be a single layer or a stack including a plurality of semiconductor layers.

The description of the conductive films 671 and 672 in FIGS. 11A to 11D can be referred to for the details of the conductive films 683 and 684.

The description of the insulating film 653 in FIGS. 11A to 11D can be referred to for the details of the insulating film 681.

The insulating films 685 to 687 are sequentially stacked over the semiconductor 682 and the conductive films 683 and 684 in FIG. 18B; however, an insulating film provided over the semiconductor 682 and the conductive films 683 and 684 may be a single layer or a stack including a plurality of insulating films.

In the case of using an oxide semiconductor as the semiconductor 682, the insulating film 686 preferably contains oxygen at a proportion higher than or equal to that in the stoichiometric composition and has a function of supplying part of oxygen to the semiconductor 682 by heating. Note that in the case where the provision of the insulating film 686 directly on the semiconductor 682 causes damage to the semiconductor 682 at the time of formation of the insulating film 686, the insulating film 685 is preferably provided between the semiconductor 682 and the insulating film 686, as illustrated in FIG. 18B. The insulating film 685 preferably allows oxygen to pass therethrough, and causes little damage to the semiconductor 682 when the insulating film 685 is formed compared with the case of the insulating film 686. If damage to the semiconductor 682 can be reduced and the insulating film 686 can be formed directly on the semiconductor 682, the insulating film 685 is not necessarily provided.

For the insulating films 686 and 685, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 687 preferably has an effect of blocking diffusion of oxygen, hydrogen, and water. Alternatively, the insulating film 687 preferably has an effect of blocking diffusion of hydrogen and water.

As an insulating film has higher density and becomes denser or has a fewer dangling bonds and becomes more chemically stable, the insulating film has a more excellent blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 687 has an effect of blocking diffusion of water, hydrogen, and the like, impurities such as water and hydrogen that exist in a resin in a panel or exist outside the panel can be prevented from entering the semiconductor 682. Since an oxide semiconductor is used as the semiconductor 682, part of water or hydrogen that enters the oxide semiconductor serves as an electron donor (donor). Thus, the use of the insulating film 687 having the blocking effect can prevent a shift in the threshold voltage of the transistor 680 due to generation of donors.

In addition, since an oxide semiconductor is used as the semiconductor 682, when the insulating film 687 has an effect of blocking diffusion of oxygen, diffusion of oxygen from the oxide semiconductor to the outside can be prevented. Accordingly, oxygen vacancies in the oxide semiconductor that serve as donors are reduced, so that a shift in the threshold voltage of the transistor 680 due to generation of donors can be prevented.

Embodiment 5

In this embodiment, a central processing unit (CPU) that includes a semiconductor device or a memory device of one embodiment of the present invention will be described.

Figure 19:
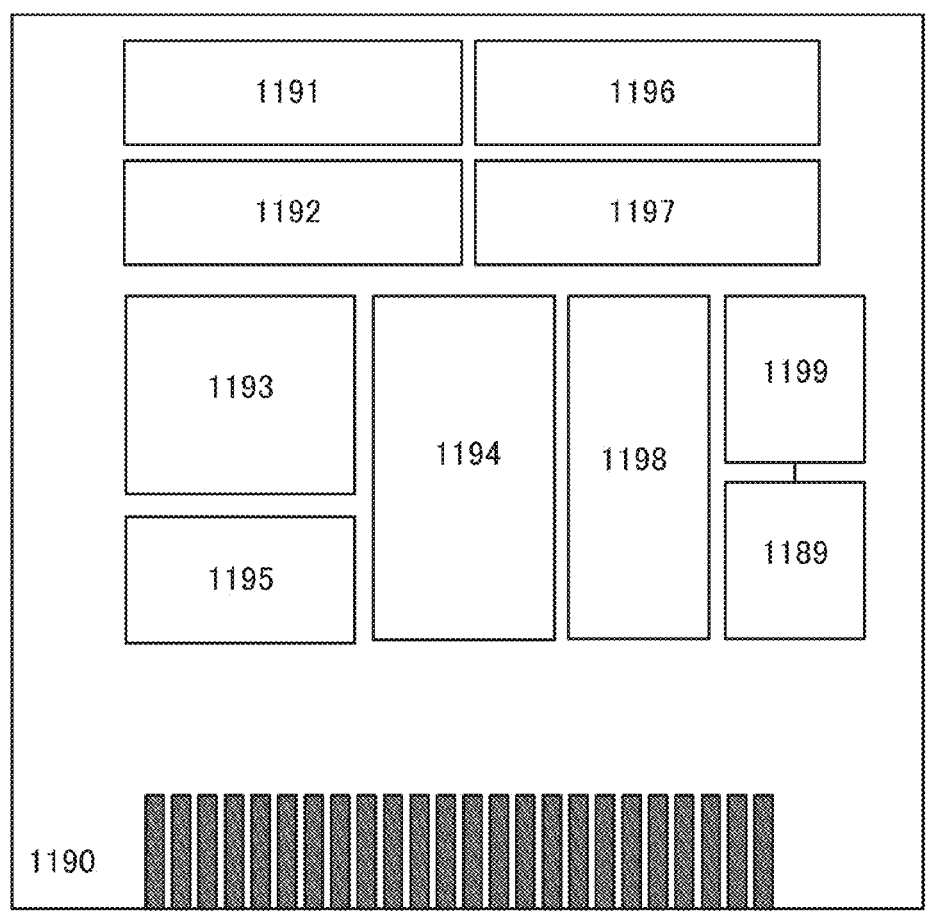
FIG. 19 is a block diagram showing an example of a CPU.

FIG. 19 is a block diagram illustrating a configuration example of a CPU. The CPU illustrated in FIG. 19 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 19 is just an example in which the configuration is simplified, and an actual CPU may have a variety of configurations depending on the application. For example, the CPU may have the following configuration: a structure including the CPU illustrated in FIG. 19 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 19, a memory cell is provided in the register 1196. For the memory cell of the register 1196, the semiconductor device or memory device of one embodiment of the present invention can be used.

In the CPU illustrated in FIG. 19, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of the power supply voltage to the memory cell in the register 1196 can be stopped.

Embodiment 6

The semiconductor device or memory device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device or memory device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 20A to 20F illustrate specific examples of these electronic devices.

Figure 20A:
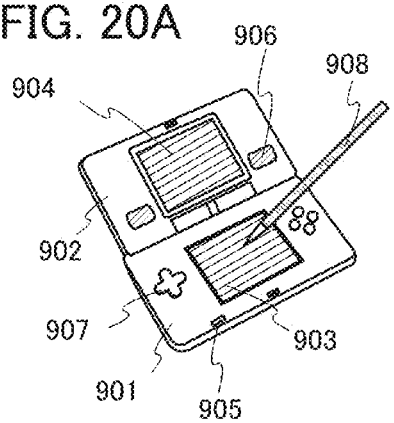
FIGS. 20A to 20F each illustrate an example of an electronic device.

FIG. 20A illustrates a portable game machine, which includes a housing 901, a housing 902, a display portion 903, a display portion 904, a microphone 905, a speaker 906, an operation key 907, a stylus 908, and the like. Although the portable game machine in FIG. 20A has the two display portions 903 and 904, the number of display portions included in a portable game machine is not limited to this.

Figure 20B:
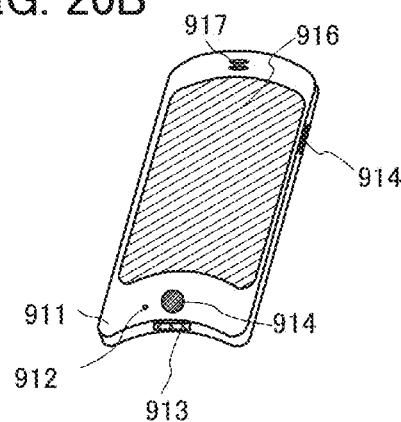

FIG. 20B illustrates a cellular phone, which is provided with a housing 911, a display portion 916, operation buttons 914, an external connection port 913, a speaker 917, a microphone 912, and the like. When the display portion 916 of the cellular phone illustrated in FIG. 20B is touched with a finger or the like, data can be input. Further, operations such as making a call and inputting a character can be performed by touch on the display portion 916 with a finger or the like. The power can be turned on or off with the operation button 914. In addition, types of images displayed on the display portion 916 can be switched; for example, switching images from a mail creation screen to a main menu screen is performed with the operation button 914.

Figure 20C:
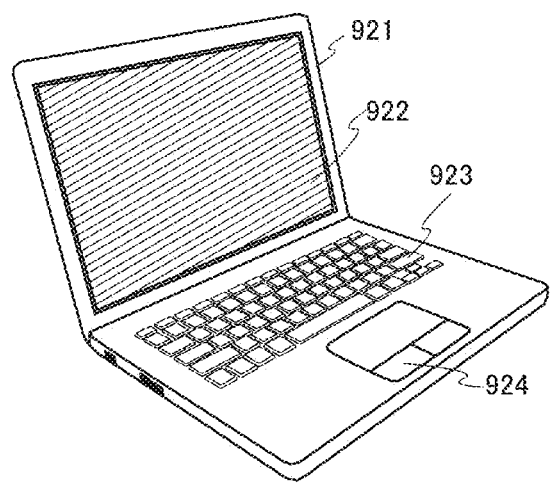

FIG. 20C illustrates a notebook personal computer, which includes a housing 921, a display portion 922, a keyboard 923, a pointing device 924, and the like.

Figure 20D:
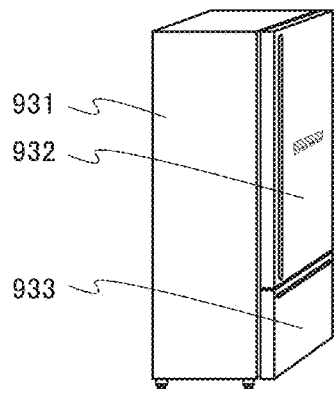

FIG. 20D illustrates an electric refrigerator-freezer, which includes a housing 931, a refrigerator door 932, a freezer door 933, and the like.

Figure 20E:
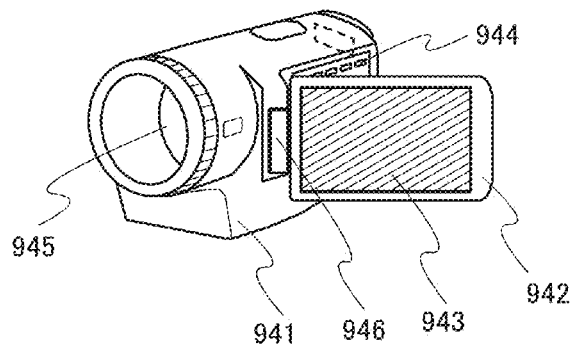

FIG. 20E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 20F:
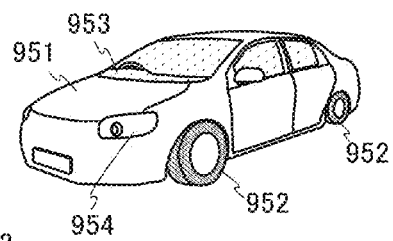
Figure 21A:
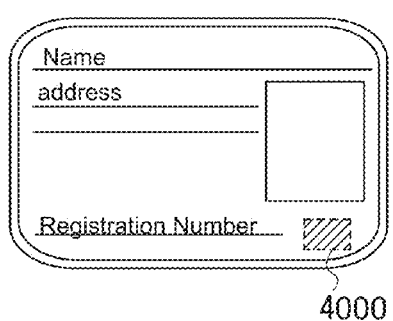
FIGS. 21A to 21F each illustrate an example of an RF tag.
Figure 21B:
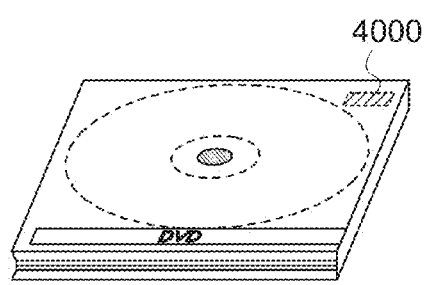
Figure 21C:
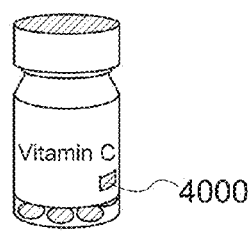
Figure 21D:
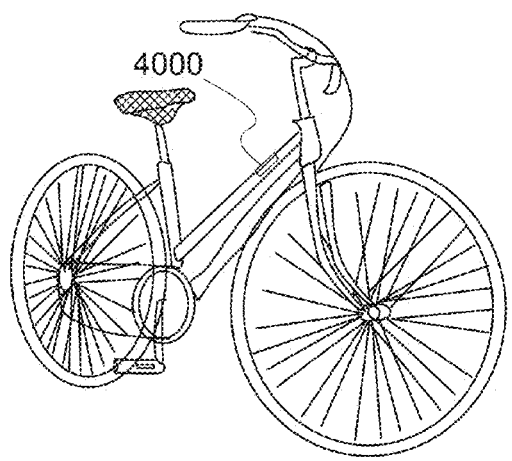
Figure 21E:
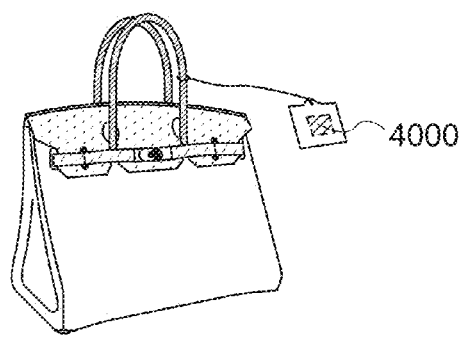
Figure 21F:
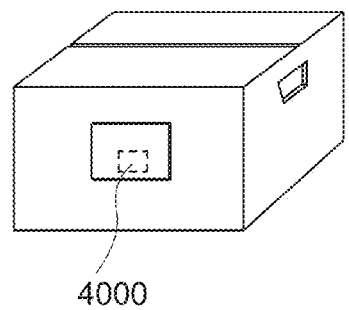

FIG. 20F illustrates a car, which includes a car body 951, wheels 952, a dashboard 953, lights 954, and the like.

Embodiment 7

In this embodiment, application examples of an RF tag that can be formed using the semiconductor device or memory device of one embodiment of the present invention will be described with reference to FIGS. 21A to 21F. The RF tag is widely used and can be provided for, for example, products such as bills, coins, securities, bearer bonds, documents (e.g., driver's licenses or resident's cards, see FIG. 21A), recording media (e.g., DVDs or video tapes, see FIG. 21B), packaging containers (e.g., wrapping paper or bottles, see FIG. 21C), vehicles (e.g., bicycles, see FIG. 21D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 21E and 21F).

An RF tag 4000 is fixed to a product by being attached to a surface thereof or embedded therein. For example, the RF tag 4000 is fixed to each product by being embedded in paper of a book, or embedded in an organic resin of a package. Since the RF tag 4000 can be reduced in size, thickness, and weight, it can be fixed to a product without spoiling the design of the product. Furthermore, bills, coins, securities, bearer bonds, documents, or the like can have an identification function by being provided with the RF tag 4000, and the identification function can be utilized to prevent counterfeiting. Moreover, the efficiency of a system such as an inspection system can be improved by providing the RF tag for packaging containers, recording media, personal belongings, foods, clothing, household goods, electronic devices, or the like. Vehicles can also have higher security against theft or the like by being provided with the RF tag.

As described above, by using the RF tag for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Next, an application example of a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device that is a device including a display element, a light-emitting element, and a light-emitting device that is a device including a light-emitting element can employ a variety of modes or can include a variety of elements. A display element, a display device, a light-emitting element, or a light-emitting device includes, for example, at least one of an electroluminescence (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light by current), a plasma display panel (PDP), an electron emitter, a display element including a carbon nanotube, a liquid crystal element, electronic ink, an electrowetting element, an electrophoretic element, a display element using micro electro mechanical systems (MEMS) (e.g., grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, and a piezoelectric ceramic display), and quantum dots. Other than the above, the display element, display device, light-emitting element, or light-emitting device may include display media whose contrast, luminance, reflectivity, transmittance, or the like is changed by electrical or magnetic effect. Examples of display devices including EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. Examples of display devices including quantum dots in pixels include a quantum dot display. Note that quantum dots may be provided in part of a backlight instead of being used as a display element. The use of quantum dots enables display with high color purity. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided below the reflective electrodes, which leads to lower power consumption. Note that in the case where an LED chip is used, graphene or graphite may be provided below an LED chip electrode or a nitride semiconductor. Graphene or graphite may be a multi-layer film formed by overlap of a plurality of layers. When graphene or graphite is provided in this manner, a nitride semiconductor, for example, an n-type GaN semiconductor layer including crystals can be easily formed thereover. The LED chip can be formed by providing, for example, a p-type GaN semiconductor layer including crystals thereover. An AlN layer may be provided between graphene or graphite and the n-type GaN semiconductor layer including crystals. The GaN semiconductor layer included in the LED chip may be formed by MOCVD. Note that when graphene is provided, the GaN semiconductor layer included in the LED chip can be formed by sputtering. In a display element using micro electro mechanical systems (MEMS), a drying agent may be provided in a space where the display element is sealed (e.g., a space between an element substrate provided with the display element and a counter substrate facing the element substrate). The drying agent can prevent malfunction and deterioration of the MEMS or the like due to moisture.

Embodiment 8

In this embodiment, the structure of an oxide semiconductor film that can be used for the oxide semiconductor transistor described in the above embodiment will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a single crystal oxide semiconductor film and a non-single-crystal oxide semiconductor film. Alternatively, an oxide semiconductor is classified into a crystalline oxide semiconductor and an amorphous oxide semiconductor, for example.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. Examples of the crystalline oxide semiconductor include a single crystal oxide semiconductor, a CAAC-OS, a polycrystalline oxide semiconductor, and a microcrystalline oxide semiconductor.

First, a CAAC-OS film will be described.

A CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in the direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or the top surface of the CAAC-OS film, and is arranged parallel to the formation surface or the top surface of the CAAC-OS film.

On the other hand, according to the plan high-resolution TEM image of the CAAC-OS film observed in the direction substantially perpendicular to the sample surface, metal atoms are arranged in a triangular or hexagonal arrangement in the crystal parts. However, there is no regularity of arrangement of metal atoms between different crystal parts.

For example, when the structure of a CAAC-OS film including an $InGaZnO_4$ crystal is analyzed by an out-of-plane method using an X-ray diffraction (XRD) apparatus, a peak may appear at a diffraction angle (2® of around 31°. This peak is derived from the (009) plane of the $InGaZnO_4$ crystal, which indicates that crystals in the CAAC-OS film have c-axis alignment, and that the c-axes are aligned in the direction substantially perpendicular to the formation surface or the top surface of the CAAC-OS film.

Note that in analysis of the CAAC-OS film including an $InGaZnO_4$ crystal by an out-of-plane method, another peak may appear when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film with low impurity concentration. The impurity is an element other than the main components of the oxide semiconductor film, such as hydrogen, carbon, silicon, or a transition metal element. In particular, an element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein, for example.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

Note that in this specification and the like, the carrier density of a substantially intrinsic oxide semiconductor film is higher than or equal to $1\times10^{-9}/cm^3$ and lower than $8\times10^{11}/cm^3$, preferably lower than $1\times10^{11}/cm^3$, more preferably lower than $1\times10^{10}/cm^3$. With a highly purified intrinsic oxide semiconductor film, the transistor can have stable electric characteristics.

With the use of the CAAC-OS film in a transistor, variation in the electrical characteristics of the transistor due to irradiation with visible light or ultraviolet light is small.

Next, a microcrystalline oxide semiconductor will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. An oxide semiconductor film including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not ordered. Accordingly, the nc-OS film cannot be distinguished from an amorphous oxide semiconductor film, depending on an analysis method. For example, when the nc-OS film is subjected to structural analysis by an out-of-plane method with an XRD apparatus using an X-ray having a diameter larger than the diameter of a crystal part, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the diameter of a crystal part (the electron diffraction is also referred to as selected-area electron diffraction). Meanwhile, spots appear in a nanobeam electron diffraction pattern of the nc-OS film when an electron beam having a probe diameter close to or smaller than the diameter of a crystal part is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film will be described.

The amorphous oxide semiconductor film is an oxide semiconductor film having disordered atomic arrangement and no crystal part and exemplified by an oxide semiconductor film that exists in an amorphous state, such as quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak that shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is sometimes found. In contrast, in the nc-OS film that has good quality, crystallization hardly occurs by a slight amount of electron beam used for TEM observation.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the InGaZnO$_4$ crystal.

Furthermore, the density of an oxide semiconductor film depends on the structure in some cases. For example, when the composition of an oxide semiconductor film is determined, the structure of the oxide semiconductor film can be expected by comparing the density of the oxide semiconductor film with the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor film having a density of lower than 78% of the density of the single crystal oxide semiconductor film.

Specific examples of the above description will be given. For example, in the case of an oxide semiconductor film having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor film having an atomic ratio of In:Ga:Zn=1:1:1, the density of the a-like OS film is higher than or equal to 5.0 g/cm$^3$ and lower than 5.9 g/cm$^3$. For example, in the case of the oxide semiconductor film having an atomic ratio of In:Ga:Zn=1:1:1, the density of each of the nc-OS film and the CAAC-OS film is higher than or equal to 5.9 g/cm$^3$ and lower than 6.3 g/cm$^3$.

Note that there is a possibility that an oxide semiconductor film having a certain composition cannot exist in a single crystal structure. In that case, single crystal oxide semiconductor films with different compositions are combined at an adequate ratio, which makes it possible to calculate density equivalent to that of a single crystal oxide semiconductor film with the desired composition. The density of a single crystal oxide semiconductor film having the desired composition can be calculated using a weighted average according to the combination ratio of the single crystal oxide semiconductor films with different compositions. Note that it is preferable to use as few kinds of single crystal oxide semiconductor films as possible to calculate the density.

Note that an oxide semiconductor film may be a stack including two or more of an amorphous oxide semiconductor film, an a-like OS film, a microcrystalline oxide semiconductor film, and a CAAC-OS film, for example.

Example 1

As described in the above embodiments, a transistor including an oxide semiconductor in a channel formation region (hereinafter sometimes referred to as "OS transistor") has an extremely low off-state current. In this example, the circuit MC1 shown in FIG. 2 was fabricated to confirm that the off-state current of the OS transistor is extremely low and can be expressed by Formula (2) given by the above-mentioned stretched exponential function.

The circuit MC1 shown in FIG. 2 was fabricated and the off-state current of the transistor M0 was measured by the method described in Embodiment 2.

The transistors M1 to M3 and the inverter INV were formed on an SOI substrate.

As the transistor M0, the OS transistor illustrated in FIGS. 11A to 11D was used.

For the semiconductors 661 to 663 in FIGS. 11A to 11D, oxide semiconductors formed by a sputtering method were used.

The semiconductor 661 was formed using an In—Ga—Zn oxide with a thickness of 40 nm. The semiconductor 661 was formed by a DC sputtering method using a target of an In—Ga—Zn oxide containing In, Ga, and Zn at an atomic ratio of 1:3:4. The sputtering method was performed at a substrate temperature of 200° C. in a mixed gas of argon and oxygen. After the formation of the semiconductor 661, oxygen was introduced into the semiconductor 661 by an ion implantation method.

The semiconductor 662 was formed using an In—Ga—Zn oxide with a thickness of 20 nm. The semiconductor 662 was formed by a DC sputtering method using a target of an In—Ga—Zn oxide containing In, Ga, and Zn at an atomic ratio of 1:1:1. The sputtering method was performed at a substrate temperature of 300° C. in a mixed gas of argon and oxygen. The semiconductor 662 was formed using the CAAC-OS film described in Embodiment 8.

The semiconductor 663 was formed using gallium oxide with a thickness of 5 nm. The semiconductor 663 was formed by an RF sputtering method using a gallium oxide target.

A silicon oxynitride film formed by a PECVD method was used as the insulating film 652.

A 10-nm-thick silicon oxynitride film was formed as the insulating film 653 by a plasma-enhanced CVD (PECVD) method.

After the semiconductors 661 and 662 were formed, heat treatment at 550° C. was performed in a nitrogen atmosphere for one hour and in an oxygen atmosphere for one hour.

The L/W (channel length/channel width) of the transistors M0 to M3 was 0.35 μm/0.35 μm.

Figure 22:
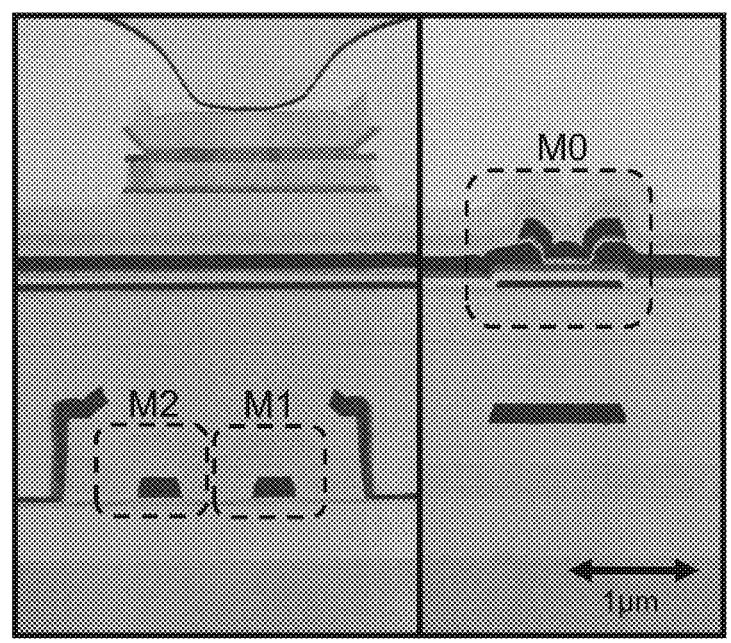
FIG. 22 shows a cross-sectional STEM image of a prototype circuit.

FIG. 22 shows a cross-sectional scanning transmission electron microscope (STEM) image of the prototype circuit MC1. The transistors M1 and M2 were formed on the SOI substrate and the transistor M0 was formed above the transistors M1 and M2.

Figure 23:
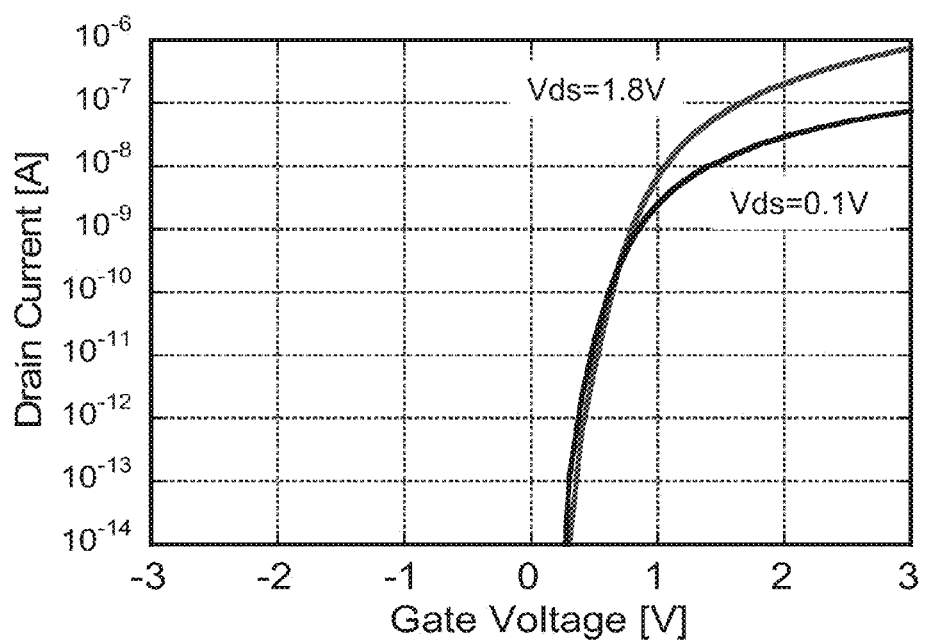
FIG. 23 shows $V_g$–$I_d$ characteristics of a prototype transistor.

FIG. 23 shows $V_g$-$I_d$ (gate voltage–drain current) characteristics of a transistor that was fabricated through the same process as the transistor M0. The transistor whose measurement results are shown in FIG. 23 had L/W of 0.35 μm/0.35 μm, and the drain voltage ($V_{ds}$) was 0.1 V and 1.8 V.

The transistor whose measurement results are shown in FIG. 23 had a field-effect mobility ($μ_{FE}$) of 2.5 cm$^2$/Vs, a threshold voltage ($V_g$ when $I_d$=1 pA) of 0.4 V, and a subthreshold swing of 129 mV/dec.

Next, a voltage drop in the node FN after 1-bit data was supplied to the node FN (data retention characteristics in the node FN) was measured by the method described in Embodiment 2. Note that in FIG. 2 and FIG. 3, the potentials were set as follows: $V_{DD}$=1.2 V, $V_{ON}$=3.3 V, $V_{BL}$=1.8 V, and $V_{SL}$=2.6 V. The measurement was performed with the potential $V_{OFF}$ set to −0.5 V and −1.0 V.

The capacitance of the capacitor Cs was 20 fF, and the measurement was performed using SoC Test System (T2000) produced by ADVANTEST CORPORATION.

Figure 24:
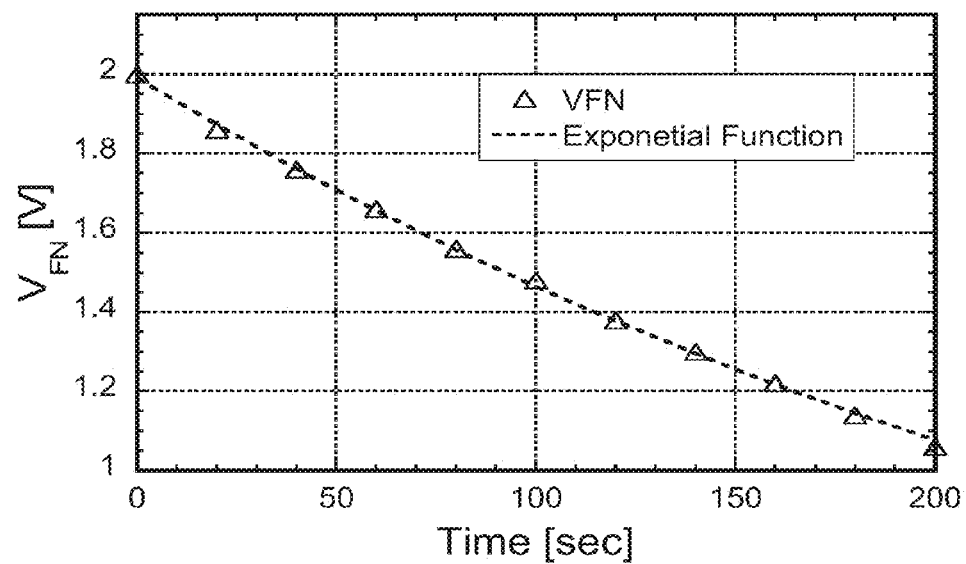
FIG. 24 is a graph showing change in a potential $V_{FN}$ of a retention node of a prototype circuit over time.

FIG. 24 shows the results of measuring a voltage drop in the node FN when the potential $V_{OFF}$ was −0.5 V. In FIG. 24, the vertical axis represents the potential ($V_{FN}$) of the node FN and the horizontal axis represents measurement time (elapsed time after the node FN was brought into an electrically floating state). The measurement time was 300 seconds and the measurement temperature was 125° C.

It was confirmed that the graph of the potential $V_{FN}$ shown in the FIG. 24 can be approximated by an exponential function represented by Formula (6) below (see the dotted line in the graph). In Formula (6), τ is relaxation time and t corresponds to the elapsed time after the node FN was brought into an electrically floating state. Formula (6) is equivalent to Formula (2) where β=1.

[Formula 6]

$$V_{FN}(t) = V_0 \times e^{-\frac{t}{\tau}} \quad (6)$$

Figure 25:
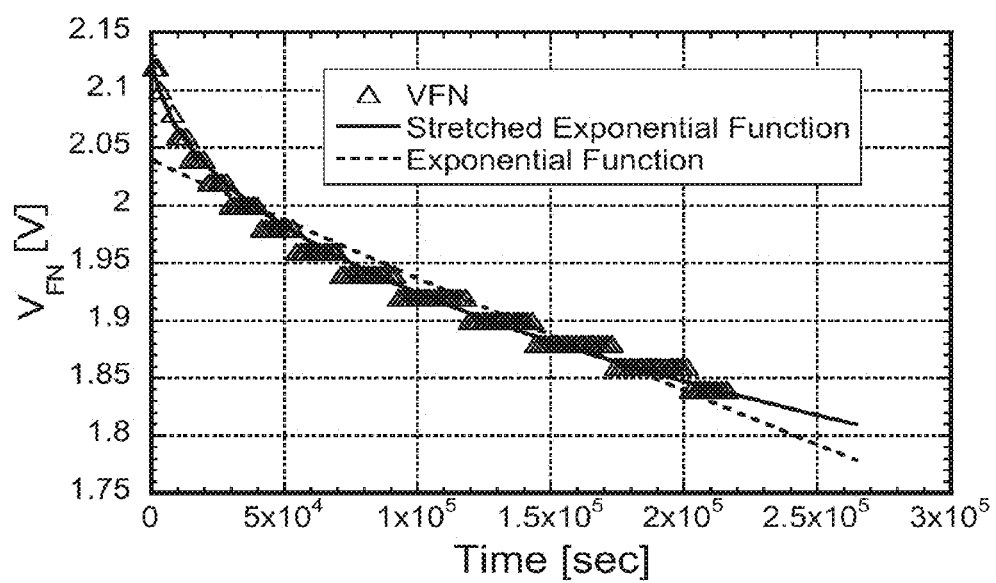
FIG. 25 is a graph showing change in a potential $V_{FN}$ of a retention node of a prototype circuit over time, a stretched exponential function, and an exponential function.

FIG. 25 shows the results of measuring a voltage drop in the node FN when the potential $V_{OFF}$ was −1.0 V. As in FIG. 24, the vertical axis represents the potential $V_{FN}$ and the horizontal axis represents measurement time (elapsed time after the node FN was brought into an electrically floating state). The measurement time was 216000 seconds and the measurement temperature was 125° C.

In FIG. 25, the solid line shows the results obtained when fitting was performed using the stretched exponential function represented by Formula (2), and the dotted line shows the results obtained when fitting was performed using the exponential function represented by Formula (6). Here, more accurate approximation to the measurement data was achieved with the stretched exponential function.

Figure 26:
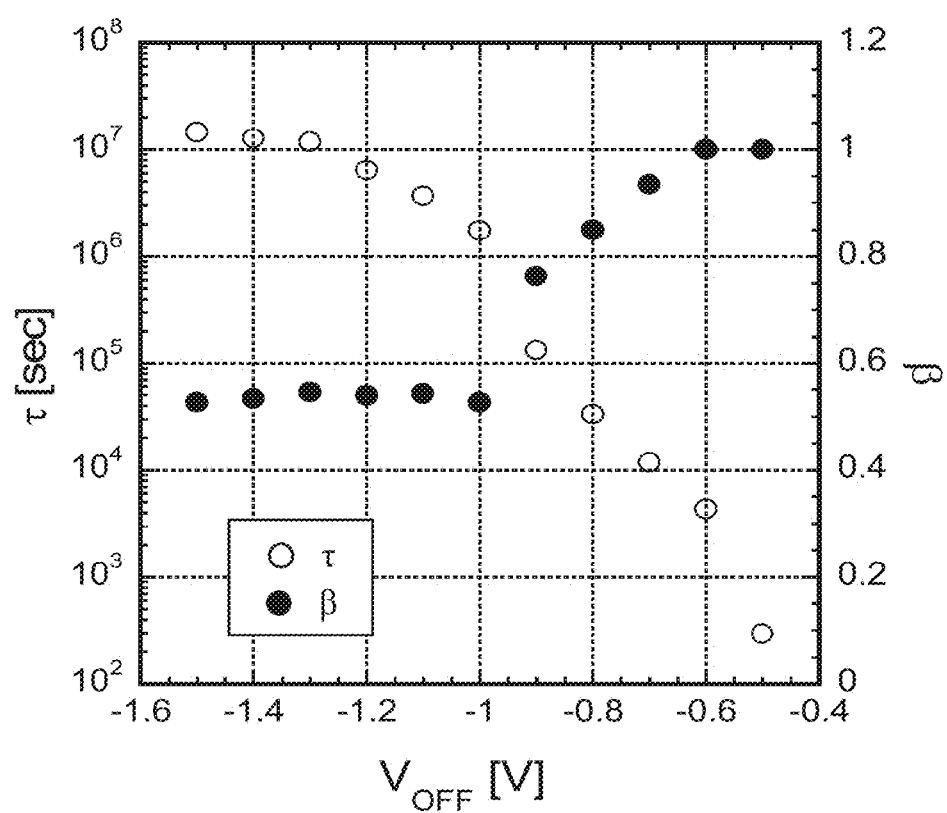
FIG. 26 is a graph showing τ and β of a stretched exponential function as a function of a potential $V_{OFF}$ in a prototype circuit.

FIG. 26 shows the values of τ and β obtained by fitting the potential $V_{FN}$ with the stretched exponential function represented by Formula (2). The left vertical axis represents ti, the right vertical axis represents β, and the horizontal axis represents the potential $V_{OFF}$. The fitting was performed such that the sum of squares of a difference between the measurement data and an approximate expression becomes minimum. The measurement was performed on the eight circuits MC1 that were formed using one substrate, and their average values are shown in FIG. 26. Note that in FIG. 26, the measurement time was 3600 seconds and the measurement temperature was 150° C.

A larger τ means a smaller amount of electric charge leaking from the node FN. In other words, a larger τ means a lower off-state current of the thetransistor M0. In contrast, a smaller τ means a higher off-state current of the thetransistor M0. As becomes closer to 1, the potential $V_{FN}$ can be better expressed using the exponential function. In contrast, as β becomes closer to 0.5, the potential $V_{FN}$ can be better expressed using the stretched exponential function.

From FIG. 26, it can be seen that τ increases as the potential $V_{OFF}$ decreases, and τ decreases as the potential $V_{OFF}$ increases. Furthermore, becomes closer to 1 as the potential $V_{OFF}$ increases and is approximately 0.5 when the potential $V_{OFF}$ is −1 V or lower.

Figure 27:
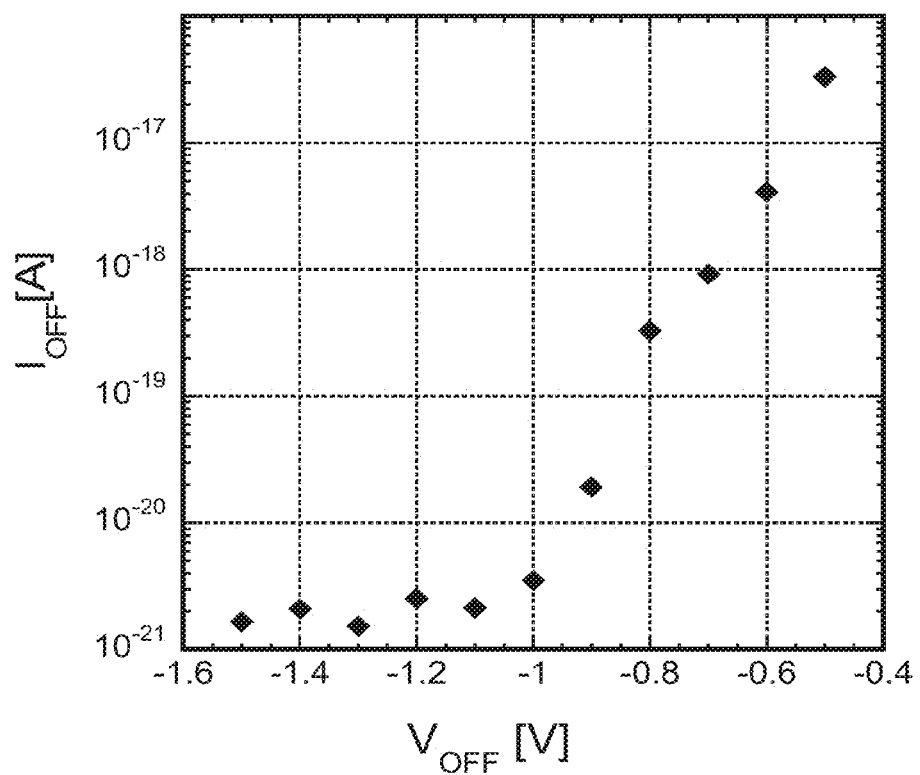
FIG. 27 is a graph showing a current $I_{OFF}$ as a function of a potential $V_{OFF}$ in a prototype circuit.

FIG. 27 shows the off-state current (current $I_{OFF}$) of the transistor M0 calculated using Formula (5) and τ and β shown in FIG. 26. The vertical axis represents the current $I_{OFF}$ and the horizontal axis represents the potential $V_{OFF}$. From FIG. 27, it can be found that a higher potential $V_{OFF}$ leads to a higher current $I_{OFF}$ and a lower potential $V_{OFF}$ leads to a lower current $I_{OFF}$.

The results in FIG. 26 and FIG. 27 show that τ is large when the off-state current of the transistor M0 is low, and the potential $V_{FN}$ is preferably approximated by the stretched exponential function. It is also shown that τ is small when the off-state current of the transistor M0 is high, and the potential $V_{FN}$ is preferably approximated by the exponential function.

As seen from the results in FIG. 26 and FIG. 27, the current $I_{OFF}$ is only approximately 10$^{-21}$ A when the potential $V_{OFF}$ is −1 V or lower. At that time, β is approximately 0.5, and τ is greater than or equal to 1×10$^6$ seconds and less than or equal to 1×10$^8$ seconds.

That is, when the transistor M0 is off and the off-state current is low, β is greater than or equal to 0.3 and less than or equal to 0.7, preferably greater than or equal to 0.4 and less than or equal to 0.6.

In a similar manner, when the transistor M0 is off and the off-state current is low, τ is greater than or equal to 1×10$^6$ seconds and less than or equal to 1×10$^8$ seconds.

Figure 28:
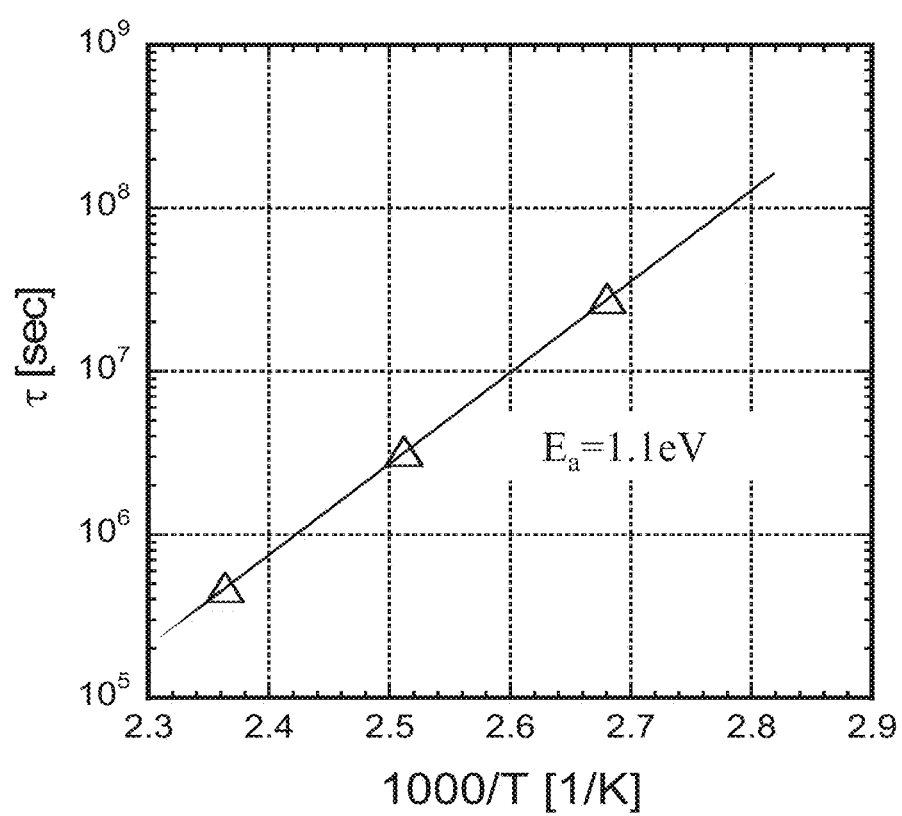
FIG. 28 is a graph showing an Arrhenius plot of τ of a stretched exponential function in a prototype circuit.

FIG. 28 shows an Arrhenius plot of τ that was obtained using the stretched exponential function. In FIG. 28, the potential $V_{OFF}$ is −1.0 V and the measurement time was 1 hour at 150° C., 6 hours at 125° C., and 24 hours at 100° C.

A straight line can be formed by connecting the values as shown in FIG. 28, which means that τ follows the Arrhenius equation (Formula (7)). In Formula (7), k is a rate constant, A is a constant independent of temperatures, $E_a$ is activation energy, $k_B$ is the Boltzmann constant, and T is a temperature.

[Formula 7]

$$k = A\exp\left(-\frac{E_a}{k_B T}\right) \quad (7)$$

From the results in FIG. 28, the activation energy is 1.1 eV. Furthermore, τ extrapolated from the straight line in the graph was found to be greater than or equal to 1×10$^7$ seconds and less than or equal to $1\times10^{10}$ seconds, or greater than or equal to $1\times10^{8}$ seconds and less than or equal to $1\times10^{9}$ seconds at 85° C.

Example 2

In this example, a circuit MC1 was fabricated with the use of the transistor M0 where L was 100 nm or less to confirm that the off-state current of a minute OS transistor is extremely low and is represented by Formula (2) given by the above-mentioned stretched exponential function.

As in Example 1, the transistors M1 to M3 and the inverter INV were formed on an SOI substrate.

As the transistor M0, the OS transistor illustrated in FIGS. 11A to 11D was used. For the semiconductors 661 to 663 in FIGS. 11A to 11D, oxide semiconductors formed by a sputtering method were used.

The semiconductor 661 was formed using an In—Ga—Zn oxide with a thickness of 20 nm. The semiconductor 661 was formed by a DC sputtering method using a target of an In—Ga—Zn oxide containing In, Ga, and Zn at an atomic ratio of 1:3:4. The sputtering method was performed at a substrate temperature of 200° C. in a mixed gas of argon and oxygen.

The semiconductor 662 was formed using an In—Ga—Zn oxide with a thickness of 15 nm. The semiconductor 662 was formed by a DC sputtering method using a target of an In—Ga—Zn oxide containing In, Ga, and Zn at an atomic ratio of 1:1:1. The sputtering method was performed at a substrate temperature of 300° C. in a mixed gas of argon and oxygen. The semiconductor 662 was formed using the CAAC-OS film described in Embodiment 8.

The semiconductor 663 was formed using an In—Ga—Zn oxide with a thickness of 5 nm. The semiconductor 663 was formed by a DC sputtering method using a target of an In—Ga—Zn oxide containing In, Ga, and Zn at an atomic ratio of 1:3:2. The sputtering method was performed at a substrate temperature of 200° C. in a mixed gas of argon and oxygen.

A silicon oxynitride film formed by a PECVD method was used as the insulating film 652. After the insulating film 652 was formed, oxygen was introduced to the insulating film 652 by an ion implantation method.

A 10-nm-thick silicon oxynitride film was formed as the insulating film 653 by a PECVD method.

After the semiconductors 661 and 662 were formed, heat treatment at 450° C. was performed in a nitrogen atmosphere for one hour and in an oxygen atmosphere for one hour.

As in Example 1, the L/W (channel length/channel width) of the transistors M1 to M3 was 0.35 μm/0.35 μm.

Figure 29A:
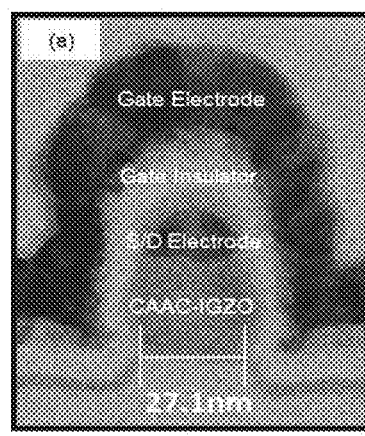
FIGS. 29A and 29B show cross-sectional STEM images of a prototype transistor.
Figure 29B:
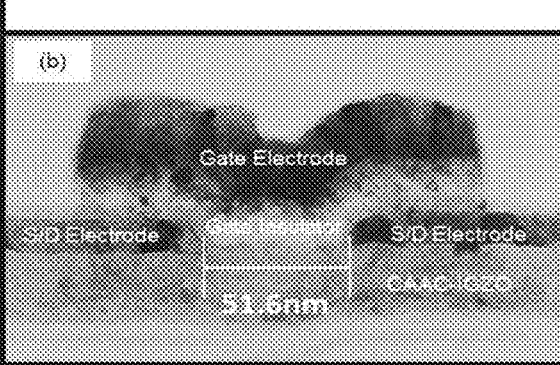

FIGS. 29A and 29B show cross-sectional STEM images of the prototype transistor M0. FIG. 29A is a cross-sectional image of the transistor M0 in the channel width direction, and FIG. 29B is a cross-sectional image of the transistor M0 in the channel length direction. FIGS. 29A and 29B show that a minute transistor whose channel length was approximately 50 nm and whose channel width was approximately 30 nm was fabricated.

Figure 30:
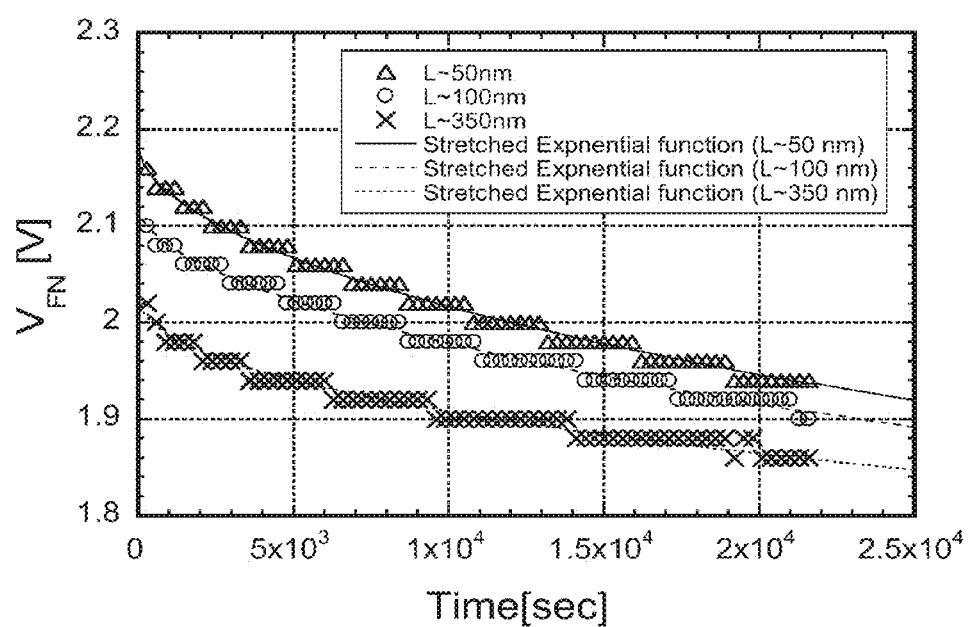
FIG. 30 is a graph showing change in a potential $V_{FN}$ of a retention node of a prototype circuit over time and a stretched exponential function.

Similarly to FIG. 25, FIG. 30 shows measurement results of a voltage drop in the node FN. The measurement was performed on the circuit MC1 in which the transistor M0 had a channel length of 50 nm, that in which the transistor M0 had a channel length of 100 nm, and that in which the transistor M0 had a channel length of 350 nm. The measurement time was 21600 seconds, the measurement temperature was 125° C., and the potential $V_{OFF}$ was −1.0 V.

FIG. 30 also shows measurement data fitted using the stretched exponential function.

The results in FIG. 30 show that the voltage drop in the node FN follows the stretched exponential function even when the channel length is 100 nm or less. In other words, the off-state current of an OS transistor whose channel length is 100 nm or less can also be measured using the stretched exponential function.

Example 3

In this example, the OS transistor illustrated in FIGS. 11A to 11D was fabricated and subjected to a drain bias temperature stress (DBTS) test and off-state current measurement. The prototype OS transistor had high resistance to DBTS and a low off-state current.

In the prototype OS transistor, the semiconductor 661 illustrated in FIGS. 11A to 11D was formed using an In—Ga—Zn oxide with a thickness of 40 nm. The semiconductor 661 was formed by a DC sputtering method using a target of an In—Ga—Zn oxide containing In, Ga, and Zn at an atomic ratio of 1:3:4. The sputtering method was performed at a substrate temperature of 200° C. in a mixed gas of argon and oxygen.

The semiconductor 662 was formed using an In—Ga—Zn oxide with a thickness of 20 nm. The semiconductor 662 was formed by a DC sputtering method using a target of an In—Ga—Zn oxide containing In, Ga, and Zn at an atomic ratio of 1:1:1. The sputtering method was performed at a substrate temperature of 300° C. in a mixed gas of argon and oxygen. The semiconductor 662 was formed using the CAAC-OS film described in Embodiment 8.

After the semiconductors 661 and 662 were formed, heat treatment at 550° C. was performed in a nitrogen atmosphere for one hour and in an oxygen atmosphere for one hour.

The semiconductor 663 was formed using an In—Ga—Zn oxide with a thickness of 5 nm. The semiconductor 663 was formed by a DC sputtering method using a target of an In—Ga—Zn oxide containing In, Ga, and Zn at an atomic ratio of 1:3:2. The sputtering method was performed at a substrate temperature of 200° C. in a mixed gas of argon and oxygen.

For other details about the prototype OS transistor, the description of the prototype transistor M0 in Example 1 can be referred to.

Figure 31:
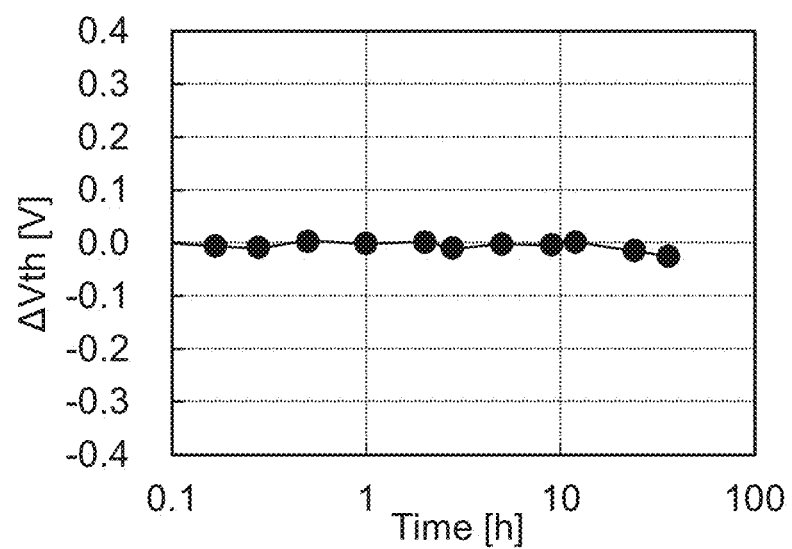
FIG. 31 is a graph showing results of a +DBTS test for a prototype transistor.

FIG. 31 shows the DBTS test results of the prototype OS transistor. FIG. 31 shows change in the threshold voltage ($\Delta V_{th}$) of the OS transistor at 150° C. when $V_{gs}=0$ V and $V_{ds}=1.8$ V. Furthermore, the L/W of the evaluated OS transistor was 0.18 μm/0.35 μm.

As can be seen in FIG. 31, $\Delta V_{th}$ of the prototype OS transistor was only approximately −0.01 V to +0.01 V even after 10 hours elapsed.

Figure 32:
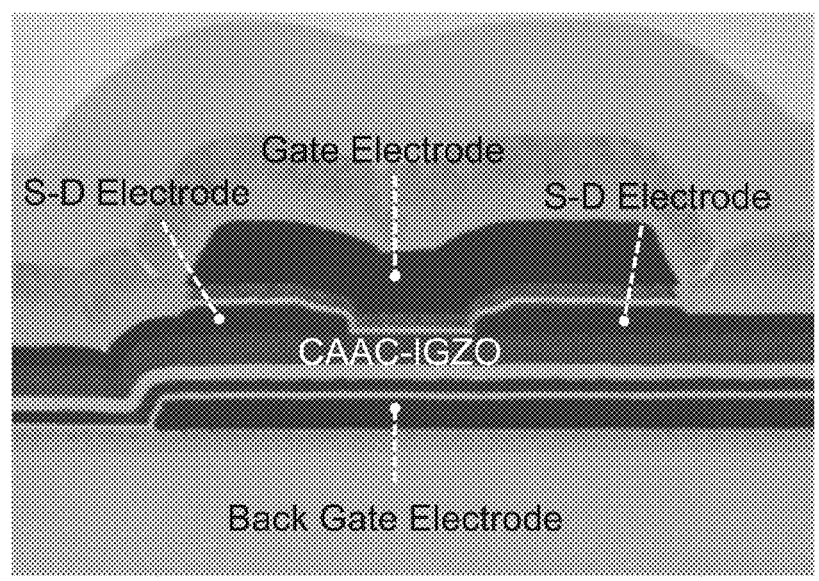
FIG. 32 shows a cross-sectional STEM image of a prototype transistor.

FIG. 32 shows a cross-sectional STEM image of the prototype OS transistor.

Figure 33:
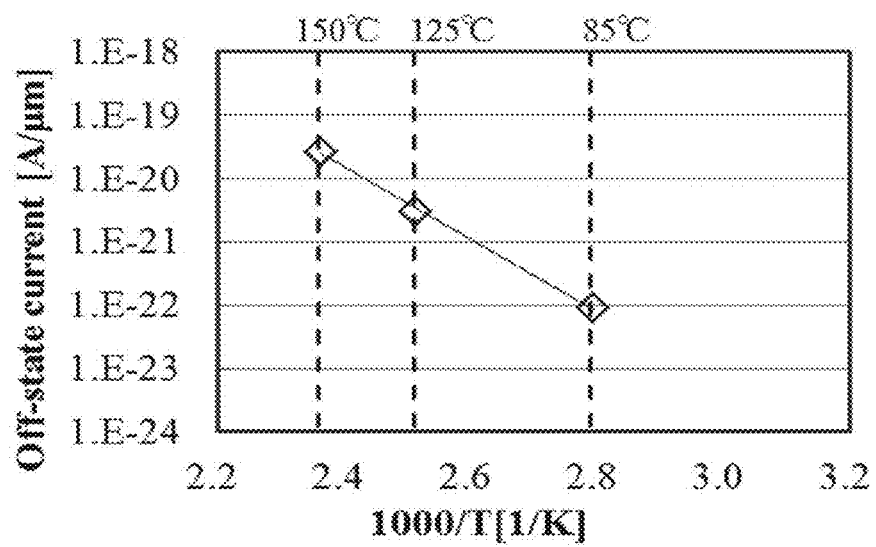
FIG. 33 is a graph showing an off-state current of a prototype transistor.

FIG. 33 shows measurement results of the off-state current of the prototype OS transistor. It was observed that the off-state current of the OS transistor was as low as $90\times10^{-24}$ A/μm at 85° C.

Example 4

In this example, a memory device including the memory cell 10a in FIG. 6 was fabricated. The data retention characteristics of the prototype memory device were examined to confirm that data can be retained for 10 years or longer at 85° C.

Figure 34:
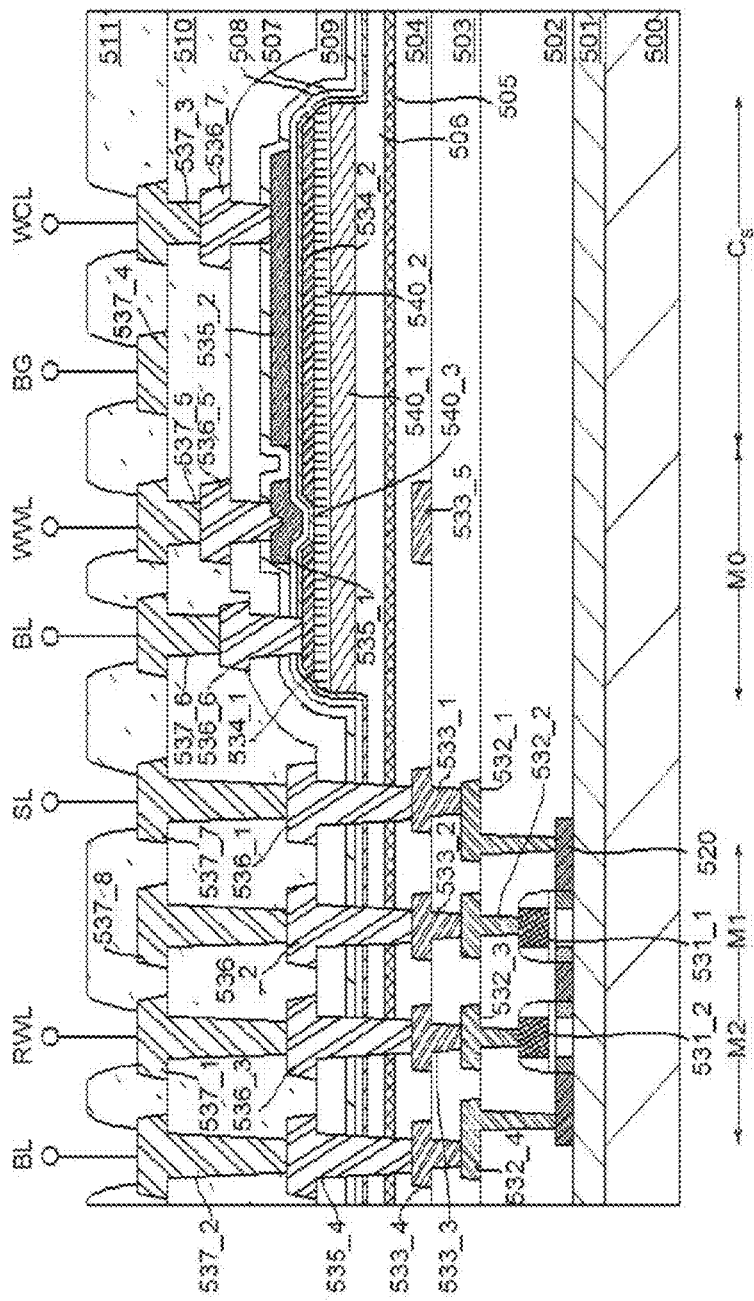
FIG. 34 is a cross-sectional view illustrating a device structure of a prototype circuit.

FIG. 34 illustrates a device structure of the prototype memory cell 10a. FIG. 34 is a cross-sectional view of the memory cell 10a for easy understanding of the layered structure, the connection, and the like, and is not a cross-sectional view taken along a specific line.

The transistors M1 and M2 are planar transistors and are formed on an SOI semiconductor substrate. Reference numerals 500 and 501 designate a single crystal silicon wafer and a silicon oxide layer, respectively. Channel regions, source regions, and drain regions of the transistors M1 and M2 are in one single crystal silicon layer 520.

The transistor M0 and the capacitor Cs are formed above the transistors M1 and M2. The prototype memory cell 10a includes insulating films 502 to 511 and seven wiring tiers. The transistors (M0, M1, and M2) and the capacitor Cs are electrically connected to each other as illustrated in FIG. 6 by conductive layers provided in first to seventh wiring tires.

Conductive layers 531_1 and 531_2 are formed in the first wiring tier. Conductive layers 532_1 to 532_4 are formed in the second wiring tier. Conductive layers 533_1 to 533_5 are formed in the third wiring tier. Conductive layers 534_1 and 534_2 are formed in the fourth wiring tier. Conductive layers 535_1 and 535_2 are formed in the fifth wiring tier. Conductive layers 536_1 to 536_7 are formed in the sixth wiring tier. Conductive layers 537_1 to 537_8 are formed in the seventh wiring tier. The conductive layers 537_1, 537_2, 537_3, 537_4, 537_5, 537_7, and 537_8 have portions that serve as wirings WCL, BG, WWL, BL, SL, RWL, and BL, respectively.

In this example, the transistors M1 and M2 were silicon transistors and the transistor M0 was an OS transistor including a CAAC-OS.

The transistor M0 has a structure similar to that of the OS transistor illustrated in FIGS. 11A to 11D, and has an s-channel structure. A semiconductor of the transistor M0 consists of three semiconductor layers 540_1 to 540_3. For details about the semiconductor layers 540_1 to 540_3, description of the semiconductors 661 to 663 in Example 1 can be referred to.

The capacitor Cs is an MIM capacitor and is formed of the conductive layer 534_2, the semiconductor layer 540_3, the insulating film 507, and the conductive layer 535_2. The conductive layer 535_2 includes the node FN.

The conductive layers 534_1 and 534_2 are each formed of a stack including titanium nitride and tungsten. The conductive layers 535_1 and 535_2 are each formed using tungsten. The conductive layer 535_2 is electrically connected to the conductive layer 537_6 through the conductor in the sixth wiring tier (not illustrated). With this wiring structure, the capacitor Cs is electrically connected to a gate electrode of the transistor M1.

The insulating film 507 is formed using silicon oxynitride. The insulating films 505 and 508 are each aluminum oxide deposited by a sputtering method to exhibit a blocking effect against oxygen, hydrogen, water, and the like.

The conductive layer 533_1 overlaps with a channel of the transistor M0 and serves as a back gate. The insulating film 504 is formed using silicon oxide and the insulating film 505 is formed using silicon oxynitride. The conductive layer 533_1 is electrically connected to the conductive layer 537_2 by conductive layers (not illustrated) in the fifth and sixth wiring tiers.

Figure 35:
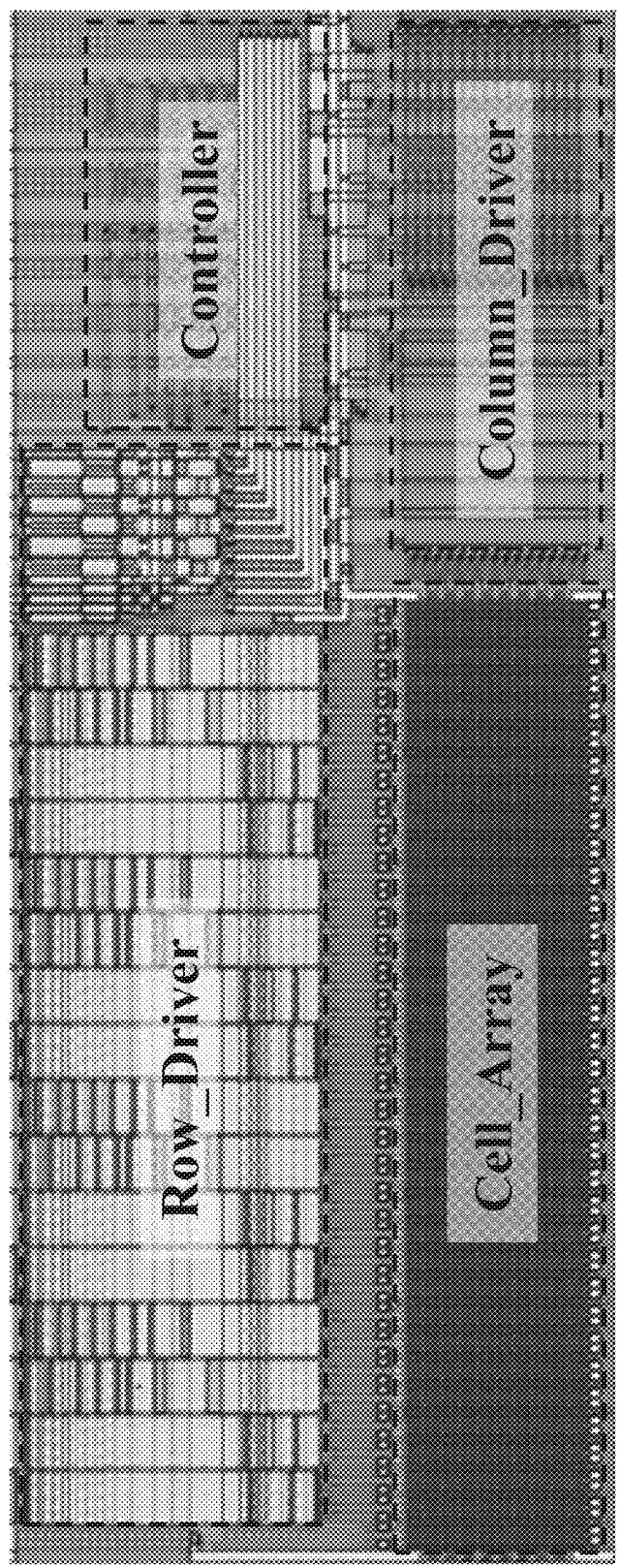
FIG. 35 shows an optical micrograph of a prototype circuit.

FIG. 35 is an optical micrograph of the prototype memory device. The memory device shown in FIG. 35 mainly consists of a controller, a column driver, a row driver, and a memory cell array.

Table 1 lists the main specifications of the prototype memory device. The memory device has a module size of 1.1×0.5 mm$^2$ and a capacity of 1040 bits.

TABLE 1

| CAAC-OS memory | Technology | CAAC-OS FET | 0.8 μm |
|---|---|---|---|
| | | Si FET | 0.35 μm |
| | Voltage | CAAC-OS FET | 3.3 V/−5 V |
| | | Si FET | 1.8 V/1.2 V |
| | Module Area | | 1.1 × 0.5 mm$^2$ |
| | Cell area | | 8.0 × 8.2 μm$^2$ |
| | Capacitance | | 20.6 fF |
| | Number of bits | | 1040 bit |

Figure 36:
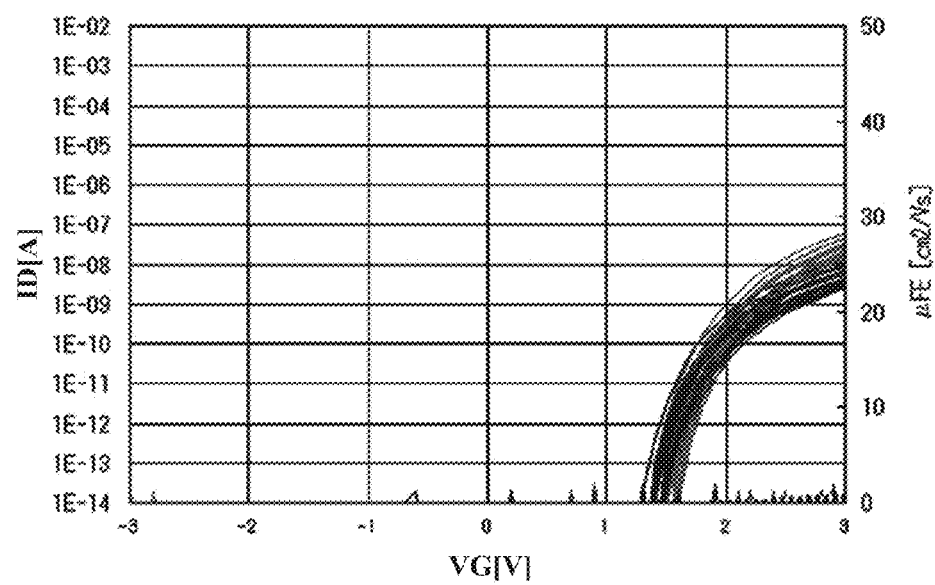
FIG. 36 shows $V_g$–$I_d$ characteristics of a prototype transistor.

FIG. 36 shows the $V_g$-$I_d$ characteristics of the transistor M0 when the wiring BG was supplied with −5 V. The drain voltage ($V_{ds}$) was 0.1 V and 1.8 V. In FIG. 36, the characteristics of 25 transistors formed on one substrate are overlaid. From FIG. 36, it was confirmed that the off-state current of the transistor M0 was lower than or equal to the measurement limit.

According to the timing chart in FIG. 7, the memory cell 10a was operated to write and read data. In FIG. 7, the potentials were set as follows: $V_1$=3.3 V, $V_2$=1.8 V, $V_3$=1.2 V, and $V_{BG}$=−5 V.

Figure 37A:
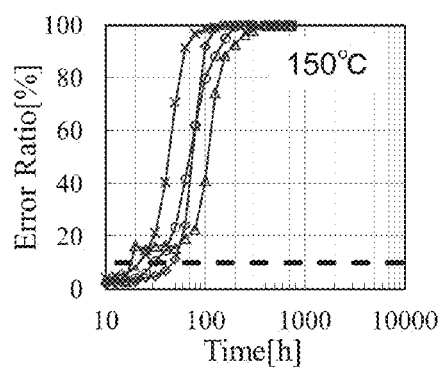
FIGS. 37A to 37D are graphs each showing a bit error ratio as a function of data retention time in a prototype circuit.
Figure 37B:
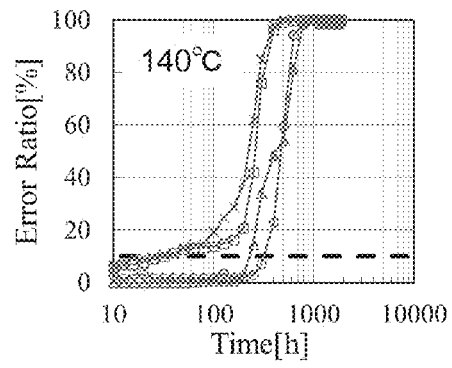
Figure 37C:
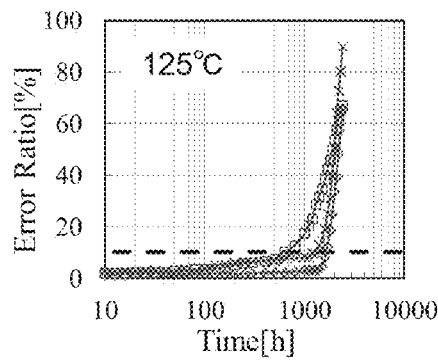
Figure 37D:
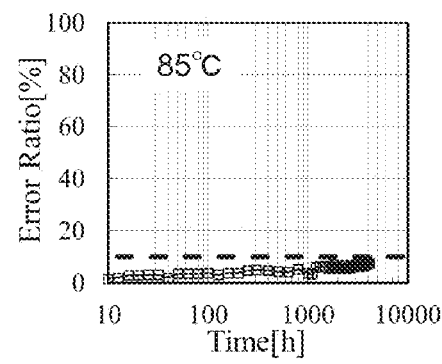

Next, the data retention characteristics of the prototype memory device were examined. Five memory devices were fabricated and subjected to the measurement. FIGS. 37A to 37D show the measurement results. The measurement was performed at 150° C. (FIG. 37A), 140° C. (FIG. 37B), 125° C. (FIG. 37C), and 85° C. (FIG. 37D). The vertical axis of the graph represents an error ratio (the proportion of defective bits in each memory device) and the horizontal axis represents measurement time.

In the case where the time until the bit error ratio exceeds 10% (dotted lines in the graphs) is defined as the data retention time, the average data retention time was 43 hours at 150° C. In a similar manner, the average data retention time was 194 hours at 140° C., 1509 hours at 125° C., and 4000 hours or longer at 85° C.

Figure 38:
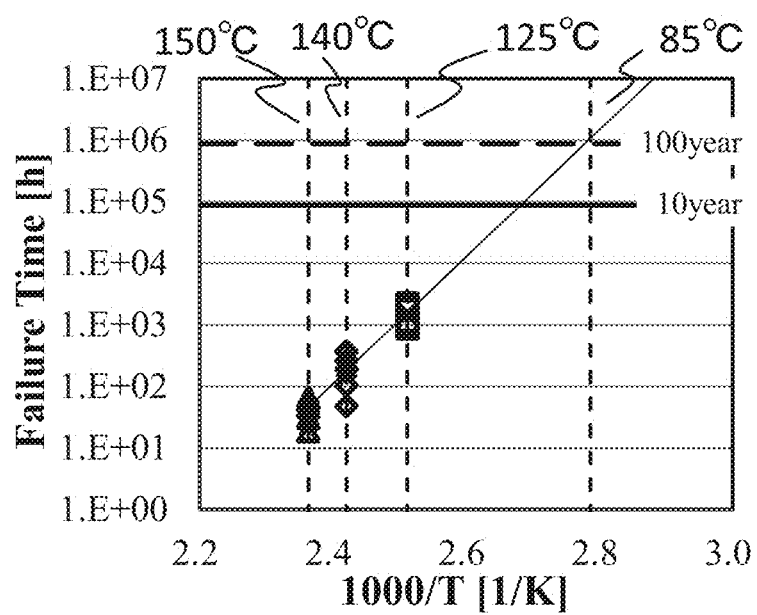
FIG. 38 is a graph showing an Arrhenius plot of data retention time of a prototype circuit.

FIG. 38 shows an Arrhenius plot of the data retention time shown in FIGS. 37A to 37D. A straight line was formed by connecting the average values of the data retention times at the temperatures, which means that FIG. 38 follows the Arrhenius equation. The data retention time at 85° C. extrapolated from the straight line was calculated to be 138 years. It was confirmed that the prototype memory device can retain data for 10 years or longer, or 100 years or longer at 85° C.

As described above, it was found that the memory device of one embodiment of the present invention can retain data for a long time.

Example 5

In this example, a memory device including the memory cell 10a in FIG. 6 was fabricated using a CAAC-OS transistor that was fabricated using L=180 nm technology and Si transistors. The data retention characteristics of the prototype memory device were examined to confirm that data can be retained for 1000 hours or longer at 85° C.

As in Example 4, the memory cell 10a having the device structure illustrated in FIG. 34 was fabricated.

Figure 39:
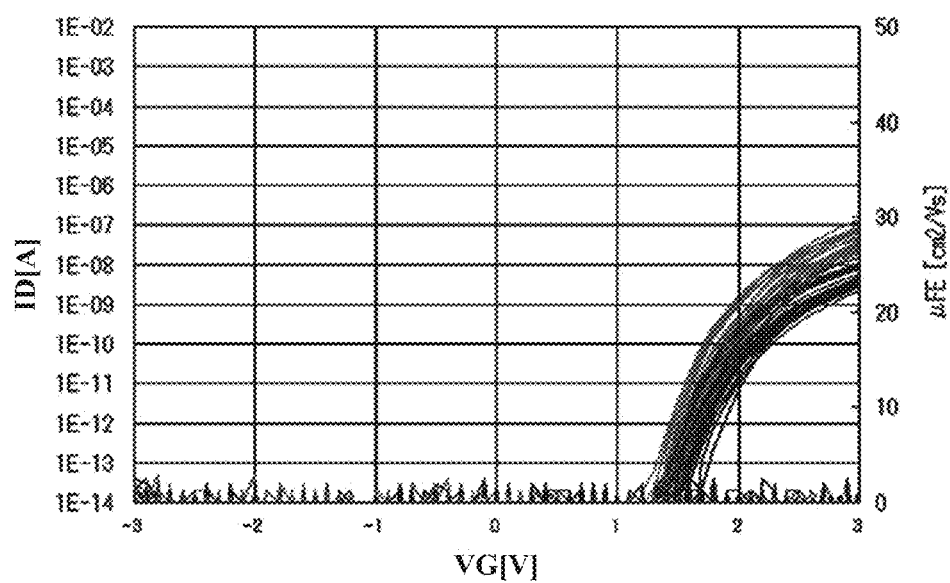
FIG. 39 shows $V_g$–$I_d$ characteristics of a prototype transistor.

FIG. 39 shows the $V_g$-$I_d$ characteristics of the transistor M0 fabricated using L=180 nm technology. The wiring BG was supplied with −5 V and $V_{ds}$ was 0.1 V and 1.8 V. In FIG. 39, the characteristics of 25 transistors formed on one substrate are overlaid.

Figure 40:
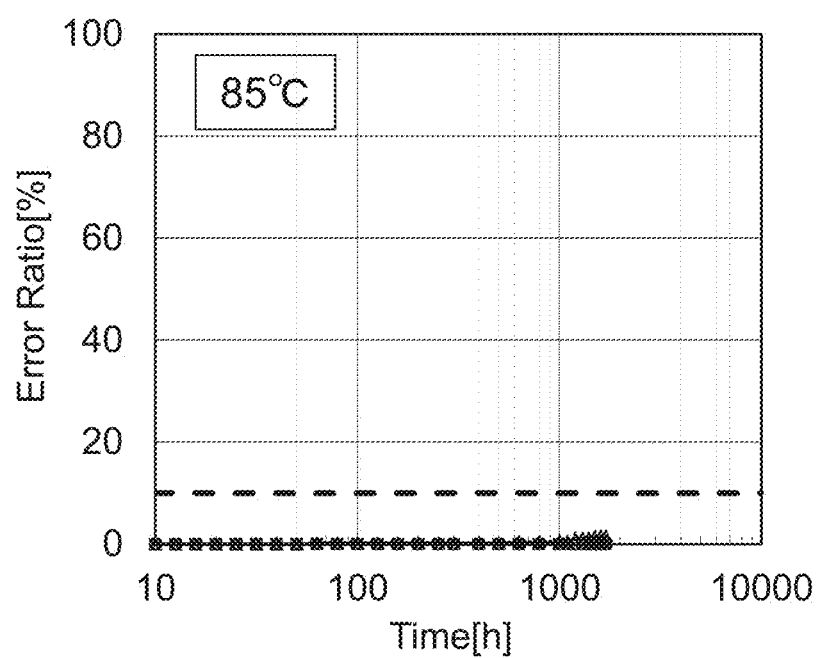
FIG. 40 is a graph showing a bit error ratio as a function of data retention time in a prototype circuit.

FIG. 40 shows measured data retention characteristics of the prototype memory device in this example. The measurement was performed at 85° C. When the time until the bit error ratio exceeds 10% is defined as the data retention time as in the case of FIGS. 37A to 37D, the data retention time of the prototype memory device in this example was found to be 1000 hours or longer.

As described above, it was found that the memory device of one embodiment of the present invention can retain data for a long time.

Example 6

In this example, variation in electrical characteristics of the transistors M0 in a memory device including the memory cells 10a illustrated in FIG. 6 was examined.

FIG. 41A is a circuit diagram of a test element group (TEG) fabricated for examining variation in electrical characteristics of the transistors M0. A cell 11 in FIG. 41A is the memory cell 10a in FIG. 6 which is not provided with the transistors M1 and M2 and the wiring RWL and in which one of the source and the drain of the transistor M0 and the first terminal of the capacitor Cs are connected to the wiring SL.

The cell 11 has a function of writing electric charge from the wiring BL to the capacitor Cs and the wiring SL through the transistor M0.

FIG. 41B is a timing chart of operation of the cell 11. First, the wiring BL is supplied with the potential BL. Then, the wiring SL is brought into an electrically floating state, and then, the wiring WWL is supplied with an H level (potential $V_{WL}$), whereby the transistor M0 is turned on. As a result, the capacitor Cs and the wiring SL are charged from the wiring BL through the transistor M0, so that the potential of the wiring SL increases. After 15 microseconds from the start of the charging, the potential $V_{SL}$ of the wiring SL is read, whereby the characteristics of the transistor M0 can be examined. Note that the wiring WCL and the wiring BG are constantly supplied with the potential GND.

In the cell 11, the characteristics to be examined depend on the level of the potential $V_{WL}$ supplied to the wiring WWL. In the case where the potential $V_{WL}$ is lower than the sum of the potential $V_{BL}$ and $V_{th}$ (the threshold voltage of the transistor M0), i.e., $V_{WL}<V_{BL}\ V_{th}$, the potential $V_{SL}$ is substantially equal to a value obtained by subtracting $V_{th}$ from the potential $V_{WL}$; thus, by measuring the potential $V_{SL}$, the characteristics associated with the threshold voltage of the transistor M0 are determined.

In the case where the potential $V_{WL}$ is higher than the sum of the potential $V_{BL}$ and $V_{th}$, i.e., $V_{WL}>V_{BL}\ V_{th}$, the potential $V_{SL}$ is substantially equal to a value obtained by subtracting $4V_{OS}$ (a voltage drop due to on-state resistance of the transistor M0) from the potential $V_{WL}$; thus, by measuring the potential $V_{SL}$, the characteristics associated with the on-state resistance of the transistor M0 are determined. Note that on-state resistance is resistance generated between the source and the drain when the transistor M0 is turned on.

FIG. 41C is a circuit diagram of the cell array 20 including the cells 11. In the cell array 20, the cells 11 are arranged in a matrix of 512 rows and 64 columns, and all the wirings SL are connected to a circuit 30 (FIG. 41C). The circuit 30 includes a voltage follower circuit and has a function of reading the potentials $V_{SL}$ output from the 32768 (512×64) cells 11 sequentially.

Figure 47:
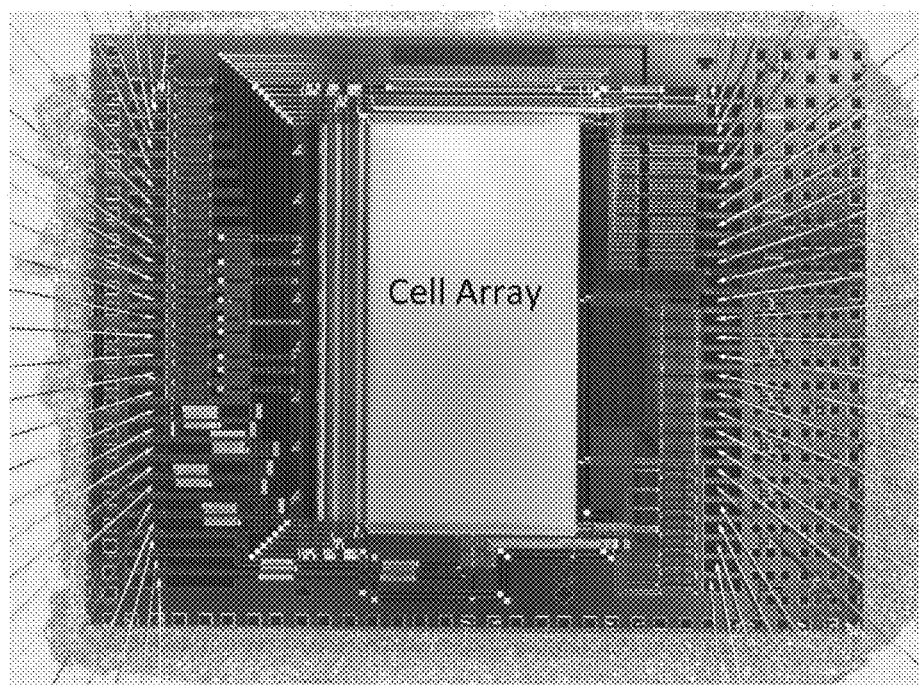
FIG. 47 shows an optical micrograph of a prototype chip.

In this example, the memory device shown in FIG. 47 was fabricated. FIG. 47 is a photograph showing the appearance of a chip including the prototype memory device. The cell array 20 in FIG. 41C was provided in the cell array of the prototype chip.

As illustrated in FIG. 34, the transistor M0 and the capacitor Cs were formed above the transistors M1 and M2 formed on the SOI substrate. As the transistor M0, the OS transistor illustrated in FIGS. 11A to 11D was used.

The semiconductor 661 was formed using an In—Ga—Zn oxide with a thickness of 40 nm. The semiconductor 661 was formed by a DC sputtering method using a target of an In—Ga—Zn oxide containing In, Ga, and Zn at an atomic ratio of 1:3:4. The sputtering method was performed at a substrate temperature of 200° C. in a mixed gas of argon and oxygen.

The semiconductor 662 was formed using an In—Ga—Zn oxide with a thickness of 20 nm. The semiconductor 662 was formed by a DC sputtering method using a target of an In—Ga—Zn oxide containing In, Ga, and Zn at an atomic ratio of 1:1:1. The sputtering method was performed at a substrate temperature of 300° C. in a mixed gas of argon and oxygen. The semiconductor 662 was formed using the CAAC-OS film described in Embodiment 8.

The semiconductor 663 was formed using an In—Ga—Zn oxide with a thickness of 5 nm. The semiconductor 663 was formed by a DC sputtering method using a target of an In—Ga—Zn oxide containing In, Ga, and Zn at an atomic ratio of 1:3:2. The sputtering method was performed at a substrate temperature of 200° C. in a mixed gas of argon and oxygen.

A silicon oxynitride film formed by a PECVD method was used as the insulating film 652.

A 10-nm-thick silicon oxynitride film was formed as the insulating film 653 by a PECVD method.

The insulating film 654 was formed using 140-nm-thick aluminum oxide. The insulating film 654 was formed by an RF sputtering method performed in a mixed gas of argon and oxygen using a target of aluminum oxide.

The L/W of the transistor M0 was 0.18 μm/0.35 μm.

Figure 42A:
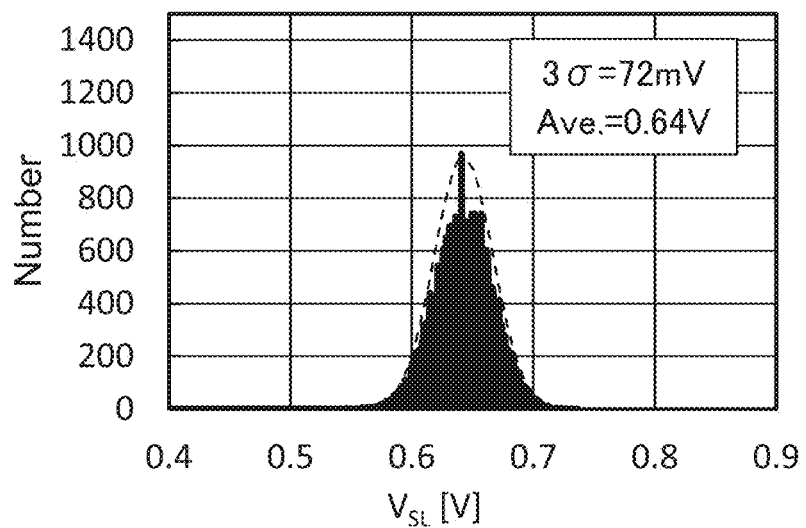
FIGS. 42A and 42B show histograms of a potential $V_{SL}$ obtained by measurement performed on prototype TEGs.
Figure 42B:
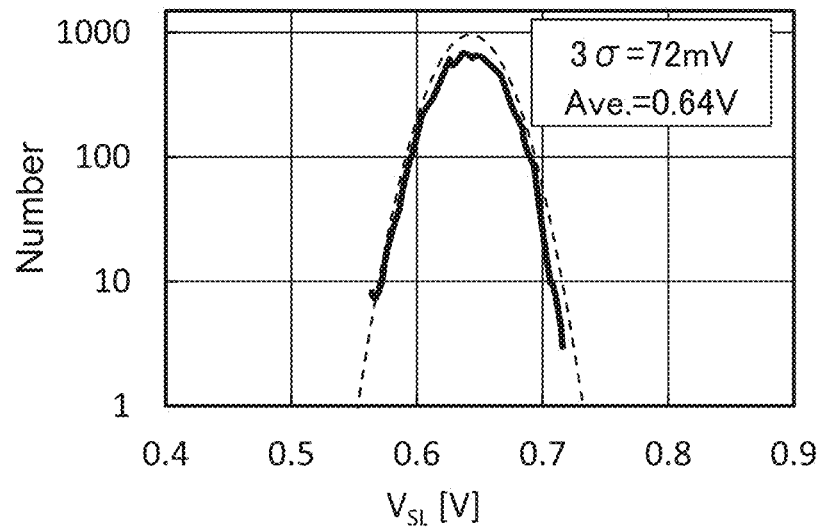

Measurement was performed on the 32768 cells 11 in FIG. 41C. FIGS. 42A and 42B show histograms of the potential $V_{SL}$ obtained by the measurement. In the measurement, the potential $V_{BL}$ and the potential $V_{WL}$ were 1.8 V. The vertical axis in FIG. 42A is on a linear scale, and the vertical axis in FIG. 42B is on a logarithmic scale. The dotted lines in the graphs are normal distribution curves obtained by fitting the measurement results with a probability density function.

The results in FIGS. 42A and 42B show that variation in the potential $V_{SL}$ is 3 σ=72 mV.

Figure 43:
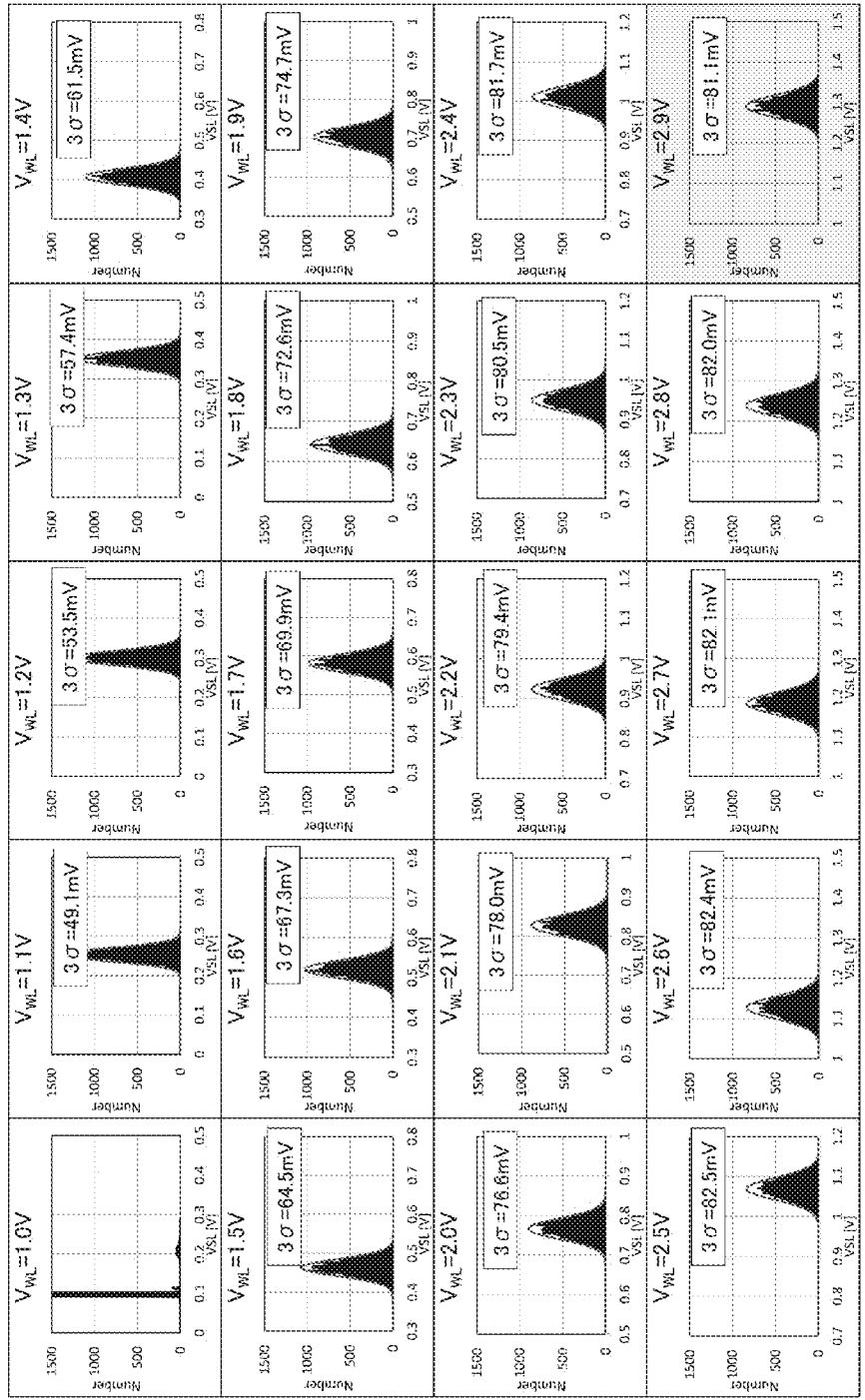
FIG. 43 shows histograms of a potential $V_{SL}$ obtained by measurement performed on prototype TEGs.

Similarly to FIG. 42A, FIG. 43 shows histograms of the potential $V_{SL}$ of the cells 11 that are illustrated in FIG. 41C. In FIG. 43, the potential $V_{BL}$ was 1.8 V and the potential $V_{WL}$, was varied from 1.0 V to 2.9 V in increments of 0.1 V.

The histograms in FIG. 43 show that the potential $V_{SL}$ has a normal distribution in all the measurements except for that when $V_{WL}=1.0$ V in which case the circuit 30 does not operate. Specifically, when the potential $V_{WL}$ was 1.1 V, variation in the potential $V_{SL}$ was as small as 3σ=49.1 mV.

Figure 44A:
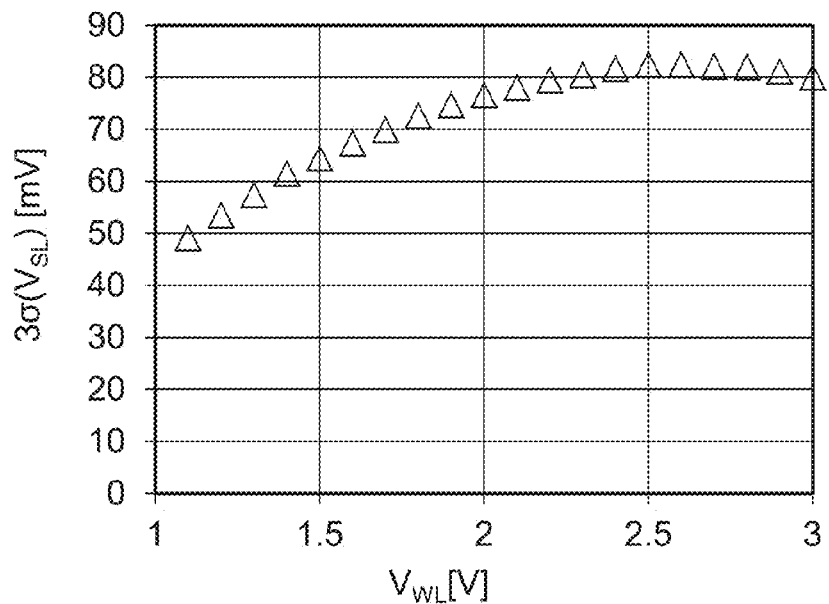
FIG. 44A shows 3σ of a potential $V_{SL}$ as a function of a potential $V_{WL}$.

FIG. 44A shows 3σ of the potential $V_{SL}$ that was obtained from the histograms in FIG. 43 as a function of the potential $V_{WL}$. In a similar manner, FIG. 44B shows the average value of the potential $V_{SL}$ (the median of a normal distribution curve) that was obtained from the histograms in FIG. 43 as a function of the potential $V_{WL}$.

The results in FIG. 44A show that 3σ of the potential $V_{SL}$ gradually increases with the increasing potential $V_{WL}$ and has a local maximum value (3σ=82.5 mV) when the potential $V_{WL}$ is 2.5 V. As described above, a cause of a variation in the electrical characteristics of the transistors M0 depends on the value of the potential $V_{WL}$. From FIG. 44A, the variation in the electrical characteristics of the transistors M0 is found to be more affected by the on-state resistance of the transistor M0 than by the threshold voltage of the transistor M0.

Figure 44B:
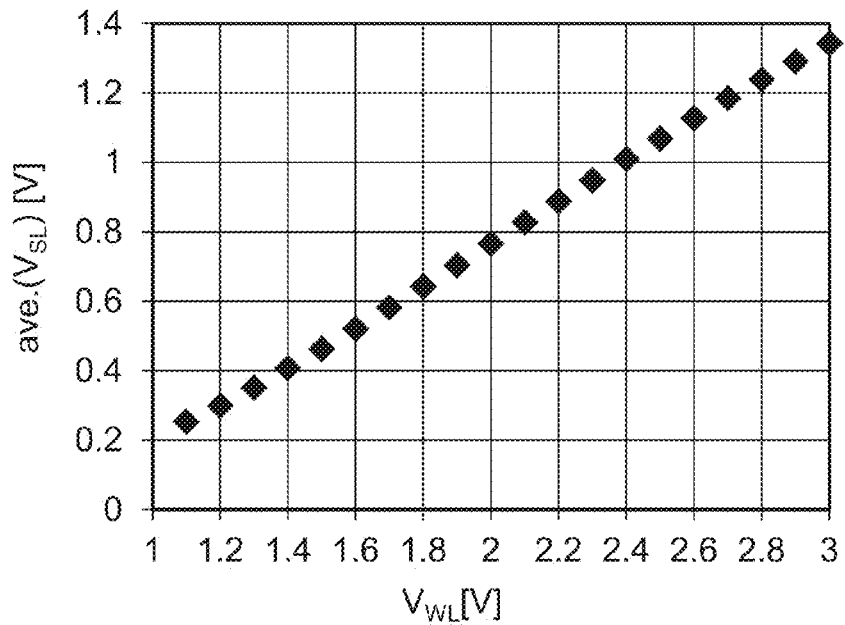
FIG. 44B shows an average value of a potential $V_{SL}$ as a function of a potential $V_{WL}$.

The results in FIG. 44B show a gradual increase in the average value of the potential $V_{SL}$ that accompanies the increase in potential $V_{WL}$. The potential $V_{WL}$ also affects the average value of the potential $V_{SL}$, which means that the results in FIG. 43 reflect the switching characteristics of the transistor M0.

Figure 45A:
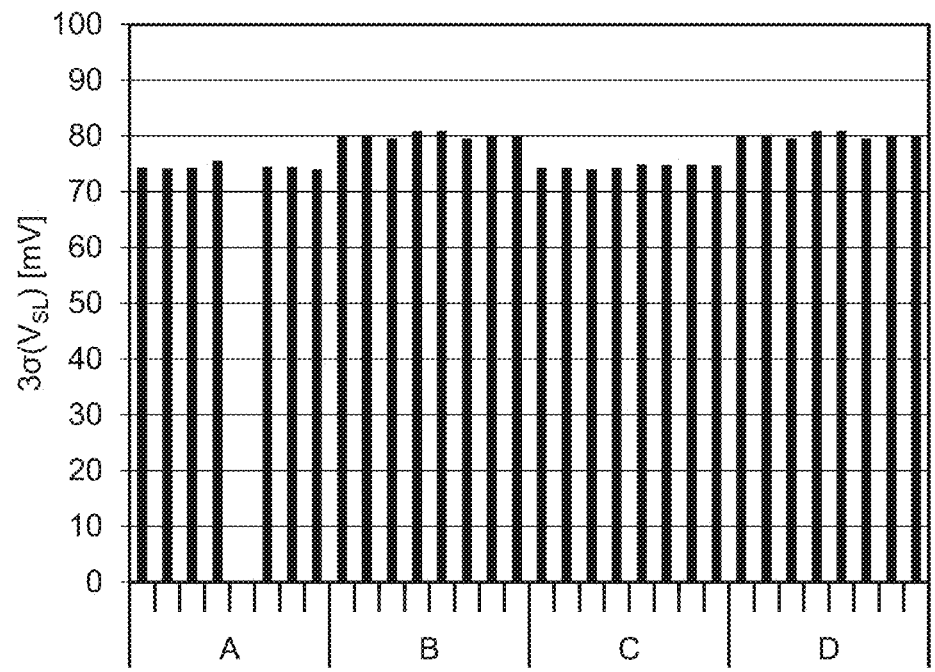
FIGS. 45A and 45B show 3σ of a potential $V_{SL}$ of TEGs formed over one substrate.
Figure 45B:
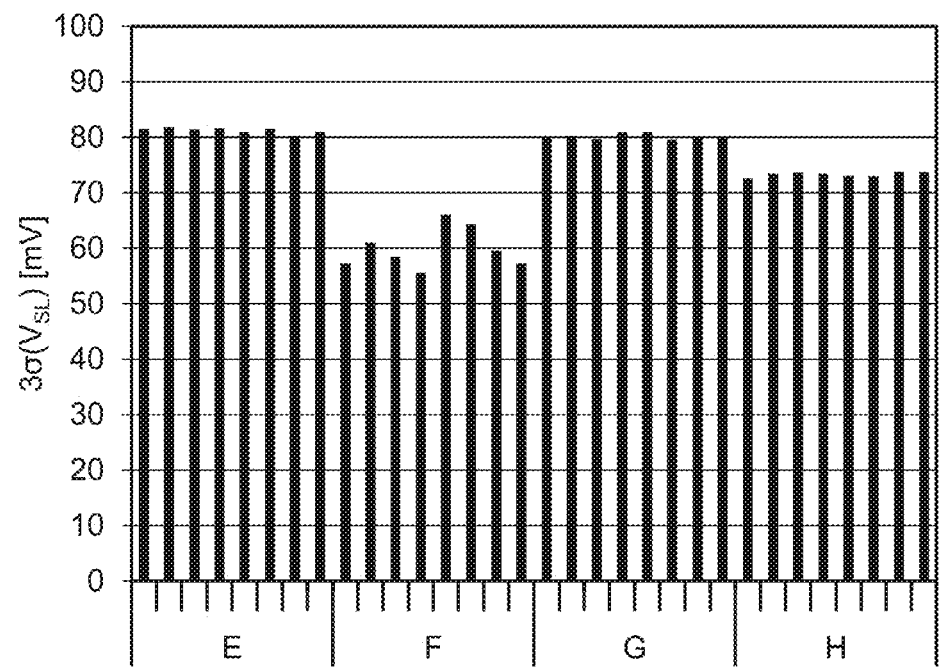

The prototype memory device in this example includes eight cell arrays 20 in each chip. Furthermore, in this example, the memory device was fabricated in such a manner that a plurality of chips can be cut out of one substrate. FIGS. 45A and 45B show measurement results of 3σ of the potential $V_{SL}$ for the eight cell arrays 20 included in each of eight chips formed on one substrate (chips A to H), i.e., for the 8×8=64 cell arrays 20 formed on one substrate. In the measurement, the potential $V_{BL}$ and the potential $V_{WL}$, were 1.8 V. Note that data on one cell array 20 included in the chip A was not obtained owing to malfunction of the circuit 30.

From the results in FIGS. 45A and 45B, it was confirmed that the variation in the potential $V_{SL}$ was between 3σ=50 mV and approximately 3σ=80 mV in any chip or any cell array 20.

Figure 46:
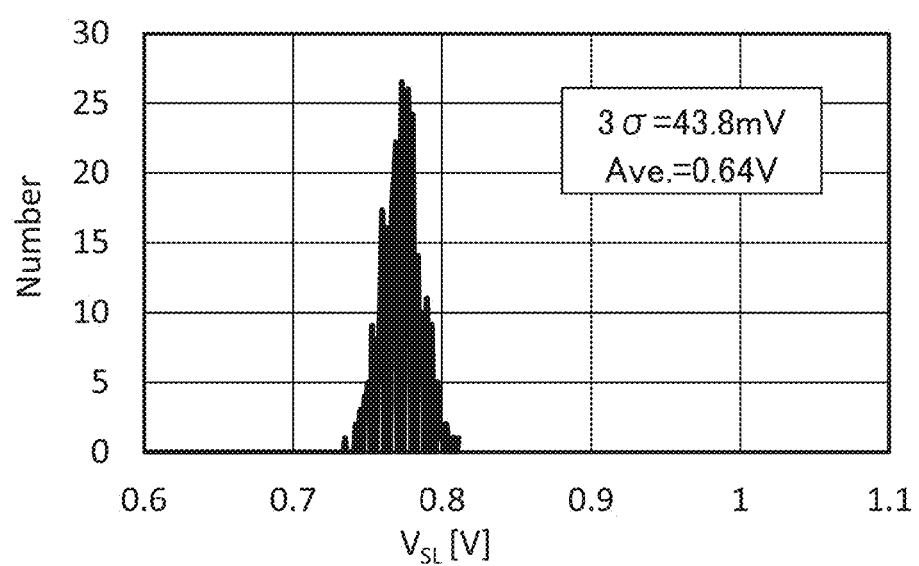
FIG. 46 shows a histogram of a potential $V_{SL}$ obtained by measurement performed on TEGs arranged in a column direction.

FIG. 46 shows a histogram of the potential $V_{SL}$ in the case where measurement was performed on 512 cells 11 connected to one wiring BL (see FIG. 41C). In the measurement, the potential $V_{BL}$ and the potential $V_{WL}$ were 1.8 V. It was found from FIG. 46 that variation in the potential $V_{SL}$ due to the transistors M0 arranged in the column direction is 3σ=43.8 mV (50 mV or lower).

Example 7

In this example, a memory device including the memory cell 10a in FIG. 6 was fabricated using a CAAC-OS transistor that was fabricated using L=180 nm technology and Si transistors, and the data retention characteristics thereof were examined.

As illustrated in FIG. 34, the transistor M0 was formed above the transistors M1 and M2 formed on the SOI substrate. As the transistor M0, the OS transistor illustrated in FIGS. 11A to 11D was used.

A 10-nm-thick silicon oxynitride film formed by a PECVD method was used as the insulating film 651 in FIGS. 11A to 11D. A 20-nm-thick hafnium oxide film formed by an atomic layer deposition (ALD) method was used as the insulating film 656. A 30-nm-thick silicon oxynitride film formed by a PECVD method was used as the insulating film 652. Note that the insulating film 656 serves as a charge trap layer.

The semiconductor 661 was formed using an In—Ga—Zn oxide with a thickness of 40 nm. The semiconductor 661 was formed by a DC sputtering method using a target of an In—Ga—Zn oxide containing In, Ga, and Zn at an atomic ratio of 1:3:4. The sputtering method was performed at a substrate temperature of 200° C. in a mixed gas of argon and oxygen. After the formation of the semiconductor 661, oxygen was introduced into the semiconductor 661 by an ion implantation method.

The semiconductor 662 was formed using an In—Ga—Zn oxide with a thickness of 20 nm. The semiconductor 662 was formed by a DC sputtering method using a target of an In—Ga—Zn oxide containing In, Ga, and Zn at an atomic ratio of 1:1:1. The sputtering method was performed at a substrate temperature of 300° C. in a mixed gas of argon and oxygen. The semiconductor 662 was formed using the CAAC-OS film described in Embodiment 8.

After the semiconductors 661 and 662 were formed, heat treatment at 550° C. was performed in a nitrogen atmosphere for one hour and in an oxygen atmosphere for one hour.

The semiconductor 663 was formed using an In—Ga—Zn oxide with a thickness of 5 nm. The semiconductor 663 was formed by a DC sputtering method using a target of an In—Ga—Zn oxide containing In, Ga, and Zn at an atomic ratio of 1:3:2. The sputtering method was performed at a substrate temperature of 200° C. in a mixed gas of argon and oxygen.

A 13-nm-thick silicon oxynitride film was formed as the insulating film 653 by a PECVD method.

The insulating film 654 was formed using 140-nm-thick aluminum oxide. The insulating film 654 was formed by an RF sputtering method performed in a mixed gas of argon and oxygen using a target of aluminum oxide.

To control the threshold voltage of the transistor M0, a voltage of 38 V was applied to the conductive film 674 for three seconds and electric charges were injected into the insulating film 656.

Data was written in the node FN of the memory cell 10a, and the potential $V_{FN}$ of the node FN immediately after the writing was measured. The data writing in the node FN was performed by supplying the wiring WWL with a potential $V_{WL}$ of 3.3 V, supplying the wiring BL with a potential $V_{BL}$ of 1.8 V (writing data "1") or a potential $V_{BL}$ of 0 V (writing data "0"), and supplying the wiring WCL with 0 V or 1.2 V.

Figure 48:
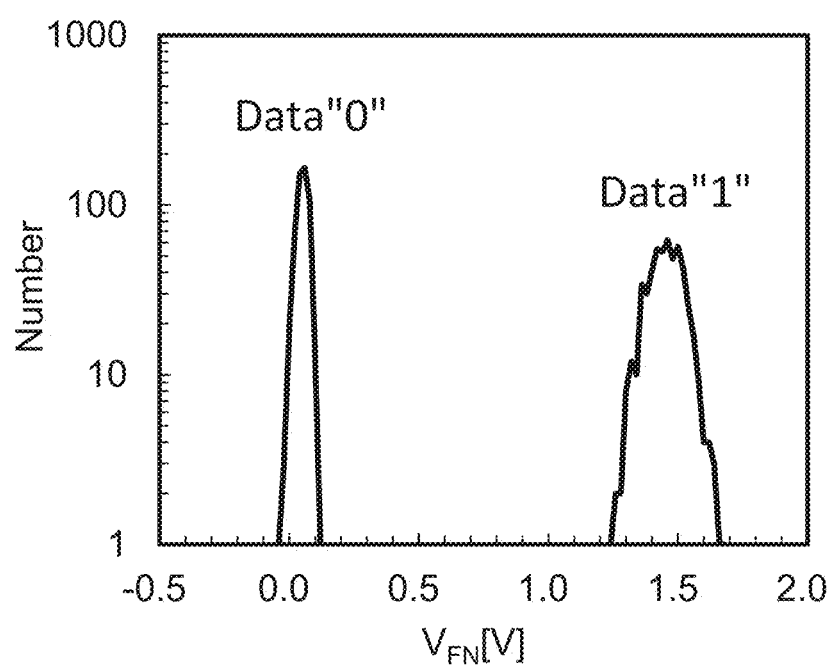
FIG. 48 shows a histogram of a potential $V_{FN}$ of a prototype memory device.

Data writing was performed in the memory cell array including the 1040 memory cells 10a. FIG. 48 shows a histogram of the potential $V_{FN}$ immediately after the writing. In FIG. 48, the horizontal axis represents the potential $V_{FN}$ and the vertical axis represents the number of the memory cells 10a in which the potential $V_{FN}$ corresponding to the horizontal axis was written. From FIG. 48, both the histogram in the case where data "1" was written and that in the case where data "0" was written were found to have a normal distribution.

Next, after the data writing in the 1040 memory cells 10a, the temperature of the measurement environment was set at 150° C., and the potential $V_{FN}$ was measured in the state where the potential $V_{WL}$, the potential $V_{BL}$, and the potential $V_{BG}$ (the potential of the wiring BG) were 0 V. The measurement was performed until 322 hours elapsed since data was written in the memory cell 10a. FIGS. 49A and 49B, FIG. 50, and FIGS. 51A to 51C show the measurement results.

Figure 49A:
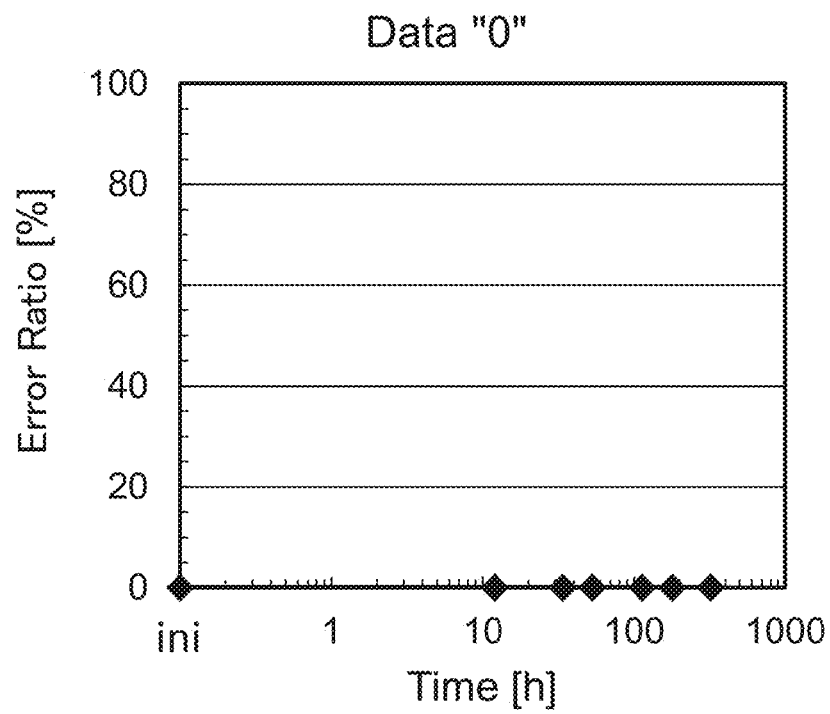
FIGS. 49A and 49B are graphs each showing a bit error ratio as a function of data retention time in a prototype memory device.
Figure 49B:
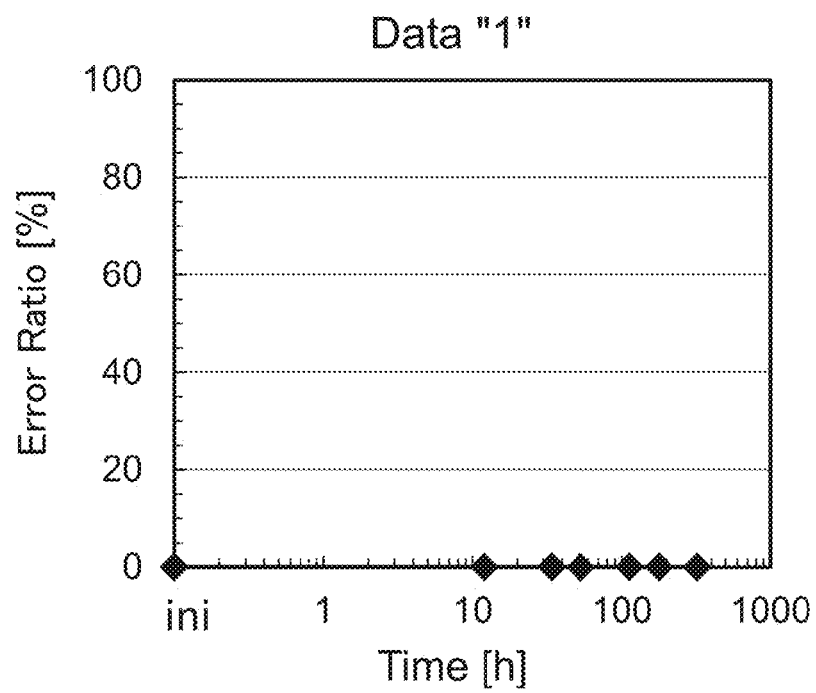

FIGS. 49A and 49B each show a bit error ratio as a function of measurement time in the memory cell 10a. Note that in FIGS. 49A and 49B, the time immediately after data writing is denoted as "ini." In each of FIG. 49A (data "0") and FIG. 49B (data "0"), all of the 1040 memory cells 10a were found to retain data for 322 hours at 150° C.

Figure 50:
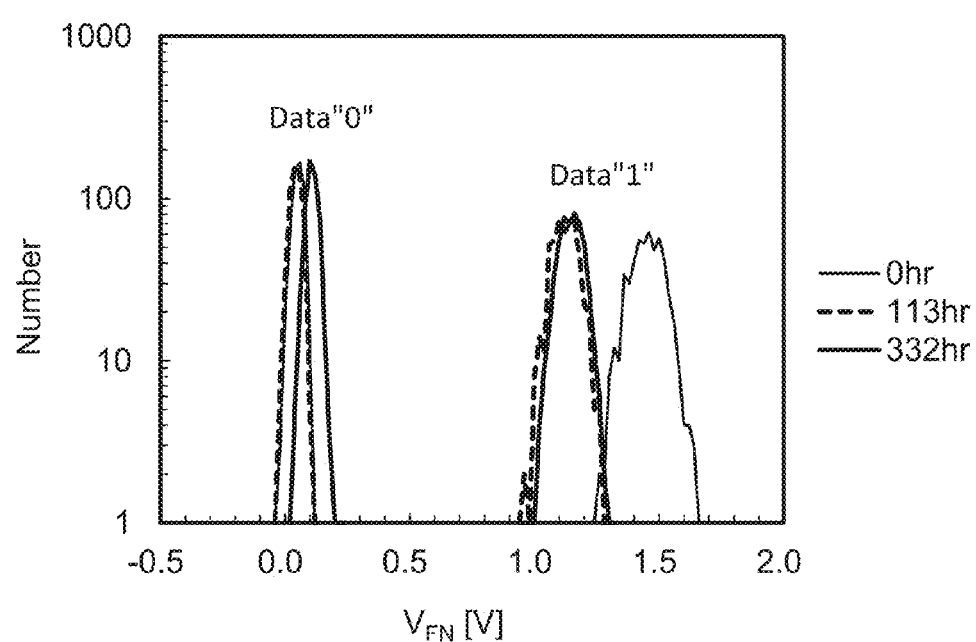
FIG. 50 shows a histogram of a potential $V_{FN}$ of a prototype memory device.

FIG. 50 shows histograms of the potential $V_{FN}$ after 0 hours, 113 hours, and 332 hours in the measurement in FIGS. 49A and 49B. In the case of data "1," the median of the histogram was observed to shift to the low voltage side with the passage of measurement time. However, the width of the histogram (variation in potential $V_{FN}$) was not changed.

Figure 51A:
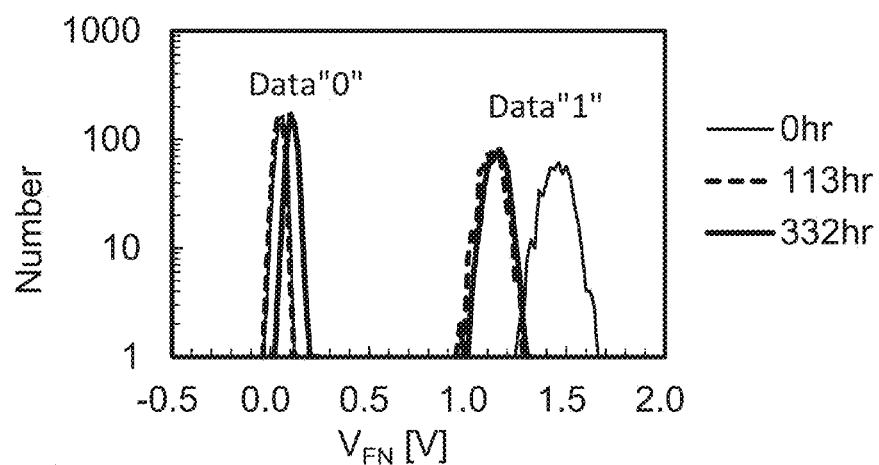
FIGS. 51A to 51C each show a histogram of a potential $V_{FN}$ of a prototype memory device.
Figure 51B:
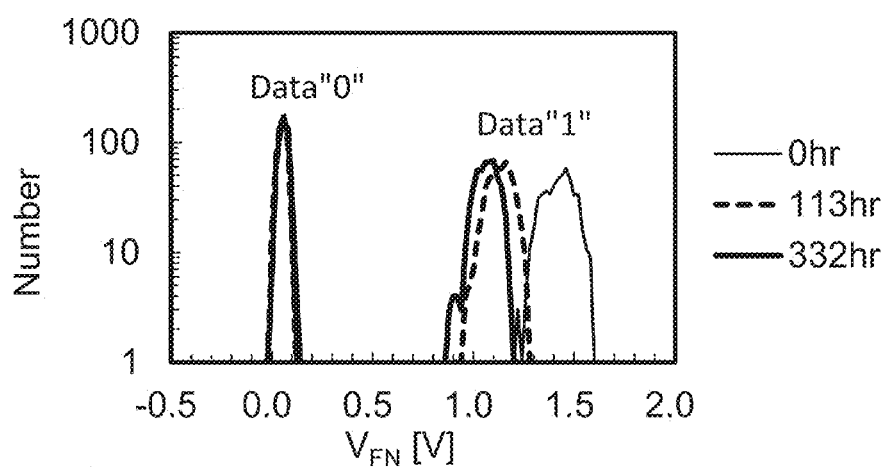
Figure 51C:
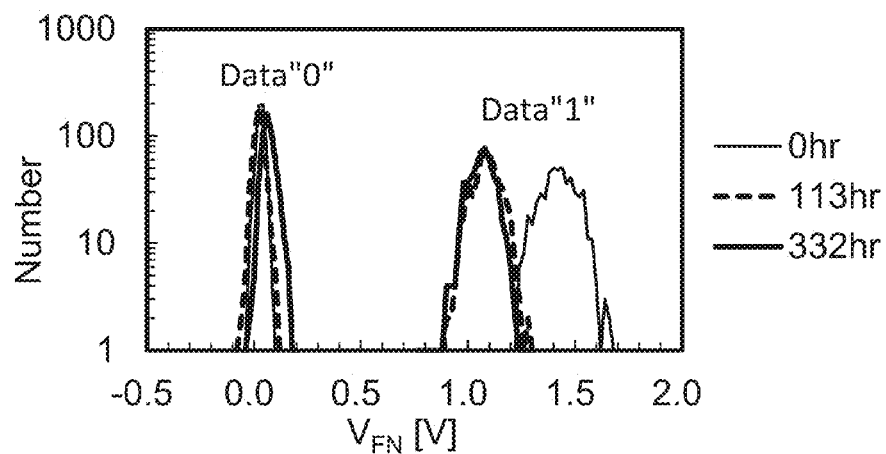

FIGS. 51A to 51C are histograms of the potentials $V_{FN}$ of three memory cell arrays, which are different from the above-mentioned memory cell array. The histograms in FIG. 50 and FIGS. 51A to 51C show the measurement results of the memory cell arrays formed at the respective positions of one substrate. For the measurement conditions of FIGS. 51A to 51C, the description of FIG. 50 can be referred to. FIG. 50 and FIGS. 51A to 51C show that similar measurement results are obtained from the memory cell arrays formed on one substrate. It was found that in the case of data "1," the potential $V_{FN}$ is most likely to vary immediately after the start of the measurement and is unlikely to vary after certain time. In the case of data "0," no great change in the histogram due to passage of measurement time was observed.

Figure 52:
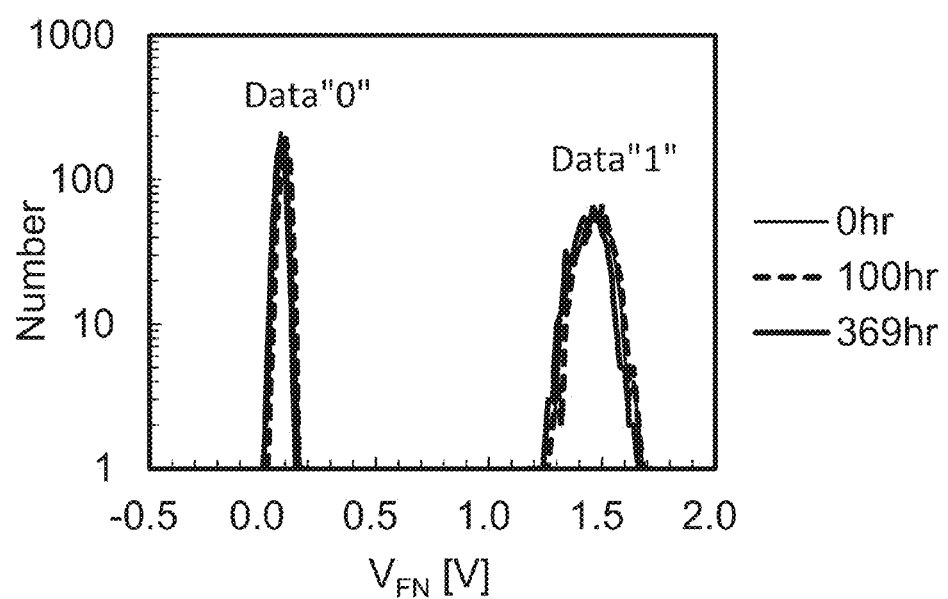
FIG. 52 shows a histogram of a potential $V_{FN}$ of a prototype memory device.

FIG. 52 shows a histogram of the potential $V_{FN}$ in the case where the temperature of the measurement environment was 60° C. The measurement was performed until 369 hours elapsed since data was written in the memory cell 10a. For other measurement conditions, the above description of measurement conditions can be referred to. Note that the temperature of 60° C. is close to the temperature of the environment in which the memory cell 10a is actually used.

From the results in FIG. 52, it was found that the memory cell 10a shows no change in the potential written in the node FN for 369 hours at 60° C.

Figure 53:
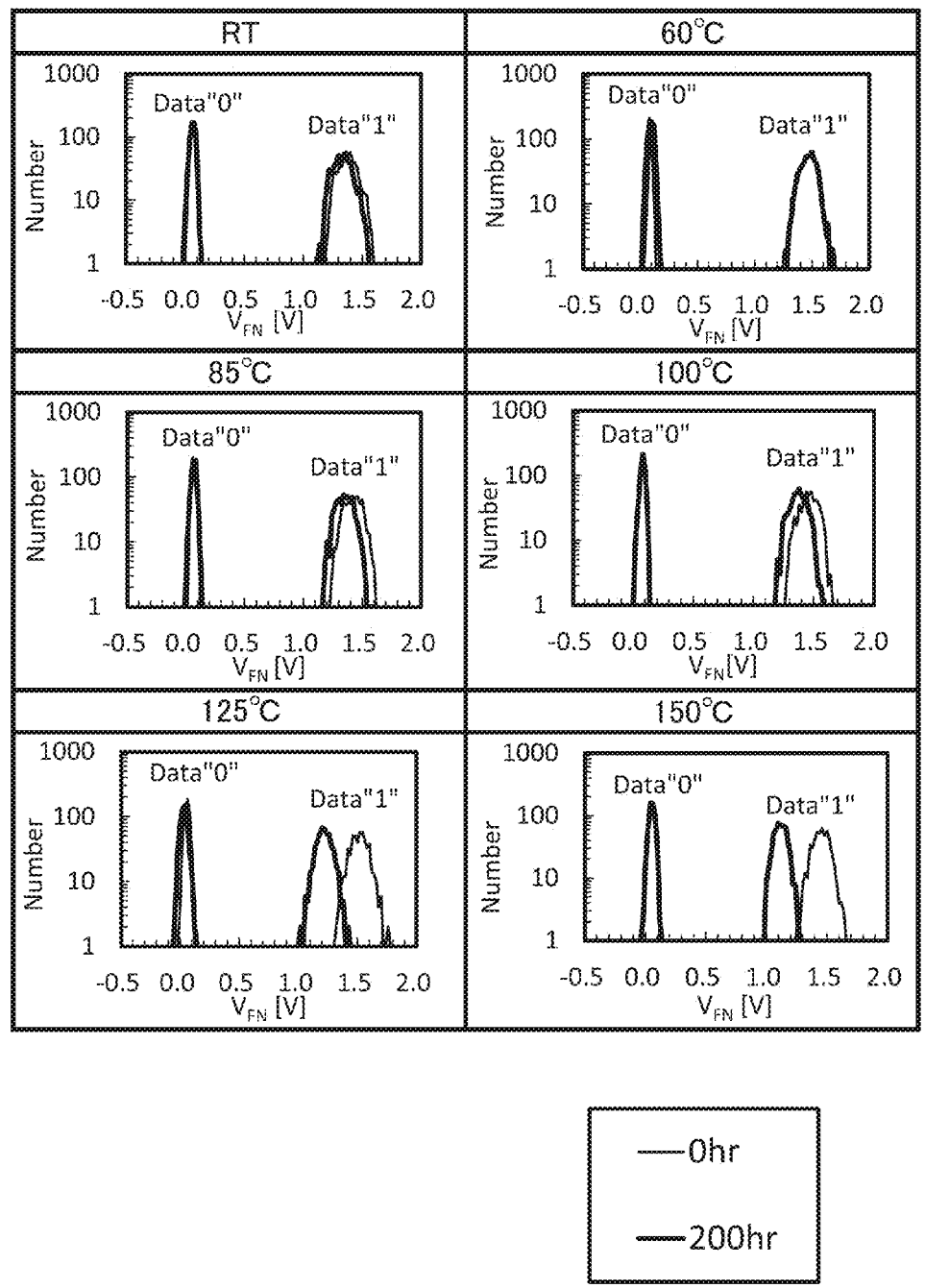
FIG. 53 shows histograms of a potential $V_{SL}$ of a prototype memory device.

FIG. 53 shows histograms of the potential $V_{FN}$ in the case where the temperature of the measurement environment was room temperature (RT), 60° C., 85° C., 100° C., 125° C., and 150° C. For other measurement conditions, the above description of measurement conditions can be referred to. FIG. 53 shows the histograms after 0 hours elapsed after the data writing in the memory cell 10a and those after 200 hours elapsed after the data writing in the memory cell 10a.

As can be seen from the results in FIG. 53, the histogram in the case of data "0" was hardly observed to change at all the temperatures. In the case of data "1," the median of the histogram was observed to shift to the low voltage side as the temperature became high.

This application is based on Japanese Patent Application serial no. 2015-017746 filed with Japan Patent Office on Jan. 30, 2015, Japanese Patent Application serial no. 2015-044801 filed with Japan Patent Office on Mar. 6, 2015, and Japanese Patent Application serial no. 2015-054916 filed with Japan Patent Office on Mar. 18, 2015, the entire contents of which are hereby incorporated by reference.

What is claimed is:

1. A semiconductor device comprising:
   a first transistor;
   a second transistor;
   an inverter; and
   a capacitor,
   wherein the first transistor comprises an oxide semiconductor in a channel formation region,
   wherein a gate of the second transistor and a first terminal of the capacitor are electrically connected to a node,
   wherein one of a source and a drain of the second transistor is electrically connected to an input terminal of the inverter,
   wherein an output terminal of the inverter is electrically connected to an output terminal,
   wherein the node is configured to be supplied with a potential $V_0$ through the first transistor,
   wherein the node is configured to be brought into an electrically floating state by turning off the first transistor after the potential $V_0$ is supplied,
   wherein change in a potential V of the node with respect to time is expressed by Formula (1):

$$V_{FN}(t) = V_0 \times e^{-\left(\frac{t}{\tau}\right)^\beta}, \tag{1}$$

where t is elapsed time after the node is brought into the electrically floating state, $\tau$ is a constant with a unit of time, and $\beta$ is a constant greater than or equal to 0.4 and less than or equal to 0.6.

2. The semiconductor device according to claim 1, further comprising:
   a third transistor,
   wherein one of a source and a drain of the third transistor is electrically connected to one of a source and a drain of the second transistor.

3. The semiconductor device according to claim 1, wherein the $\tau$ follows the Arrhenius equation.

4. The semiconductor device according to claim 1, wherein an off-state current of the first transistor is obtained by measuring the change in the potential $V_{FN}$ over time.

5. A memory device comprising the semiconductor device according to claim 1.

6. The memory device according to claim 5, wherein data is retained for 10 years or longer at 85° C.

7. The memory device according to claim 5, wherein data is retained for 100 years or longer at 85° C.

8. An electronic device comprising:
   the memory device according to claim 5; and
   at least one of a microphone, a speaker, a display portion, and an operation key.

9. A semiconductor device comprising:
   a plurality of cells arranged in a matrix, each of the cells comprising:
   a first transistor;
   a second transistor;
   an inverter; and
   a capacitor,
   wherein the first transistor comprises an oxide semiconductor in a channel formation region,
   wherein a gate of the second transistor and a first terminal of the capacitor are electrically connected to a node,
   wherein one of a source and a drain of the second transistor is electrically connected to an input terminal of the inverter,
   wherein an output terminal of the inverter is electrically connected to an output terminal,
   wherein the node is configured to be supplied with a potential $V_0$ through the first transistor,
   wherein the node is configured to be brought into an electrically floating state by turning off the first transistor after the potential $V_0$ is supplied, and
   wherein change in a potential V of the node over time is expressed by Formula (1):

$$V_{FN}(t) = V_0 \times e^{-\left(\frac{t}{\tau}\right)^\beta}, \tag{1}$$

where t is elapsed time after the node is brought into the electrically floating state, $\tau$ is a constant with a unit of time, and $\beta$ is a constant greater than or equal to 0.4 and less than or equal to 0.6.

10. The semiconductor device according to claim 9, further comprising:
a third transistor,
wherein one of a source and a drain of the third transistor is electrically connected to one of a source and a drain of the second transistor.

11. The semiconductor device according to claim 9, wherein the $\tau$ follows the Arrhenius equation.

12. The semiconductor device according to claim 9, wherein an off-state current of the first transistor is obtained by measuring the change in the potential $V_{FN}$ over time.

13. A memory device comprising the semiconductor device according to claim 9.

14. The memory device according to claim 13, wherein data is retained for 10 years or longer at 85° C.

15. The memory device according to claim 13, wherein data is retained for 100 years or longer at 85° C.

16. An electronic device comprising:
the memory device according to claim 13; and
at least one of a microphone, a speaker, a display portion, and an operation key.

* * * * *